(12) United States Patent
Ooishi

(10) Patent No.: US 6,188,637 B1
(45) Date of Patent: *Feb. 13, 2001

(54) SEMICONDUCTOR MEMORY DEVICE ALLOWING REDUCTION IN POWER CONSUMPTION DURING STANDBY

(75) Inventor: Tsukasa Ooishi, Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/240,001

(22) Filed: Jan. 29, 1999

Related U.S. Application Data

(63) Continuation of application No. 08/833,479, filed on Apr. 7, 1997, now Pat. No. 5,886,946.

(30) Foreign Application Priority Data

Apr. 26, 1996 (JP) ..................................................... 8-107926

(51) Int. Cl.[7] ....................................................... G11C 8/00
(52) U.S. Cl. ...................... 365/233; 365/189.07; 365/194
(58) Field of Search ............................... 365/233, 189.07, 365/194; 327/157, 158, 236, 3, 40

(56) References Cited

U.S. PATENT DOCUMENTS

| | | |
|---|---|---|
| 5,455,803 | 10/1995 | Kodama . |
| 5,550,783 * | 8/1996 | Stephens, Jr. et al. ............... 365/233 |
| 5,581,512 | 12/1996 | Kitamura . |
| 5,602,798 | 2/1997 | Sato et al. . |
| 5,629,897 | 5/1997 | Iwamoto et al. . |
| 5,754,838 * | 5/1998 | Shibata et al. ........................ 395/559 |
| 5,930,197 * | 7/1999 | Ishibashi et al. ..................... 365/233 |

FOREIGN PATENT DOCUMENTS

| | | |
|---|---|---|
| 62-39916 | 2/1987 | (JP) . |
| 6-112816 | 4/1994 | (JP) . |

* cited by examiner

*Primary Examiner*—Huan Hoang
(74) *Attorney, Agent, or Firm*—McDermott, Will & Emery

(57) ABSTRACT

A synchronous signal generating circuit 100 includes a delay circuit 110 which receives and delays an external clock signal Ext.CLK by a predetermined time for issuing the same, a phase comparator 120 which compares an output of the delay circuit 110 with a phase of the external clock signal Ext.CLK, a variable constant current source circuit 140 which varies in a digital manner a value of a constant current supplied to an output node 140a based on a result of comparison by the phase comparator 120, and a delay control circuit 150 which adjusts a degree of delay by the delay circuit 110 in accordance with the value of the constant current supplied to the output node 140a. The degree of delay by the delay circuit 110 is controlled in accordance with the value of the constant current which varies linearly in accordance with the result of phase comparison.

19 Claims, 40 Drawing Sheets

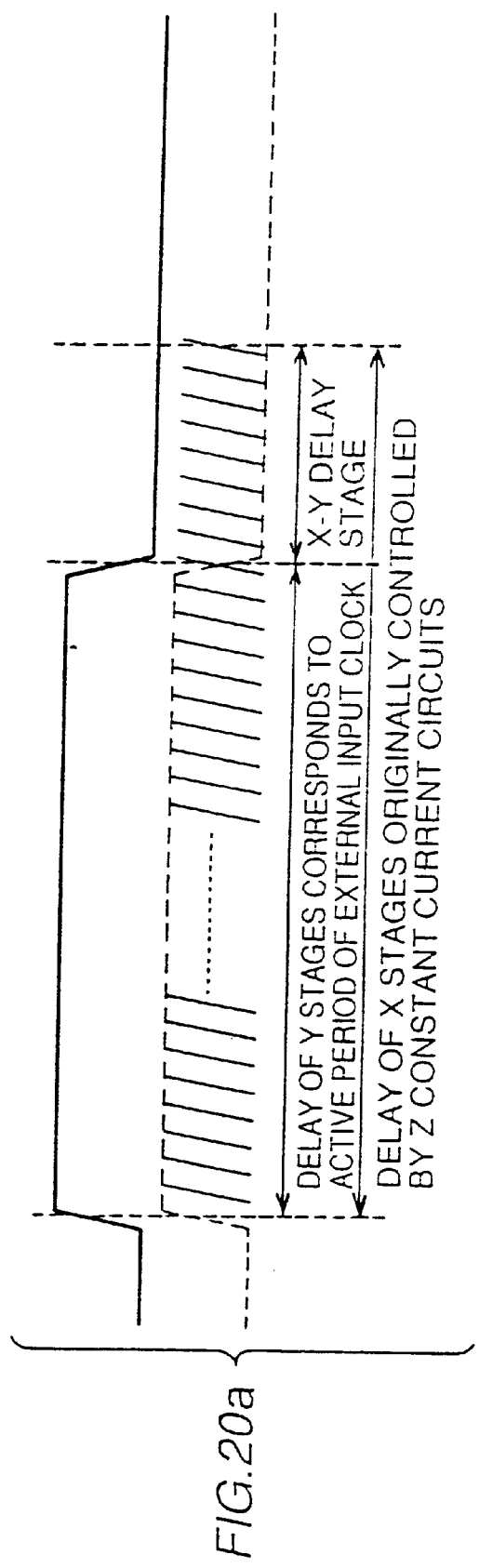
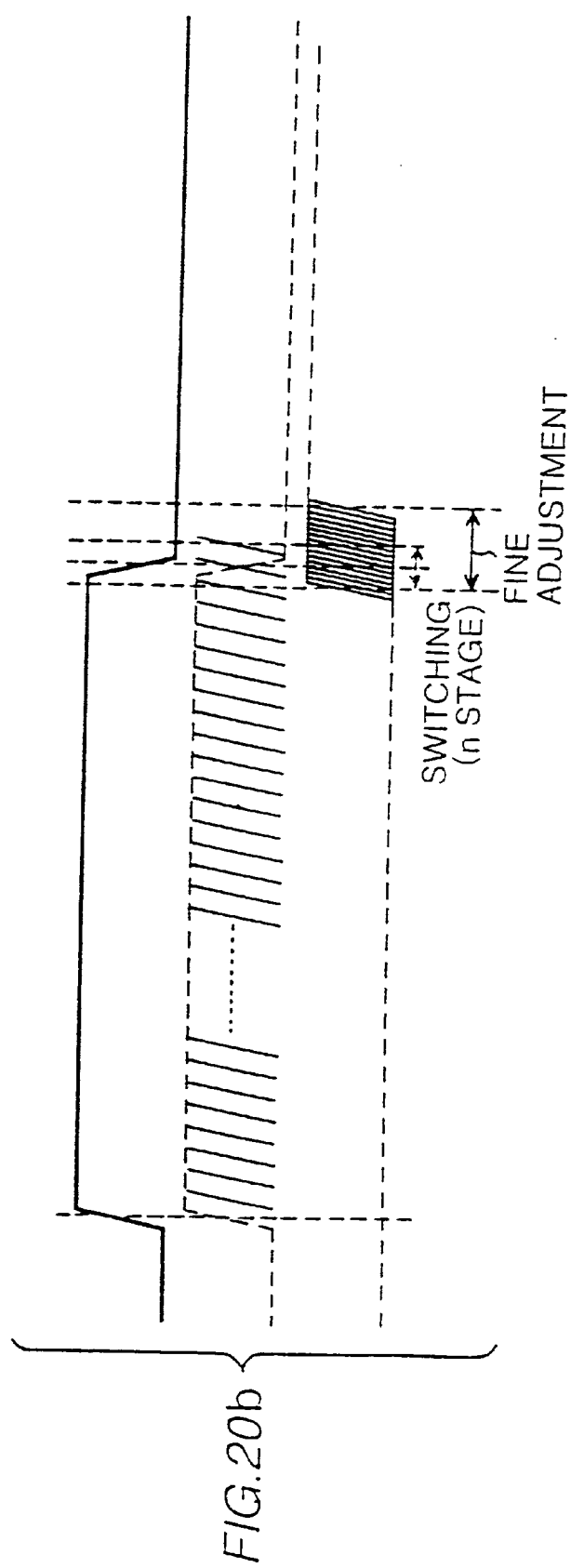
FIG.20a
FIG.20b

US 6,188,637 B1

SEMICONDUCTOR MEMORY DEVICE ALLOWING REDUCTION IN POWER CONSUMPTION DURING STANDBY

This application is a continuation of application Ser. No. 08/833,479 filed Apr. 7, 1997, now U.S. Pat. No. 5,886,946.

BACKGROUND OF THE INVENTION

1. Field of the Invention

The present invention relates to a semiconductor memory device, and in particular to a synchronous semiconductor memory device which takes in external signals including an address signal and input data in synchronization with an external clock signal, and externally sends storage data. More particularly, the invention relates to a semiconductor memory device having an internal synchronous signal generating circuit such as a PLL (Phase Locked Loop) circuit or a DLL (Delay Locked Loop) circuit which receives an external clock signal and issues a synchronized internal clock signal.

2. Description of the Background Art

In accordance with recent improvement in an operation speed of microprocessors (which will be referred to as "MPUs" hereinafter), it has been proposed to use synchronous DRAMs, which will be referred as "SDRAMs" hereinafter, and operate in synchronization with clock signals in order to achieve fast access of, e.g., dynamic random access memories (which will be referred to as "DRAMs" hereinafter) used as main storage units.

Generally, the semiconductor memory device which operates in synchronization with an external clock signal is internally provided with a PLL circuit, a DLL circuit or the like for generating an internal clock signal in synchronization with the external clock signal.

FIG. 41 is a schematic block diagram showing a structure of a synchronous semiconductor memory device 2000 in the prior art.

An external clock signal Ext.CLK applied to a control signal input terminal 2 is sent to an internal synchronous signal generating circuit 50 via a clock buffer circuit 20. Internal synchronous signal generating circuit 50 issues an internal clock signal int.CLK synchronized with external clock signal Ext.CLK. An internal control signal generating circuit 26 receives internal clock signal int.CLK and issues internal control signals for controlling operations of internal circuitry.

Synchronous semiconductor memory device 2000 further includes an RAS buffer 22 and a CAS buffer 24, which receive external control signals /RAS and /CAS through external control signal input terminals 4 and 6 and issue an internal row address strobe signal and an internal column address strobe signal controlling operations of the internal circuits, respectively, a memory cell array 10 having memory cells arranged in a matrix form, an address buffer 18 which receives external address signals A0–A1 applied via an address signal input terminal 8, and is controlled by RAS and CAS buffers 22 and 24 to issue an internal row address signal and an internal column address signal, a row decoder 12 which decodes an internal row address signal sent from address buffer 18, and selects a corresponding row (word line) in memory cell array 10, a column decoder 14 which is controlled by the internal control signal sent from internal control signal generating circuit 26 to decode the internal column address signal sent from address buffer 18, and thereby issues a column select signal for simultaneously selecting a plurality of corresponding columns in memory cell array 10, a plurality of sense amplifiers which are controlled by the internal control signal sent from internal control signal generating circuit 26 to sense and amplify data of the plurality of memory cells in memory cell array 10 connected to the selected row, an I/O circuit which is controlled by internal control signal generating circuit 26, and connects a plurality of selected columns in memory cell array 10 to an internal data bus in response to a column select signal sent from column decoder 14, a selector circuit 28 which is controlled by internal control signal generating circuit 26 to select and issue data among the data of memory cells issued to the internal data bus, and in particular data corresponding to an internal select address applied from address buffer 18, and an output circuit 30 which is controlled by internal control signal generating circuit 26 to receive an output of selector circuit 28 and issue external output data to data I/O terminal 32.

In the following description, the sense amplifiers and I/O circuit will be collectively called as a sense amplifier+I/O circuit 16.

FIG. 42 is a timing chart showing an operation of the conventional synchronous semiconductor memory device 2000 shown in FIG. 41.

The following description will be given on an operation after a steady state, in which internal clock signal int.CLK synchronized with external clock signal Ext.CLK is issued, is attained after power-on and subsequent start of a synchronizing operation of an internal synchronous signal generating circuit 50.

In response to a rising edge of external clock signal Ext.CLK at time t1, address buffer 18 takes in a row address signal Ax applied through external control signal input terminal 8. In response to this row address signal Ax, row decoder 12 changes a potential on a word line selected in memory cell array 10 to "H" level. In response to this, and particularly in accordance with storage information in the memory cells connected to the selected word line, the sense amplifiers arranged for the bit line pairs connected to these memory cells amplify the potential differences appearing on the bit line pairs.

After the potential levels on bit line pairs are amplified to a full scale, address buffer 18 takes in a column address Ay through external address signal input terminal 8 at time t6, i.e., at a rising edge in a fourth cycle of external clock signal Ext.CLK after time t1. In response to this, a plurality of (e.g., four) bit line pairs corresponding to column address signal Ay are connected to I/O line pairs, and the potential levels on bit line pairs are transmitted onto the I/O line pairs.

The storage data read onto the I/O line pairs is sent to selector 28 through the internal data bus. In accordance with the internal control signal sent from internal control signal generating circuit 26, selector 28 selects data sent from the memory cell, which corresponds to the internal selector address sent from address buffer 18, and sends the same to output circuit 30. Output circuit 30 operates in accordance with the internal control signal sent from internal control signal generating circuit 26, and more specifically sends the latched read data to data I/O terminal 32 at a rising edge of external clock signal Ext.CLK at time t8, i.e., at a rising edge in a second cycle of external clock signal Ext.CLK after taking-in of the column address signal into address buffer 18.

Thus, all the operations, i.e., taking-in of the address signal, reading of data and writing of data in the synchronous semiconductor memory device 2000 are controlled by the internal control signals which are issued from internal control signal generating circuit 26 in accordance with internal clock signal int.CLK issued from internal synchronous signal generating circuit 50. In particular, the timing of data output is synchronized with external clock signal Ext.CLK, and data issued to data I/O terminal 32 is supplied, as read data, into an external device such as an MPU at a falling edge of external clock signal Ext.CLK.

The description has been given on an example, in which four cycles of the external clock signal are required between taking-in of the row address and subsequent taking-in of the column address, and two cycles of the external clock signal are required between taking-in of the column address and subsequent data output. However, these numbers of cycles depend on a frequency of the external clock signal, an operation speed of the internal circuitry of synchronous semiconductor memory device 2000 and others.

FIG. 43 is a circuit diagram showing a structure of the PLL circuit of the conventional internal synchronous signal generating circuit 50.

Referring to FIG. 43, a power supply node 51a is supplied with a power supply potential Vcc, and a ground potential node 51b is supplied with a ground potential GND. A phase comparing circuit 52 receives internal clock signal int.CLK and external clock signal Ext.CLK, and issues control signals UP and /DOWN corresponding to shifts or differences in frequency and phase between internal and external clock signals int.CLK and Ext.CLK.

Phase comparing circuit 52 sets control signal UP to "L" level, when internal clock signal int.CLK is larger in frequency than external clock signal Ext.CLK, or when the phase of internal clock signal int.CLK leads that of external clock signal Ext.CLK. Also, phase comparing circuit 52 sets control signal UP to "H" level, when internal clock signal int.CLK is smaller in frequency than external clock signal Ext.CLK, or when the phase of internal clock signal int.CLK lags behind that of external clock signal Ext.CLK.

Further, phase comparing circuit 52 sets control signal /DOWN to "L" level, when internal clock signal int.CLK is larger in frequency than external clock signal Ext.CLK, or when the phase of internal clock signal int.CLK leads that of external clock signal Ext.CLK. Phase comparing circuit 52 sets control signal /DOWN to "H" level, when internal clock signal int.CLK is smaller in frequency than external clock signal Ext.CLK, or when the phase of internal clock signal int.CLK lags behind that of external clock signal Ext.CLK.

A charge pump circuit 53 receives control signals UP and /DOWN from phase comparing circuit 52, and supplies electric charges to a charge/discharge node 53a when both control signals UP and /DOWN are at "L" level. When control signals UP and /DOWN are at "H" levels, charge pump circuit 53 removes electric charges from charge/discharge node 53a.

Charge pump circuit 53 includes a constant current circuit 53c for flowing a constant current between power supply potential node 51a and a node 53b, a p-channel MOS transistor 53d which is connected between node 53b and charge/discharge node 53a, and receives, on its gate, control signal UP sent from phase comparing circuit 52, an n-channel MOS transistor 53f which is connected between charge/discharge node 53a and a node 53e, and receives, on its gate, control signal /DOWN from phase comparing circuit 52, and a constant current circuit 53g for flowing a constant current between node 53e and ground potential node 51b.

A loop filter 54 supplied an output potential Vp to node 54a in response to supply or removal of charges to or from charge/discharge node 53a in charge pump circuit 53.

Loop filter 54 includes a resistor element 54b connected between charge/discharge node 53a and a node 54a, a resistor element 54d connected between nodes 54a and 54c, and a capacitor 54e connected between node 54c and ground potential node 51b.

A current regulating potential output circuit 55 receives output potential Vp from node 54a in loop filter 54, and issues an output potential Vn corresponding to output potential Vp. Current regulating potential output circuit 55 includes a p-channel MOS transistor 55b which is connected between power supply potential node 51a and a node 55a, and has a gate connected to node 54a in loop filter 54, and an n-channel MOS transistor 55c which is connected between node 55a and ground potential node 51b, and has a gate connected to node 55a.

A ring oscillator 56 receives output potential Vp sent from refresh 54 and output potential Vn sent from current regulating potential output circuit 55, and regulates a frequency of internal clock signal int.CLK oscillating in accordance with a value of a drive current, which is regulated in accordance with output potentials Vp and Vn. Ring oscillator 56 includes odd inverters 56a connected in a ring form. Each inverter 56a includes a current regulating p-channel MOS transistor 56ab, which is connected between power supply potential node 51a and a node 56aa, and receives, on its gate, output potential Vp from loop filter 54, a p-channel MOS transistor 56ac, which is connected between node 56aa and an output node 56ac, and has a gate connected to an input node 56ad, an n-channel MOS transistor 56ag, which is connected between output node 56ac and a node 56af, and has a gate connected to input node 56ad, and a current regulating n-channel MOS transistor 56ah, which is connected between node 56af and ground node 51b, and receives, on its gate, output potential Vn from current regulating potential output circuit 55.

An operation of PLL circuit 50 will be briefly described below.

When the frequency of internal clock signal int.CLK is larger than that of external clock signal Ext.CLK, or the phase of internal clock signal int.CLK leads that of external clock signal Ext.CLK, phase comparing circuit 52 sets control signals UP and /DOWN to "L" level. In charge pump circuit 53 receiving control signals UP and /DOWN, p-channel MOS transistor 53d is turned on, and n-channel MOS transistor 53f is turned off. In response to this, charges are supplied to charge/discharge node 53a, so that output potential Vp on node 54a in loop filter 54 rises. This results in reduction in value of a current flowing through p-channel MOS transistor 55b in current regulating potential output circuit 55 which receives this output potential Vp, and output potential Vn on node 55a lowers. Output potential Vn attains a steady value when the current flowing through n-channel MOS transistor 55c becomes equal in level to the current flowing through p-channel MOS transistor 55b.

In response to lowering of output potential Vn caused by rising of output potential Vp, currents flowing through p- and n-channel MOS transistors 56ab and 56ah for current regulation decrease in each inverter 56a of ring oscillator 56. In response to this, a delay time of each inverter 56a increases. This results in reduction in frequency of internal clock signal int.CLK issued from ring oscillator 56. This reduction in frequency of internal clock signal int.CLK delays rising of internal clock signal int.CLK at a next cycle, so that the led phase varies toward a synchronized phase.

When the frequency of internal clock signal int.CLK is smaller than that of external clock signal Ext.CLK, or the phase of internal clock signal int.CLK lags behind that of external clock signal Ext.CLK, phase comparing circuit 52 issues control signals UP and /DOWN at "H" level. Thereafter, operations are performed in a manner opposite to the above, and the delayed phase of internal clock signal int.CLK issued from ring oscillator 56 changes toward a synchronized phase.

In this manner, PLL circuit 50 issues internal clock signal int.CLK having the same frequency and phase as external clock signal Ext.CLK.

As described before, the oscillation frequency of ring oscillator 56 largely depends on a value of current flowing through each inverter 56a. Thus, the oscillation frequency rises with this current value. However, in ring oscillator 56 of the PLL circuit 50 having the above structure, the drive current of the ring oscillator does not change in proportion to output potential Vp of loop filter 54.

This is because the value of current flowing through each inverter is determined by applying output potential Vp of loop filter circuit 54 to the gate of p-channel MOS transistor 55b. Thus, the value of current flowing through inverter circuit 56a is pursuant to a gate voltage dependency of the drain current flowing through p-channel MOS transistor 55b, and, to be exact, this dependency is not linear with respect to the gate voltage, so that a linear relationship is not established between the output potential of charge pump circuit 53, i.e., output potential Vp of loop filter circuit 54 and a current flowing through inverter 56a forming the ring oscillator.

Therefore, in such a state that PLL circuit 50 is to be synchronized with external clock signal Ext.CLK having an excessively large frequency, i.e., that the output of charge pump circuit 53 is near power supply potential Vcc and the drain current flowing through p-channel MOS transistor 55b is large, or in such a state that the output level of charge pump circuit 53 is near ground potential GND and the drain current flowing through p-channel MOS transistor 55b is small, a relationship between the output of charge pump 53, i.e., output potential Vp of loop filter circuit 54 and the drain current flowing through p-channel MOS transistor 55b deviates significantly from a linear relationship.

Depending on a frequency region of external clock signal Ext.CLK, oscillated internal clock signal int.CLK may vibrate significantly at frequencies slightly larger and smaller than that of external clock signal Ext.CLK, so that jitter of internal clock signal int.CLK may increase.

In addition to the above cause, the jitter may occur due to a value of a constant current supplied from charge pump circuit 53.

FIG. 44 shows a time dependency of the frequency of the signal issued from ring oscillator circuit 56 in the cases where the constant current supplied from charge pump circuit 53 is larger and smaller than a predetermined value. When the constant current supplied from charge pump circuit 53 is large, loop filter 54 is driven by a current of a large value. This reduces a time required for completion of synchronization of PLL circuit 50 with external clock signal Ext.CLK. After the synchronization, however, a large change occurs in the value of current which is supplied from charge pump circuit 53 in accordance with the control signal sent from phase comparing circuit 52, so that the output frequency varies to a large extent after completion of the synchronization, and large jitter occurs.

Conversely, when the constant current supplied from charge pump circuit 53 is small, the frequency does not vary to a large extent after completion of synchronization, but a long time is required until the synchronization is completed.

This means that, in synchronous semiconductor memory device 2000, synchronous signal generating circuit 50 must continue the synchronized operation without interruption in order to issue internal clock signal int.CLK synchronized with external clock signal Ext.CLK. Otherwise, synchronous semiconductor memory device 2000 cannot follow external clock signal Ext.CLK in the data input/output operation. Therefore, the continuous operation of synchronous signal generating circuit 50 is required, which unpreferably increases a power consumption of synchronous semiconductor memory device 2000 during standby.

SUMMARY OF THE INVENTION

An object of the invention is to provide a synchronous semiconductor memory device allowing reduction in a power consumption during standby.

Another object of the invention is to provide a synchronous semiconductor memory device having an internal synchronous signal generating circuit, which can reduce a time required before completion of synchronization with an external clock signal, and can follow a fast operation.

Still another object of the invention is to provide a synchronous semiconductor memory device, which can perform an accelerated test by setting an internal clock signal to a predetermined frequency during a test mode period.

In summary, the invention provides a synchronous semiconductor memory device for outputting storage data in synchronization with an external clock signal, including a memory cell array, a row selector circuit, an internal synchronous signal generating circuit, a column selector circuit and a data output circuit.

The memory cell array has a plurality of memory cells arranged in a matrix form. The row selector circuit is activated in response to activation of a row address strobe signal, and selects a row in the memory cell array in accordance with a row address signal. The internal synchronous signal generating circuit starts a synchronizing operation with respect to the external clock signal in accordance with activation of the row address strobe signal, and providing an internal clock signal synchronized with the external clock signal. The column selector circuit is activated in response to activation of a column address strobe signal, and selects a column in the memory cell array corresponding to a column address signal for reading storage data of the memory cell corresponding to the selected row and column. The data output circuit receives the storage data from the column selector circuit, and outputting the received data in synchronization with the internal clock signal.

Preferably, the semiconductor memory device of the invention further includes an internal control signal generating circuit for issuing a plurality of internal control signals prepared by delaying the internal clock signal by predetermined times, respectively. The internal control signals control a column select operation and a storage data read operation of the column selector circuit as well as a storage data output operation of the data output circuit.

In a preferred form of the synchronous semiconductor memory device of this invention, the internal synchronous signal generating circuit includes a variable delay circuit, a phase comparing circuit, a decode circuit, a variable constant-current supply circuit, and a delay control circuit.

The variable delay circuit receives and delays the external clock signal for providing the internal clock signal. The phase comparing circuit receives the external clock signal and the output of the variable delay circuit to detect a phase difference. The decode circuit issues a constant current value control signal in accordance with a result of detection by the phase comparing circuit. The variable constant-current supply circuit changes a value of a constant current supplied to an output node in accordance with the constant current value control signal. The variable constant-current supply circuit includes a plurality of first constant current sources each supplying a predetermined current, a plurality of first switch circuits connected between the plurality of first constant current sources and the output node, respectively, and being controlled by the constant current value control signal to be open/closed, a plurality of second constant current sources each accepting a predetermined current, and a plurality of second switch circuits connected between the output node and the plurality of second constant current sources, respectively, and being controlled by the constant current value control signal to be open/closed. The delay control circuit controls a degree of delay by the variable delay circuit in accordance with the value of constant current supplied from the variable constant-current supply circuit.

In another preferred form of the synchronous semiconductor memory device of the invention, the internal synchronous signal generating circuit includes a variable delay circuit, a phase comparing circuit, a decode circuit, a variable constant-current supply circuit, and a delay control circuit.

The variable delay circuit receives and delays the external clock signal for providing said internal clock signal. The phase comparing circuit receives the external and internal clock signals, and detects a phase difference. The decode circuit issues a constant current value control signal in a form of a digital signal in accordance with a result of detection of the phase comparing circuit. The constant current value control signal includes a first control signal corresponding to a predetermined higher bit(s) of the constant current value control signal, and a second control signal corresponding to a predetermined lower bit(s) of the constant current value control signal. The variable constant-current supply circuit changes a value of a constant current supplied to an output node in accordance with the constant current value control signal. The variable constant-current supply circuit includes a first variable constant-current source circuit for changing the value of the constant current supplied to the output node in accordance with the first control signal, and a second variable constant-current source circuit for changing the value of the constant current supplied to the output node in accordance with the second control signal. The delay control circuit controls a degree of delay of the variable delay circuit in accordance with the value of the constant current supplied from the variable constant-current supply circuit.

In still another preferred form of the synchronous semiconductor memory device of the invention, the internal synchronous signal generating circuit includes a variable delay circuit, an operation circuit, a variable constant-current supply circuit, and a delay control circuit.

The variable delay circuit receives and delays the external clock signal for providing the internal clock signal. The variable delay circuit has cascade-coupled delay buffer circuits at a plurality of stages for receiving and delaying the external clock signal. The operation circuit receives the external clock signal and outputs of the plurality of delay buffer circuits, detects the number of the delay buffer circuits corresponding to a cycle of the external clock signal, and issues a constant current value control signal. The variable constant-current supply circuit changes, in a digital manner, a value of a constant current supplied to an output node in accordance with the constant current value control signal.

The delay control circuit controls a delay amount of each delay buffer circuit in accordance with the value of the constant current supplied from the variable constant-current supply circuit. The operation circuit renews the constant current value control signal to match the output delay by the delay buffer circuits at a predetermined number of stages with the cycle of the external clock signal.

In yet another preferred form of the synchronous semiconductor memory device of the invention, the internal synchronous signal generating circuit includes a first variable delay circuit, a second variable delay circuit, an operation circuit, a variable constant-current supply circuit, a delay control circuit, and an internal control signal generating circuit.

The first variable delay circuit receives and delays the external clock signal for issuing the same. The first variable delay circuit has cascade-coupled first delay buffer circuits at a plurality of stages receiving and delaying the external clock signal for issuing the same. The second variable delay circuit receives and delays the external clock signal for issuing the same. The second variable delay circuit has cascade-coupled second delay buffer circuits at a plurality of stages receiving and delaying the external clock signal for issuing the same. The operation circuit receives the external clock signal and the outputs of the first delay buffer circuits at a plurality of stages, detects the number of stages of the first delay buffer circuits causing a delay amount within a cycle of the external clock signal, and issues a constant current value control signal. The operation circuit renews the constant current value control signal to match the output delay of the first delay buffer circuits at a predetermined number of the stages with the cycle of the external clock signal. The variable constant-current supply circuit changes in a digital manner a value of a constant current supplied to an output node in accordance with the constant current value control signal. The delay control circuit controls the delay amount of each of the first and second delay buffer circuits in accordance with the value of the constant current supplied from the variable constant-current supply circuit. The internal control signal generating circuit receives outputs of the cascade-coupled second delay buffers, and issues a plurality of internal control signals delayed by predetermined time period, respectively. The internal control signals control a column select operation and a storage data read operation of the column selector circuit as well as a storage data output operation of the data output circuit.

Accordingly, a major advantage of the invention is that a power consumption during standby can be reduced because the internal synchronous signal generating circuit starts a synchronizing operation in response to activation of a row address strobe signal.

Another advantage of the invention is as follows. Since the column select operation and the storage data read operation of the column selector circuit and the storage data output operation of the data output circuit are controlled in accordance with the internal control signal, the internal synchronous signal generating circuit is required to perform the synchronizing operation with respect to the external clock signal only during a period of these operations, so that a power consumption is reduced.

Still another advantage of the invention is as follows. Since the output current from the variable constant-current supply circuit controlling the degree of delay of the variable delay circuit is determined by a ratio between the numbers of the first and second constant current sources connected to the output node of the variable constant-current supply circuit, the value of the constant current supplied to the output node can be varied linearly over a wide current range, so that it is possible to suppress generation of jitter at the internal clock signal issued from the variable delay circuit.

Yet another advantage is as follows. In the internal synchronous signal generating circuit, the variable constant-current supply circuit, which controls the degree of delay of the variable delay circuit issuing the internal clock signal, has a hierarchical structure. Therefore, it is possible to issue the internal clock signal which is accurately synchronized with the external clock signal.

Further another advantage of the invention is as follows. Comparison between the degree of delay of the variable delay circuit issuing the internal clock signal and the external clock signal is performed based on the outputs of the cascade-coupled delay buffer circuits at the multiple stages for controlling the degree of delay of the variable delay circuit. Therefore, in accordance with the result of comparison during one cycle of the external clock signal, the internal clock signal can be synchronized with the external clock signal.

A further advantage of the invention is as follows. The degree of delay of the second variable delay circuit issuing the internal control signal is controlled in accordance with the degree of delay of the first variable delay circuit which is controlled to issue the internal clock signal synchronized with the external clock signal. Therefore, a timing of the internal control signal can be varied in accordance with a frequency of the external clock signal, and a synchronizing operation can be stably performed even with respect to a fast external clock signal.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 20a and 20b are timing charts showing operations of the internal synchronous signal generating circuit 500, and particularly showing an operation of the select/determination circuit 170 in a free-run state and an operation of the select/determination circuit 170 after controlling a degree of delay, respectively;

DESCRIPTION OF THE PREFERRED EMBODIMENTS

Embodiment 1

Figure 1:
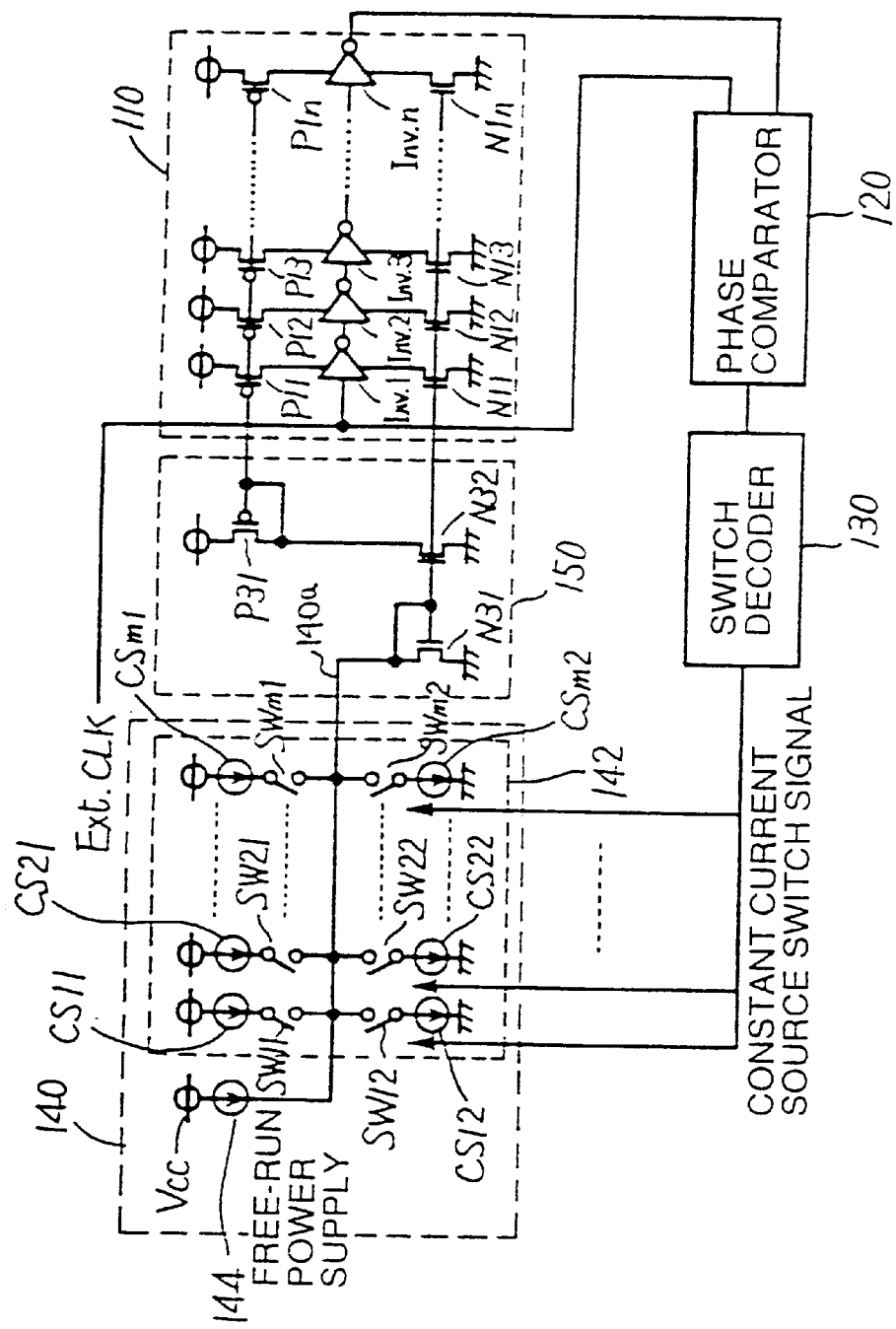
FIG. 1 is a schematic block diagram showing a structure of an internal synchronous signal generating circuit 100 of an embodiment 1 of the invention.
Figure 2:
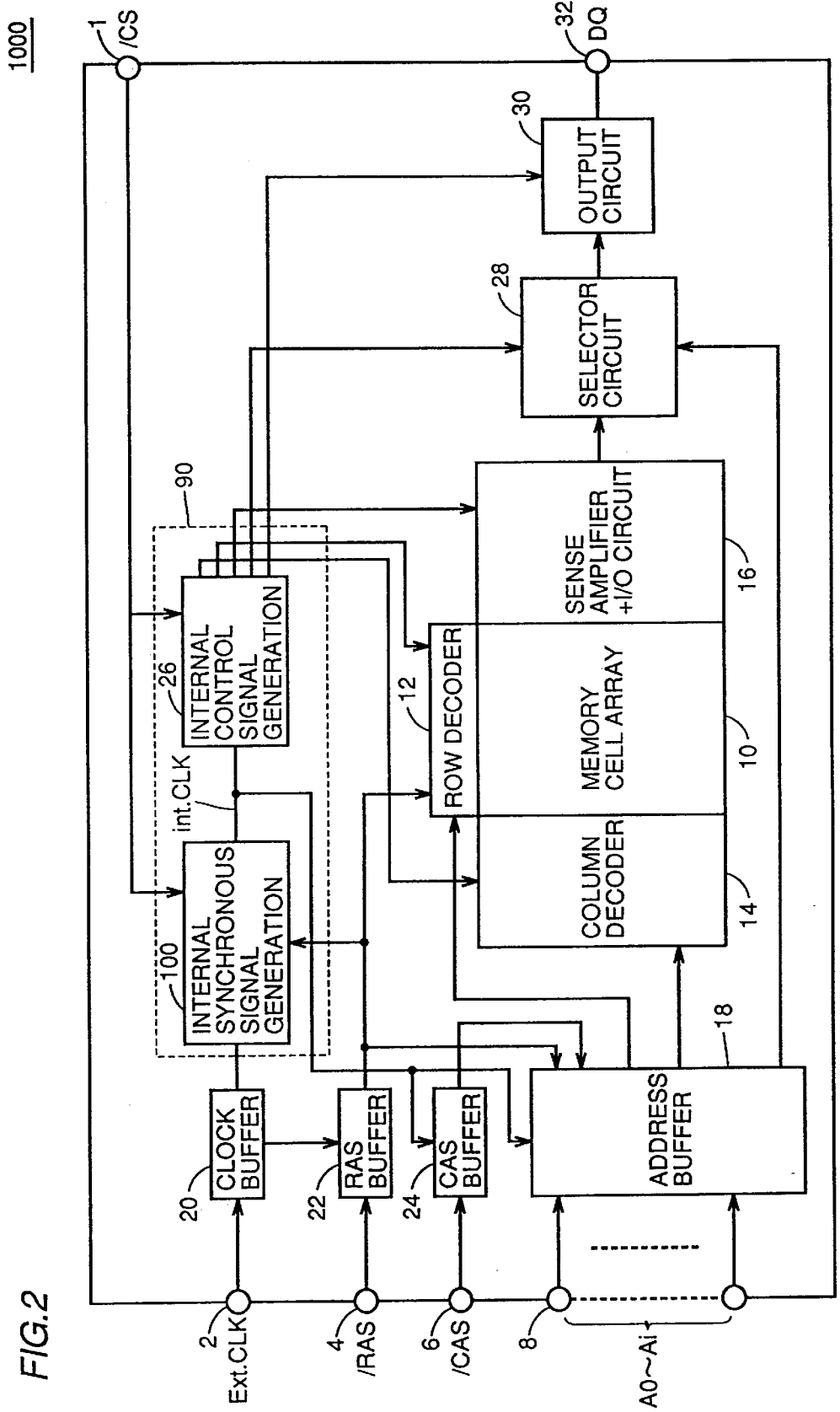
FIG. 2 is a schematic block diagram showing a structure of a synchronous semiconductor memory device 1000 of the embodiment 1.

FIG. 1 is a schematic block diagram showing a structure of an internal synchronous signal generating circuit 1000 of an embodiment 1 of the invention, and FIG. 2 is a schematic block diagram showing a structure of the synchronous semiconductor memory device 1000 of the embodiment 1.

Referring to FIGS. 1 and 2, the structure of synchronous semiconductor memory device 1000 of the embodiment 1 will be described below.

Referring to FIG. 2, synchronous semiconductor memory device 1000 includes a control circuit 90, which receives external clock signal Ext.CLK and external control signals /CS, /RAS and /CAS through external control signal input terminals 1 to 8, and issues internal control signals, a memory cell array 10 having memory cells arranged in a matrix form, an address buffer 18 which receives external address signals A0–Ai through address input terminal 8, and issues an internal row address signal and an internal column address signal under the control of control circuit 90, and a row decoder 12 which is controlled by control circuit 90 to decode the internal row address signal sent from address buffer 18 for selecting a corresponding row (word line) in memory cell array 10.

Signal /RAS applied to external control signal input terminal 4 is a row address strobe signal, which starts an internal operation of the semiconductor memory device and determines an active period of the internal operation. While signal /RAS is active, circuits such as row decoder 12 related to selection of the row in memory cell array 10 is activated. Signal /CAS applied to external control signal input terminal 6 is a column address strobe signal which activate circuits for selecting a column in memory cell array 10.

Signal /CS applied to external control signal input terminal 1 is a chip select signal, which indicates the selection and the activation of the syncronous semiconductor memory device 1000 itself or the predetermined earea in the syncronous semiconductor memory device 1000.

As will be described later, operations of taking in signals /RAS and /CAS are performed in synchronization with external clock signal Ext.CLK and chip select signal /CS, and a synchronizing operation of internal synchronous signal generating circuit 100 which generates internal clock signal int.CLK is triggered by activation of signal /RAS and signal /CS.

Synchronous semiconductor memory device 1000 further includes a column decoder 14, which is activated under the control of control circuit 90 to decode the internal column address signal sent from address buffer 18 and issue a column select signal for simultaneously selecting a plurality of corresponding columns in memory cell array 10, sense amplifiers for sensing and amplifying data of the memory cells connected to the selected row in memory cell array 10, an I/O circuit which is responsive to the column select signal sent from column decoder 14 and connects the plurality of columns in memory cell array 10 to an internal data bus, a selector circuit 28 which is controlled under control circuit 90 to receive read data sent onto the internal data bus and select the data of the corresponding memory cell in accordance with the internal select address sent from address buffer 18 for outputting the same, and an output circuit 30 which is controlled under the control of control circuit 90 to issue the read data sent from selector circuit 28 to a data I/O terminal 32 in synchronization with internal clock signal int.CLK.

Control circuit 90 includes an internal synchronous signal generating circuit 100, which operates based on the output sent from a clock buffer 20 receiving external clock signal Ext.CLK applied to signal input terminal 2, and more specifically operates to receive row address strobe signal /RAS and chip select signal/CS sent from external control signal input terminal 4 and 1 respectively, and start the synchronizing operation in accordance with activation of the internal row address strobe signal sent from RAS buffer 22 and signal /CS. Control circuit 90 also includes an internal control signal generating circuit 26 which receives internal clock signal int.CLK from internal synchronous signal generating circuit 100, and produces the internal control signals delayed by predetermined times, respectively.

CAS buffer 24, which receives column address strobe signal /CAS applied to external control signal input terminal 6, and address buffer 18, which is provided for the address signal applied through address signal input terminal 8 and particularly for taking in the column address signal, operate in synchronization with internal clock signal int.CLK.

The structure of internal synchronous signal generating circuit 100 will now be described below.

Referring to FIG. 1, internal synchronous signal generating circuit 100 includes a delay circuit 110 which receives and delays external clock signal Ext.CLK by a predetermined time for issuing the same, a phase comparator or comparing circuit 120 which receives external clock signal Ext.CLK and an output of delay circuit 110, and detects a phase difference between them, a switch decoder 130 which issues a constant current source switch signal CS in accordance with a result of detection of phase comparator 120, a variable constant-current source circuit 140 which receives signal CS and supplies a corresponding constant current, and a delay control circuit 150 which issues a control signal controlling a degree of delay of delay circuit 110 in accordance with a value of the constant current supplied from variable constant-current source circuit 140.

Delay circuit 110 includes cascade-coupled inverter circuits Inv.1 to Inv.n at n stages. Each inverter circuit Inv.i (i=1, 2, n) is coupled to power supply potential Vcc via a p-channel MOS transistor P1i, and is coupled to ground potential GND via an n-channel MOS transistor N1i. The gate potential level of each of p- and n-channel MOS transistors P1i and N1i is controlled by delay control circuit 150.

Delay control circuit 150 controls the value of current supplied to inverter circuits Inv.1 to Inv.1n forming delay circuit 110. In other words, the delay time in each inverter circuit Inv.i (i=, 2, . . . n) varies in accordance with the control signal sent from delay control circuit 150.

Variable constant-current source circuit 140 includes m internal constant current source circuits CS11, CS21, CSm1, and m internal constant current source circuits CS12, CS22, . . . CSm2. Constant current source circuit CS11 is connected at one of its terminals to power supply potential Vcc, and is connected at the other terminal to an output node 140a via a switch circuit SW11 which is opened and closed by constant current source switch signal CS.

Other constant current source circuits CS21, . . . CSm1 have similar structures, and each are connected at one of its terminals to power supply potential Vcc and are connected at the other terminal to output node 140a via corresponding one of switch circuits SW21, SWm1.

Internal constant current source circuits CS12, CS22, . . . CSm2 each are connected at one of its terminals to output node 140a via corresponding one of switch circuits SW12, SW22, . . . SWm2 which are controlled to open/close by constant current source switch signal CS, and are connected at the other terminals to ground potential GND.

Accordingly, the value of the constant current supplied to output node 140a increases in response to turn-on of switches SW11, SW12, SWm1, and decreases in response to turn-on of switch circuits SW12, SW22, SWm2.

In accordance with a value of constant current source switch signal CS, switch circuits SW11, SW21, SWm1 and switch circuits SW12, SW22, SWm2 are opened or closed, whereby the constant current of the corresponding value is supplied to output node 140a, and, in accordance with the constant current value, delay control circuit 150 operates as will be described below.

Variable constant-current source circuit 140 further includes a free-run current source 144 (i.e., a current source for free run) which continuously supplies a predetermined constant current to output node 140a. Thus, a constant current for free run is always supplied to the output node even when all switch circuits SW11–SWm1 and SW12–SWm2 are off.

Delay control circuit 150 includes an n-channel MOS transistor N31 having a drain connected to output node 140 and a source connected to ground potential GND, and an n-channel MOS transistor N32 having a source connected to ground potential GND and a gate connected to the gate of n-channel MOS transistor N31. n-channel MOS transistor N31 has a drain and a gate connected together, and n-channel MOS transistors N31 and N32 form a current mirror circuit.

Delay control circuit 150 further includes a p-channel MOS transistor P31 having a source connected to power supply potential Vcc and a drain connected to the drain of n-channel MOS transistor N32. A gate of n-channel MOS transistor N32 is connected to n-channel MOS transistors N11 to N1n of delay circuit 110, and the values of currents flowing through these n-channel MOS transistors N11 to N1n are controlled by the value of current flowing through n-channel MOS transistors N31 and N32 forming the current mirror circuit.

Meanwhile, a gate of p-channel MOS transistor P31 is connected to gates of p-channel MOS transistors P11 to P1n in delay circuit 110. Since the gate and drain of p-channel MOS transistor P31 are connected together, p-channel MOS transistors P31 and P11 form a current mirror circuit. Thus, the drain currents which flow through p-channel MOS transistors P11–P1n, respectively, have the same value as the drain current flowing through p-channel MOS transistor P31, i.e., the same value as the drain currents flowing through n-channel MOS transistors N31 and N32.

Accordingly, the value of current supplied to each of inverter circuits Inv.1 to Inv.n forming delay circuit 110 is controlled by the value of current supplied to output node 140a of variable constant-current source circuit 140.

Then, an operation of internal synchronous signal generating circuit 100 will be described below.

It is now assumed that a delay time of delay circuit 110 is smaller than one cycle time of external clock signal Ext.CLK. In this case, the signal which is issued from delay circuit 110 in response to received external clock signal Ext.CLK has a phase leading that of external clock signal Ext.CLK. In accordance with the phase difference detected by phase comparator 120, switch decoder 130 controls variable constant-current source circuit 140 with constant current source switch signal CS to reduce the value of constant current supplied to output node 140 so as to reduce the lead of phase of the signal issued from delay circuit 110. In response to this, the value of drain current flowing through the current mirror circuit formed of n-channel MOS transistors N31 and N32 decreases, and the value of current supplied to each inverter circuit Inv.i (i=1, 2, . . . n) forming delay circuit 110 decreases.

Accordingly, the delay time of inverter circuits Inv.1 to Inv.n increases, resulting in lag of the phase of signal issued from delay circuit 110 in response to external clock signal Ext.CLK.

Thus, the phases of external clock signal Ext.CLK and the signal issued from delay circuit 110 change to reduce a difference between them.

When the delay time of delay circuit 110 is larger than the time of one cycle of external clock signal Ext.CLK, the operation is performed in a manner opposite to the above, so that internal clock signal int.CLK issued from delay circuit 110 is synchronized with external clock signal Ext.CLK.

In internal synchronous signal generating circuit 100, the value of current, which is supplied to inverter circuits Inv.1 to Inv.n forming delay circuit 110 in accordance with the result of comparison in phase comparator 120, can be varied digitally and linearly with respect to the result of comparison in phase comparator 120, in contrast to the conventional PLL circuit 30. Therefore, it is possible to suppress generation of jitter of internal clock signal int.CLK.

Since the values of currents supplied to inverter circuits Inv.1–Inv.n forming delay circuit 110 vary linearly over a wide range, generation of jitter can be suppressed even in the state that currents of large values are supplied to inverter circuits Inv.1–Inv.n, i.e., even in the operation region where the synchronizing operation with respect to external clock signal Ext.CLK is completed within a short time.

Since variable constant-current source circuit 140 has free-run current source 144 for continuously supplying the predetermined current to output node 140a, the degree of delay during standby of delay circuit 110 can be controlled by the value of current supplied by free-run current source 144, and the degree of delay circuit 110 can be set, in advance, to facilitate synchronization with respect the cycle of external clock signal Ext.CLK, so that the time required for completion of synchronization with respect to external clock signal Ext.CLK can be reduced.

Figure 3:
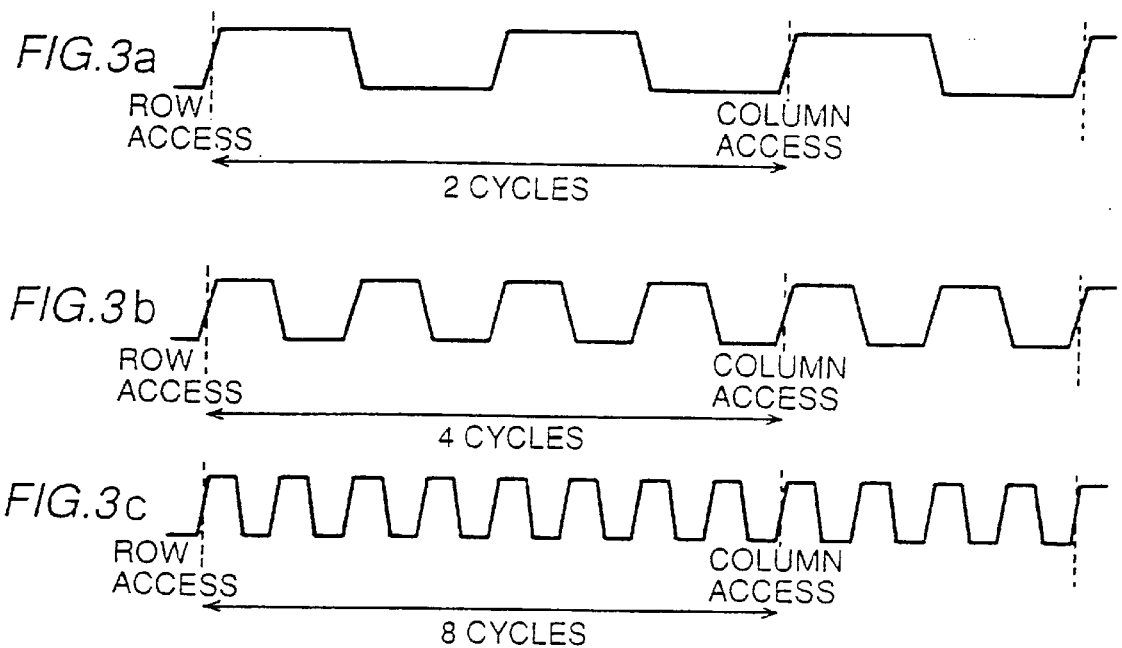
FIGS. 3a, 3b and 3c are timing charts showing operations of the synchronous semiconductor memory device 1000 with cycles of ⅓, ½ and ¼ of a cycle of a predetermined external clock signal, respectively.

FIGS. 3a, 3b and 3c are timing charts showing change in the external clock signal after completion of the access of the row address signal and before the access to the column address signal in a fast DRAM such as an SDRAM.

More specifically, FIG. 3a is a timing chart showing change of the external clock signal from the row access to the column access with the predetermined external clock signal. FIG. 3b is a timing chart showing change in a waveform from the row access to the column access with an external clock signal having half the cycle of external clock signal Ext.CLK in FIG. 3a. FIG. 3c is a timing chart showing change in a waveform from the row access to the column access of an external clock signal having quarter the cycle of external clock signal Ext.CLK in FIG. 3a.

Even if faster external clock signals are employed, for example, as represented as change from FIG. 3a to FIG. 3b, and from FIG. 3b to FIG. 3c, the operation speed of internal circuitry in the synchronous semiconductor memory device does not increase correspondingly to the above, and the time from the start of access of the row address to the output of data does not change in accordance with the external clock signal. But, the clock number from the row access to the column access increases.

In accordance with increase in frequency of the external clock signal, this tendency becomes more remarkable, and the cycle number of external clock signal Ext.CLK from the start of access to the data output increases.

In this case, a fast operation is generally required during a period between the column access and completion of the data output. The speed of this operation cannot increase in accordance with external clock signal Ext.CLK. Therefore, the clock number (which will be referred to as a "latency") between the column access to the data output increases in accordance with increase in frequency of the external clock signal. In contrast to the data output after column access, which is generally performed by continuously outputting a plurality of data, however, only one row address is designated in one row access operation, and therefore fast operation is not significantly required.

In view of the above, the following operation mode is allowed. When internal synchronous signal generating circuit 100 mounted on synchronous semiconductor memory device can complete synchronization with respect to external clock signal Ext.CLK in a sufficiently short time, internal synchronous signal generating circuit 100 performs synchronization, which is triggered by the chip selection i.e. the row access, with external clock signal Ext.CLK during a period of multiple clocks before the start of column access.

Thus, in this operation mode, internal synchronous signal generating circuit 100 is not always required to perform synchronization with external clock signal Ext.CLK.

Therefore, synchronization with internal clock signal int.CLK is not required in connection with the row access, and the period of row access, i.e., the period after taking-in of the row address to activation of the word line and amplification of the memory cell data can be utilized for synchronization between external and internal clock signals Ext.CLK and int.CLK.

The column access can be performed in such a state that internal clock signal int.CLK is sufficiently synchronized with external clock signal Ext.CLK, and no influence is applied to the rapidity of column accessing.

Figure 4:
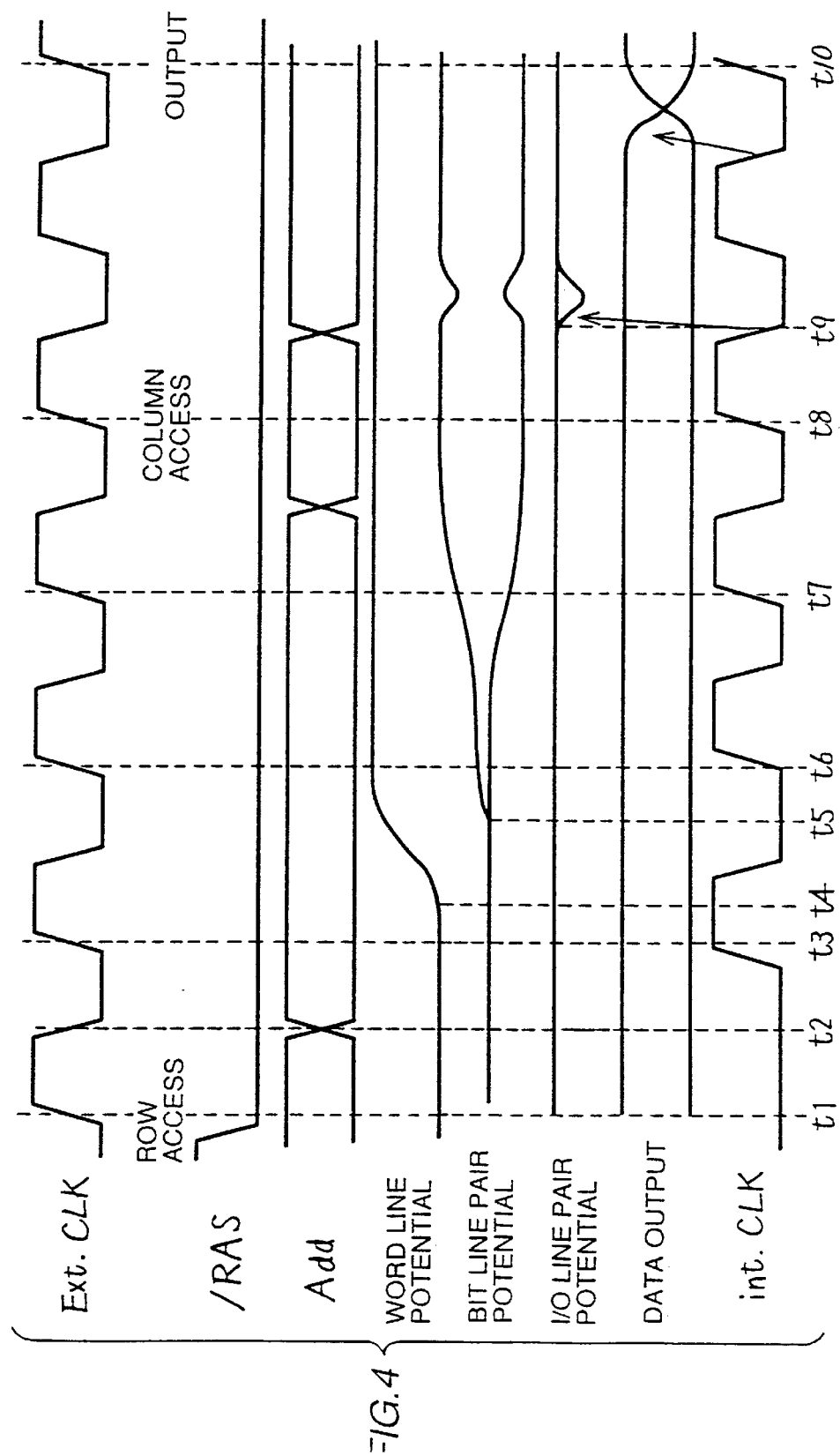
FIG. 4 is a timing chart showing change in major internal signals with time in the synchronous semiconductor memory device 1000.

FIG. 4 is a timing chart showing change of major signals with time during the above operations in synchronous semiconductor memory device 1000 of the embodiment 1.

When external clock signal Ext.CLK rises at time t1, row address signal Ax is taken into address buffer 18. In response to this, row decoder 12 operates in accordance with the internal row address signal issued from address buffer 18, and specifically changes the potential on the corresponding word line to "H" level.

The sense amplifiers amplify potential differences appearing on the bit line pairs connected to the memory cells, which are connected to the selected word line, in accordance with the storage data in these memory cells, and each set potential levels on the paired bit lines to "H" and "L" levels, respectively.

Meanwhile, in response to the chip selection and the activation ("L" level) of row address strobe signal /RAS, internal synchronous signal generating circuit 100 starts synchronization with external clock signal Ext.CLK, and completes synchronization at time t5, i.e., at the rising edge of external clock signal Ext.CLK after 3 cycles from the rising edge of external clock signal Ext.CLK at time t1. Thereafter, it issues synchronized internal clock signal int.CLK.

At time t6 after 4 cycles of external clock signal Ext.CLK from time t1, the column address is taken into address buffer 18, so that column decoder 14 selects a plurality of memory cells corresponding to the internal column address signal which is issued from address buffer 18. In response to the column select signal sent from column decoder 14, the I/O circuit connects the bit line pair corresponding to the selected column to the I/O line pair, and thereby the potential corresponding to the storage data read onto the internal data bus is issued. The selector circuit 28 issues to output circuit 30 the data of memory cell, which corresponds to the internal select signal issued from address buffer 18, among the data corresponding to the plurality of memory cells issued to the internal data bus, and more specifically issues the above data in accordance with the internal control signal sent from internal control signal generating circuit 26.

Output circuit 30 drives the potential level on data I/O terminal 32 to the potential corresponding to the data read from selector circuit 28. At time t8 after two cycles of external clock signal Ext.CLK from taking-in of the column address at time t6, the data is read from data I/O terminal 32.

Figure 5:
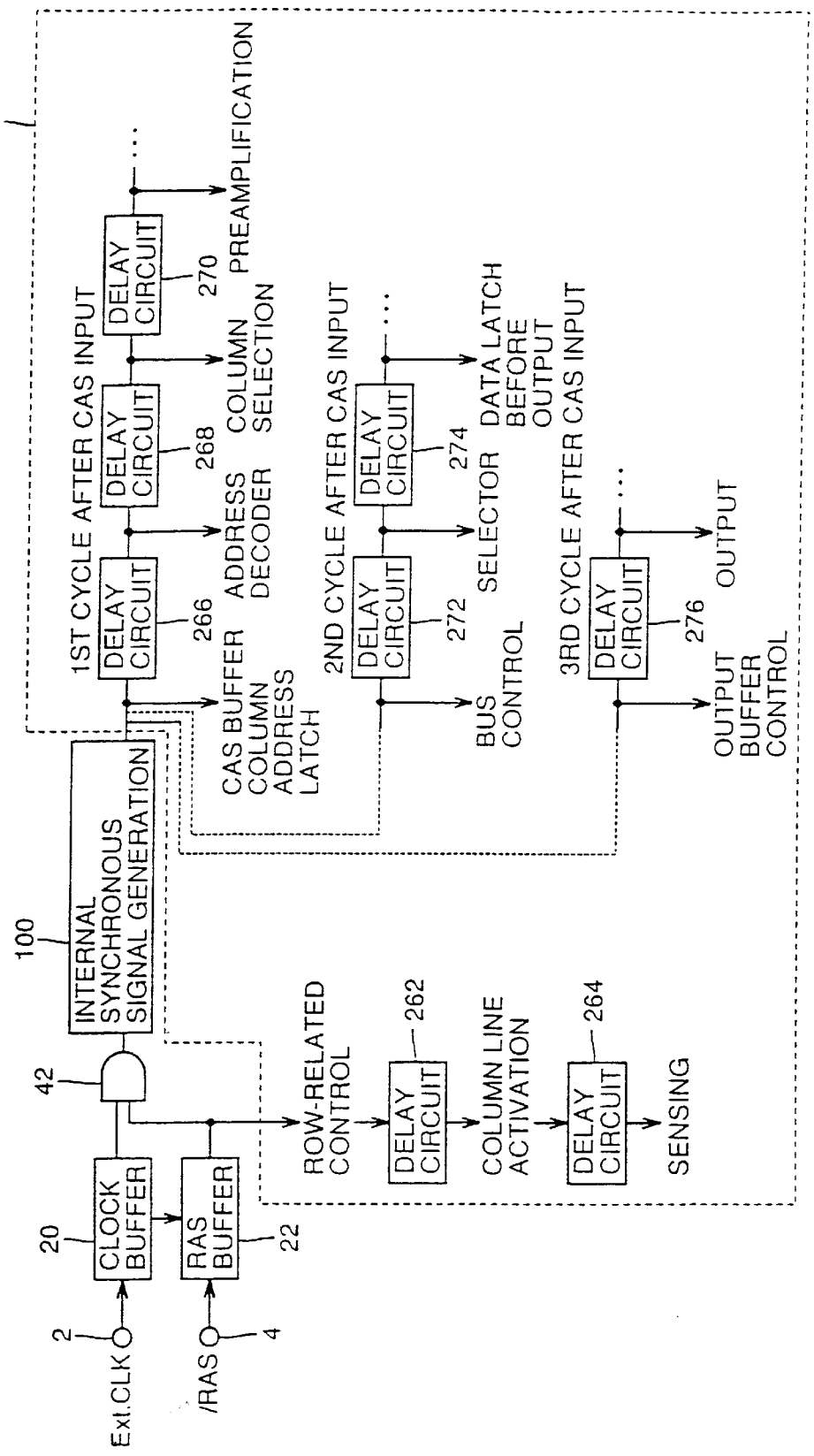
FIG. 5 is a schematic block diagram showing a structure of an internal control signal generating circuit 26 in the synchronous semiconductor memory device 1000.

FIG. 5 is a schematic block diagram showing a structure of internal control signal generating circuit 26 in synchronous semiconductor memory device 1000 shown in FIG. 2.

As already described, the control signal sent from internal control signal generating circuit 26 controls taking-in of the column address by address buffer 18, selection of a column by column decoder 14, output of data onto the internal data bus by the I/O circuit, selection of data by selector circuit 28, and output of data by output circuit 30.

In synchronous semiconductor memory device 1000 of the embodiment 1, as already described with reference to FIG. 4, circuits related to the row operate asynchronously with internal clock signal int.CLK in accordance with the chip selection and the activation of row address strobe signal /RAS, and only circuits related to the column are controlled in accordance with the internal control signals sent from internal control signal generating circuit 26.

More specifically, RAS buffer 22, which receives row address strobe signal /RAS applied to external control signal input terminal 4, operates in accordance with the output from clock buffer 20, which receives external clock signal Ext.CLK applied to external control signal input terminal 2, and more specifically, issues the active internal row address strobe signal (assuming that "H" level represents the active state) when row address strobe signal /RAS is active (i.e., at "L" level) at the rising edge of external clock signal Ext.CLK. In response to this, control of circuit operations related to the row starts. Thus, row decoder 12 selects the row corresponding to row address Ax taken into the buffer.

Thereafter, row decoder 12 changes the potential level on the selected word line into "H" level in accordance with the signal which a delay circuit 262 prepares by delaying the row address strobe signal by a predetermined time.

A delay circuit 264 further delays the signal, which activates the word line, by a predetermined time to produce a signal, by which the sense amplifier is activated to amplify the potential level on bit line pair in accordance with storage information of the memory cell connected to the selected word line.

When signal /RAS is activated, and the internal row address strobe signal issued from RAS buffer 22 is activated, an AND gate 42 opens, and clock buffer 20, which receives external clock signal Ext.CLK applied to external control signal input terminal 2, applies external clock signal Ext.CLK to internal synchronous signal generating circuit 100. Thus, internal synchronous signal generating circuit 100 is supplied with external clock signal Ext.CLK after activation of signal /RAS, and internal synchronous signal generating circuit 100 starts the synchronization, which is triggered by signal /RAS.

In accordance with internal clock signal int.CLK issued from internal synchronous signal generating circuit 100, CAS buffer 24 is first controlled, and, if column address strobe signal /CAS applied to external control signal input terminal 6 is active (i.e., at "L" level), address buffer 18 takes in the column address applied via address signal input terminal 8 (i.e., column address is latched) under the control of CAS buffer 24.

When signal /CAS is activated, internal clock signal int.CLK issued from internal synchronous signal generating circuit 100 is synchronized with external clock signal Ext.CLK, so that the subsequent operations are controlled in synchronization with internal clock signal int.CLK which is synchronized with external clock signal Ext.CLK.

In first cycle of internal clock signal int.CLK after activation of signal /CAS, and, for example, after taking-in of the column address, column decoder 14 is controlled to decode the address by the signal, which a delay circuit 266 prepares by delaying internal clock signal int.CLK by a predetermined time. Further, a delay circuit 268 delays the signal instructing this address decoding by a predetermined time to produce a signal, by which the column select signal is activated, and a plurality of memory cells designated by the column address are simultaneously selected.

A delay circuit 270 delays the signal, which activated the column selection, by a predetermined time to produce a preamplifier amplifying signal for activating the preamplifier (not shown) for driving the internal data bus.

Meanwhile, at the second cycle of internal clock signal int.CLK after activation of signal /CAS, internal clock signal int.CLK controls the internal data bus. After the internal data bus is charged to a predetermined precharged potential, a transfer gate between the preamplifier circuit and the internal data bus is turned on, so that data are sent from the selected memory cells onto the internal data bus. A delay circuit 272 delays the internal control signal, which controlled the bus, by a predetermined time to produce a signal, by which selector circuit 28 is activated to issue data corresponding to the selected memory cell among the data, which are read from the plurality of memory cells, to output circuit 30 in accordance with the internal select signal applied through address buffer 18. A delay circuit 274 delays the signal, which activated the selector circuit, by a predetermined time to produce a signal, by which the latch circuit (not shown) in output circuit 30 is operated to latch the read data sent from selector circuit 28.

At the third cycle after activation of signal /CAS, an output buffer circuit (not shown) in output circuit 30 is activated in response to activation of internal clock signal int.CLK. A delay circuit 276 delays this output buffer control signal by a predetermined time to produce a signal, with which output circuit 30 drives the potential level on data I/O terminal 32 to the corresponding potential.

In the above description, signals from the CAS buffer control signal to the preamplifier control signal are issued at the first cycle after activation of signal /CAS, signals from the bus control signal to the data prelatch signal are issued at the second cycle after activation of signal /CAS, and the output buffer control signal and the output control signal are issued at the third cycle after activation of signal /CAS. In practice, signals such as CAS buffer control signal, bus control signal and output buffer control signal are issued in all the cycles. In this case, however, there is no meaning in the operations, which are performed, for example, in accordance with the bus control signal before amplification of the read data by the preamplifier, and, for example, the operation performed by the bus control signal at the first cycle after activation of signal /CAS. Only the data which is issued to data I/O terminal 32 after predetermined cycles after activation of signal CAS is externally read as a meaningful value.

According to the structure of internal control signal generating circuit 26 described above, the row-related circuits are activated, and simultaneously, internal synchronous signal generating circuit 100 starts the synchronizing operation which is triggered by activation of signal /CS and signal /RAS, after it is detected that signal /RAS is activated in synchronization with external clock signal Ext.CLK. Operations of the column-related circuits are controlled in synchronization with internal clock signal int.CLK issued from internal synchronous signal generating circuit 100.

While signal /RAS is not active, internal synchronous signal generating circuit 100 does not perform the synchronizing operation, so that the power consumption of internal synchronous signal generating circuit 100 is reduced, and the power consumption of synchronous semiconductor memory device 1000 during standby is suppressed. In the above description, the column address is taken into the buffer at the fourth cycle after activation of signal /RAS, and data is externally issued at the second cycle of external clock signal Ext.CLK after the taking-in of the column address. The numbers of cycles are not restricted to the above values, and can be varied depending on the length of cycle of external clock signal Ext.CLK.

Embodiment 2

Figure 6:
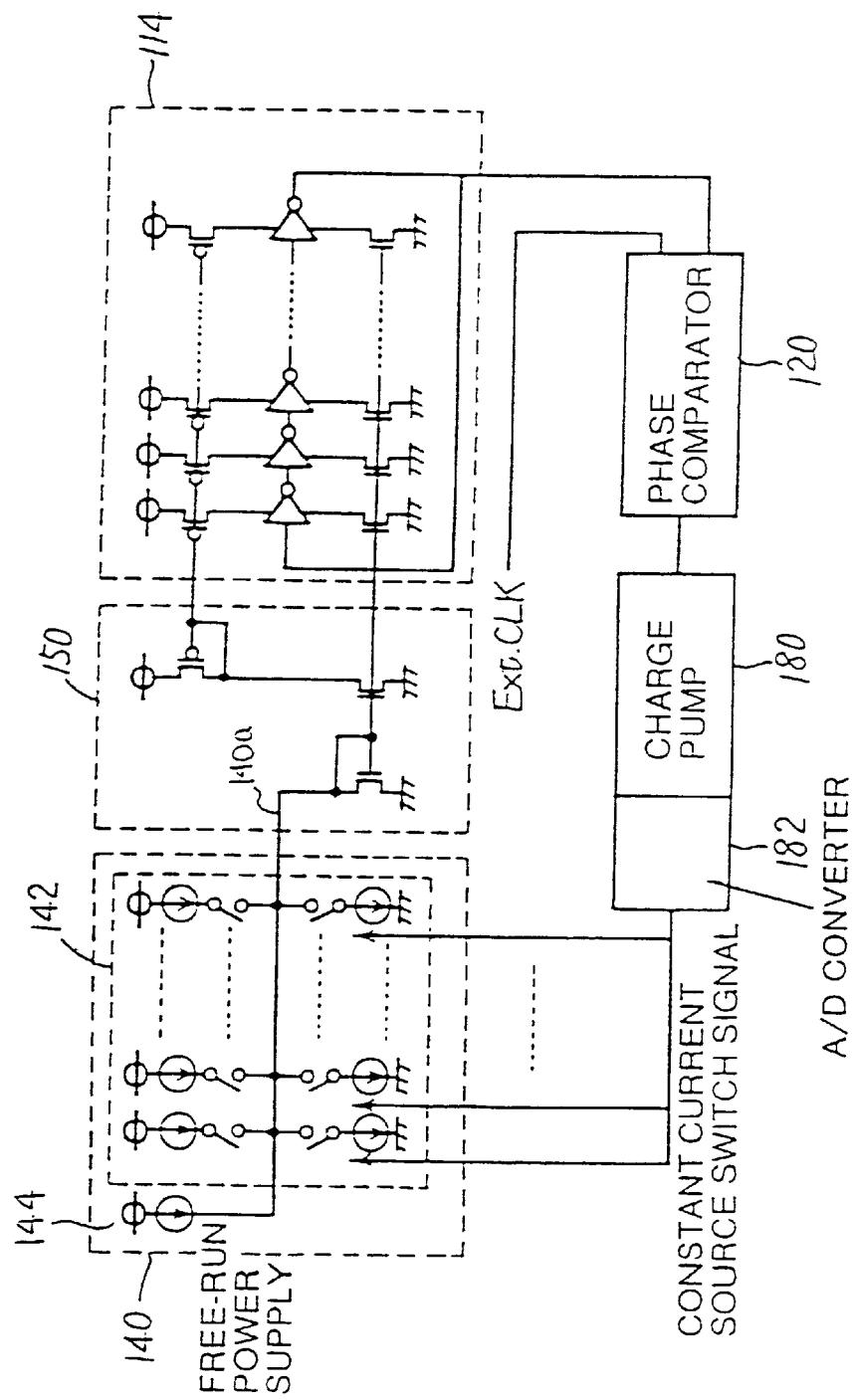
FIG. 6 is a schematic block diagram showing a structure of an internal synchronous signal generating circuit 102 of an embodiment 2 of the invention.

FIG. 6 is a schematic block diagram showing a structure of an internal synchronous signal generating circuit 102 of the embodiment 2 of the invention.

The structure of synchronous semiconductor memory device provided with internal synchronous signal generating circuit 102 differs from that of synchronous semiconductor memory device 1000 shown in FIG. 2 only in the internal synchronous signal generating circuit. The similar structures will not be described below.

Internal synchronous signal generating circuit 102 of the embodiment 2 includes a ring oscillator circuit 114, phase comparator 120 which receives external clock signal Ext.CLK and an output of ring oscillator circuit 114, and makes a phase comparison between them, a charge pump 180 which issues a predetermined potential in accordance with the result of comparison of phase comparator 120, an analog-digital converter circuit (i.e., A-D converter circuit) 182 which receives an output of charge pump 180 and issues corresponding constant current source switch signal CS in a digital form, a variable constant-current source circuit 140 which issues to output node 140a the current of which value corresponds to constant current source switch signal CS, and a delay control circuit 150 which controls an oscillation frequency of ring oscillator circuit 140 in accordance with the value of constant current supplied to output node 140a.

Since structures of variable constant-current source circuit 140 and delay control circuit 150 are similar to those in internal synchronous signal generating circuit 100 of the embodiment 1. Similar portions bear the same reference numbers, and will not be described below.

Figure 43:
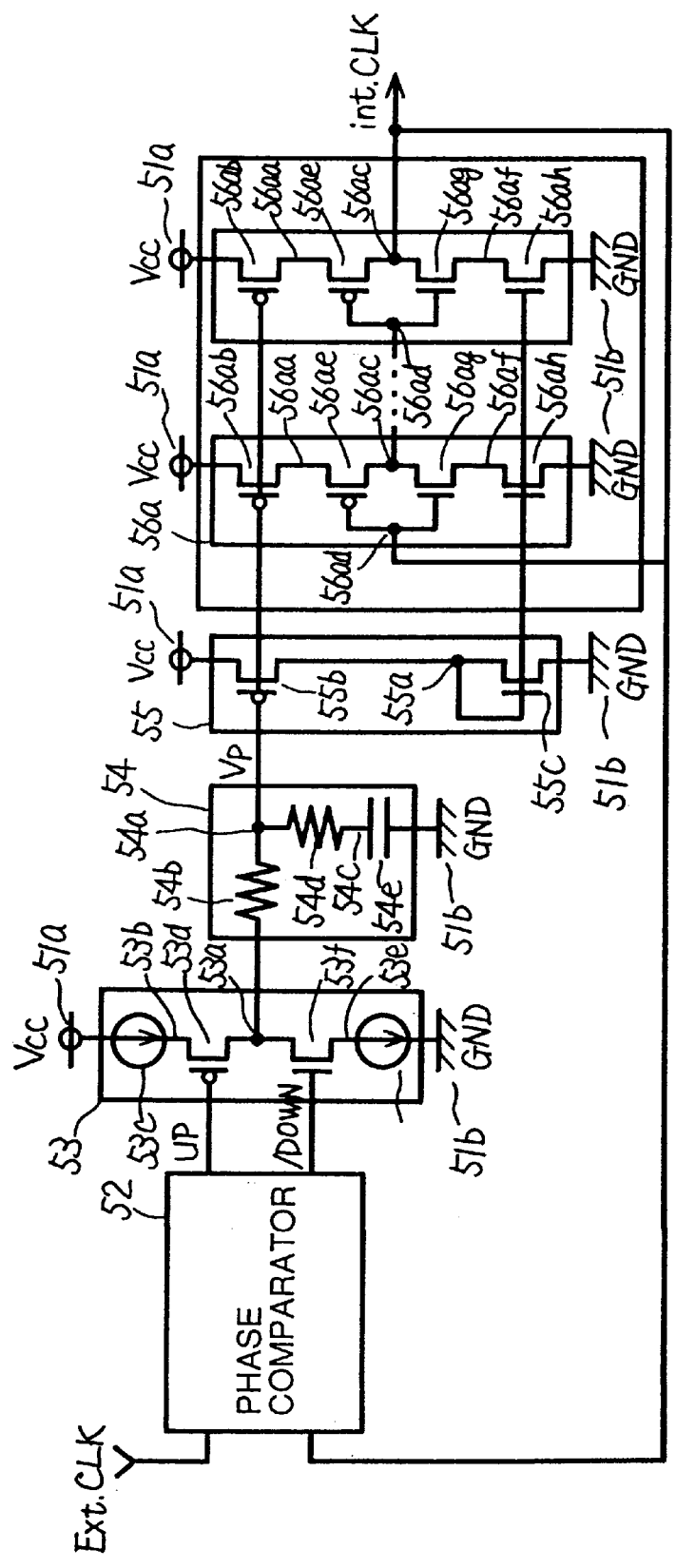
FIG. 43 is a circuit diagram showing a structure of an internal synchronous signal generating circuit 50 in the prior art.
Figure 44:
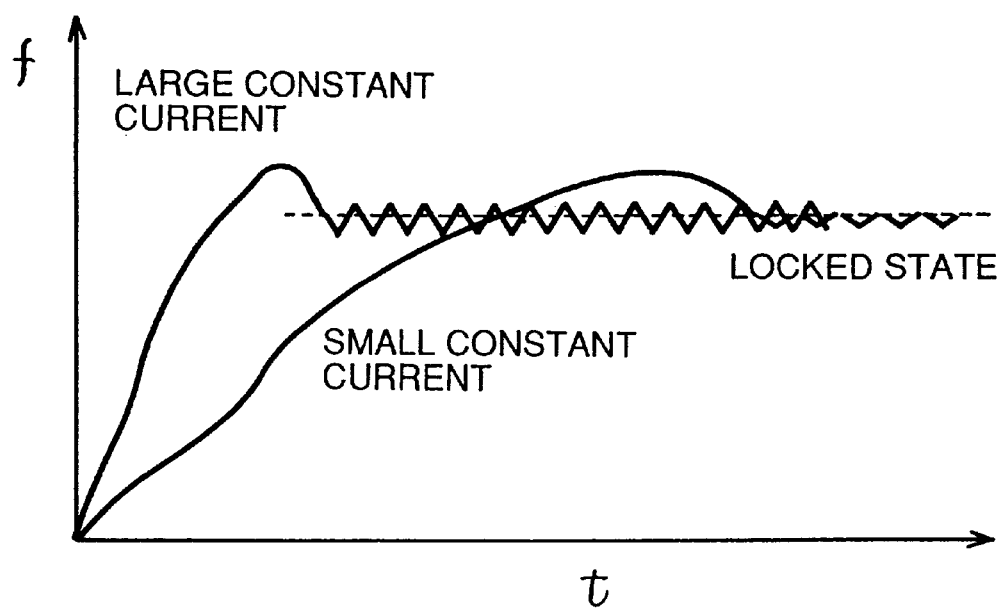
FIG. 44 shows an operation of the internal synchronous signal generating circuit 50 in the prior art.

The structures of phase comparator 120 and charge pump circuit 180 are similar to those of phase comparator 52 and charge pump circuit 53 in the conventional PLL circuit 50 shown in FIG. 43.

Accordingly, the structure of internal synchronous signal generating circuit 102 of the embodiment 2 differs from that of internal synchronous signal generating circuit 100 of the embodiment 1 in that the internal synchronous signal generating circuit 102 is formed of a kind of PLL circuit in contrast to the internal synchronous signal generating circuit 100 of the embodiment 1 formed of a kind of DLL circuit.

The structure of ring oscillator circuit 114 is basically similar to that of ring oscillator circuit 56 in the conventional PLL circuit 50. Thus, in ring oscillator circuit 114, inverter circuits Inv.1 to Inv.n at odd-numbered stages are connected in a ring form, and the value of current supplied to each inverter circuit Inv.i (i=1, 2, . . . n) is controlled by p-channel MOS transistor P1i, which is connected between power supply potential Vcc and inverter circuit Inv.i, and has a gate potential controlled by delay control circuit 150, and n-channel MOS transistor N1i, which is connected between inverter circuit Inv.i and ground potential GND, and has a gate potential controlled by delay control circuit 150.

The value of current supplied to each inverter circuit Inv.i forming ring oscillator circuit 114 is controlled by the value of constant current, which is supplied from variable constant-current source circuit 140 and varies in a digital manner, similarly to the internal synchronous signal generating circuit 100 in the embodiment 1. Therefore, even in the operation state that the value of current supplied to each inverter circuit Inv.i is relatively large, i.e., that synchronization with externally supplied external clock signal Ext.CLK is completed more rapidly, internal clock signal int.CLK can be stably generated without generating jitter or the like, as can be done in the embodiment 1.

Figure 7:
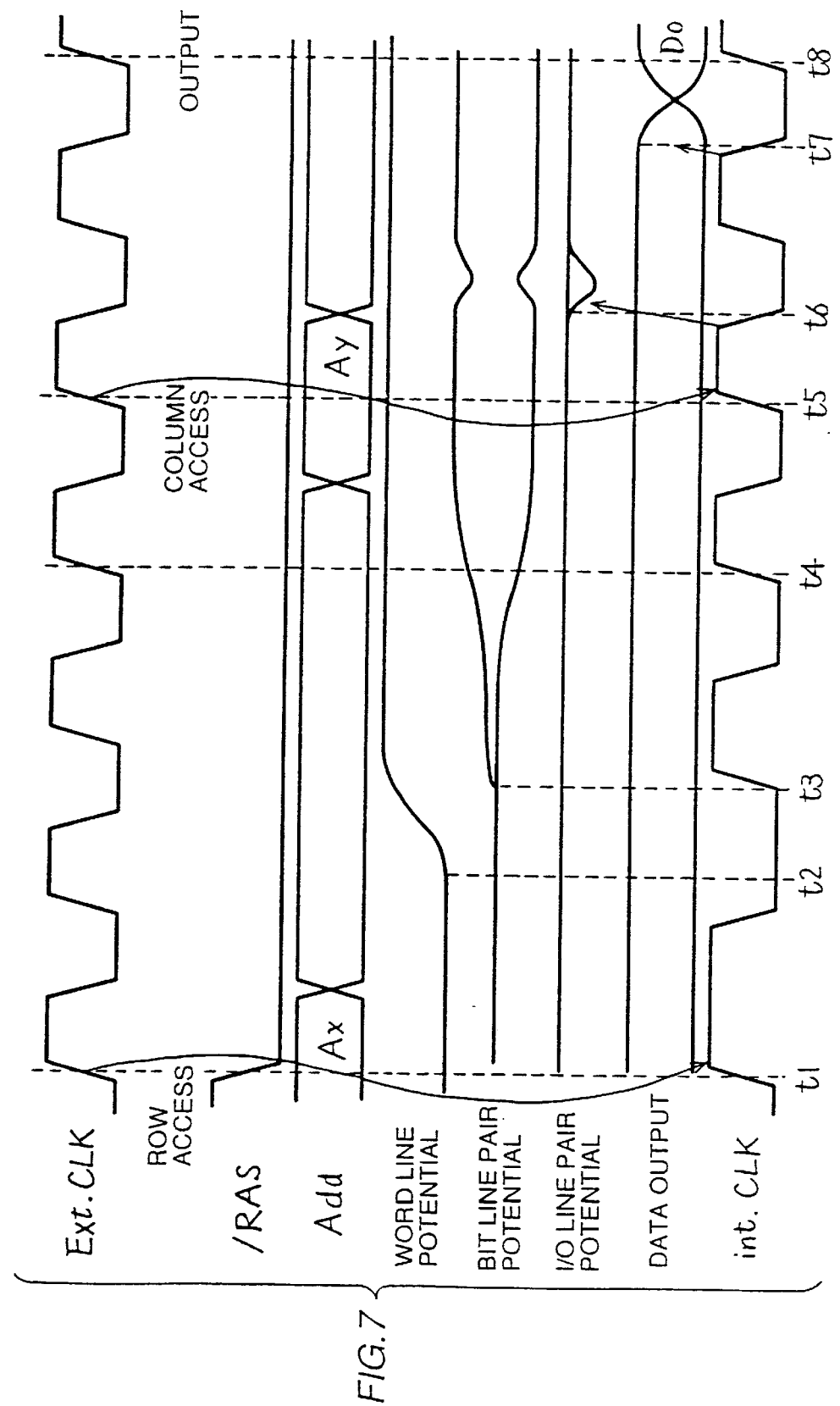
FIG. 7 is a timing chart showing an operation of the synchronous semiconductor memory device of the embodiment 2.

FIG. 7 is a timing chart showing an operation of synchronous semiconductor memory device of the embodiment 2.

When it is detected that signal /CS and signal /RAS are active (at "L" level) at time t1, i.e., at the rising edge of external clock signal Ext.CLK, address buffer 18 takes in row address signal Ax. In response to this, row decoder 12 boosts the potential on selected word line to "H" level at time t2. At subsequent time t3, sense amplifiers amplify the potential levels on the bit line pairs corresponding to the memory cells, which are connected to the selected word line, in accordance with the storage data. Meanwhile, internal synchronous signal generating circuit 102 starts the synchronization in response to activation of signal /RAS at time t1. In the example shown in FIG. 7, internal synchronous signal generating circuit 102 completes the synchronization during 3 cycles of external clock signal Ext.CLK after time t1, and issues internal clock signal int.CLK synchronized with external clock signal Ext.CLK at time t4.

At time t5 after 4 cycles from time t1, i.e., at the rising edge of external clock signal Ext.CLK and therefore rising edge of internal clock signal int.CLK, address buffer 18 takes in column address Ay, and the column-related operations are activated in response to this. Thus, the bit line pair is connected to the corresponding I/O line pair at time t6, the potential on this I/O line pair is transmitted onto the internal data bus. At time t7, output circuit 30 starts driving of the potential level on data I/O terminal 32, read data DO issued to data I/O terminal 32 is externally read at second cycles after the column access at time t5, i.e., rising edge of external clock signal Ext.CLK at time t8.

In the embodiment 2, since internal synchronous signal generating circuit 102 starts the synchronization in response to activation of signal /CS and signal /RAS, similar to the embodiment 1, internal synchronous signal generating circuit 102 does not perform the synchronization but oscillates at a frequency corresponding to the value of current supplied from free-run power supply 144, while signal /RAS is inactive. Therefore, a power consumption of the synchronous semiconductor memory device during standby can be reduced.

Figure 8:
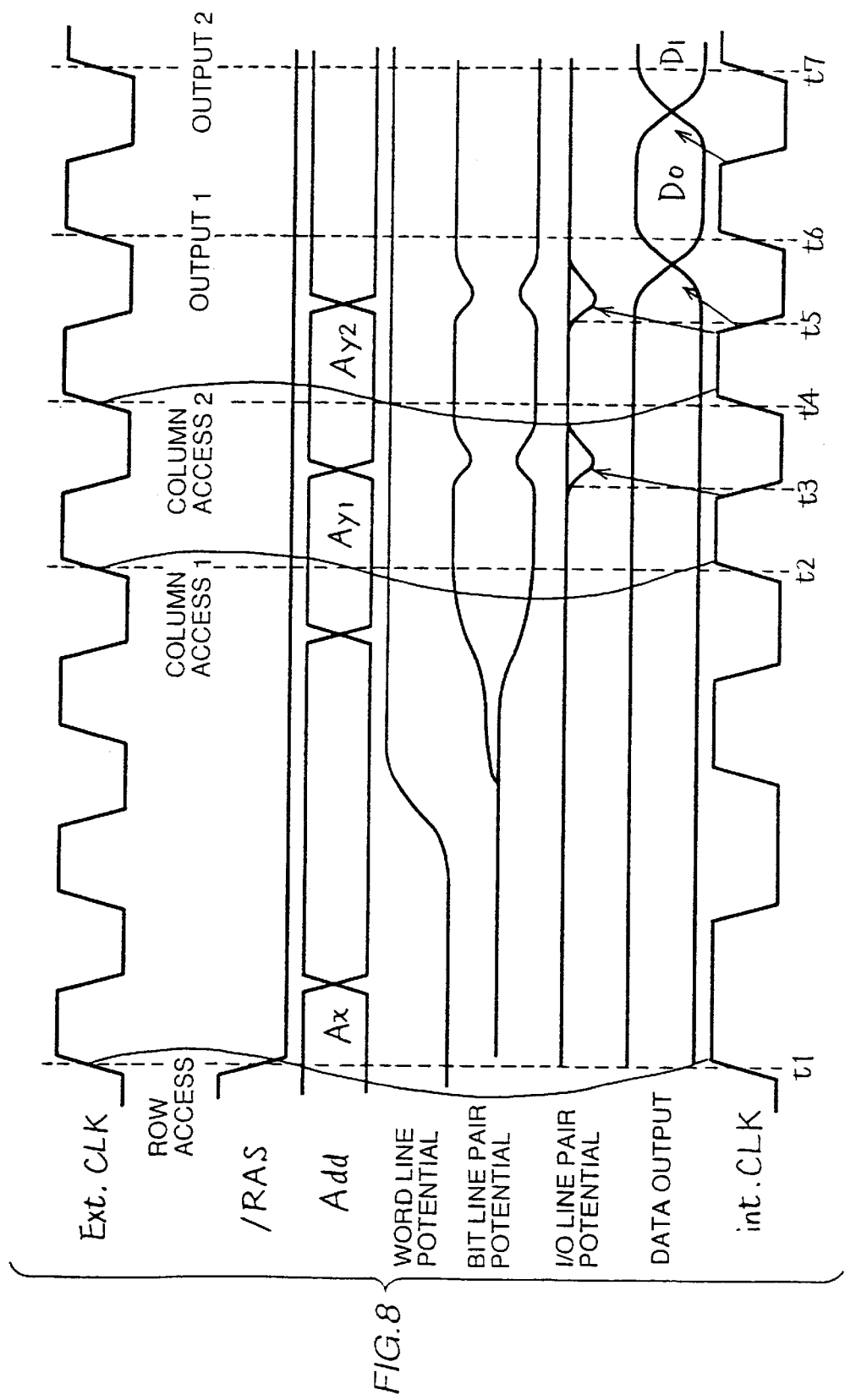
FIG. 8 is a timing chart showing another operation mode of the synchronous semiconductor memory device of the embodiment 2.

FIG. 8 is a timing chart showing an operation of the synchronous semiconductor memory device of the embodiment 2, and particularly the operation in which column access is continuously performed two times, i.e., data is continuously output from memory cells, which belong to different columns, respectively, among the memory cells selected by one word line.

In this case, the operation of internal synchronous signal generating circuit 102 is activated similarly to the case already described with reference to FIG. 7, and, in other words, simultaneously with taking-in of the row address into the buffer in response to activation of signal ICS and signal /RAS at time t1. Thereafter, the potential level on the selected word line is driven, and, in response to this, the sense amplifiers amplify the bit line potential levels in accordance with storage data in the memory cells connected to the corresponding bit line pairs, respectively.

At the rising edge of external clock signal Ext.CLK at time t2 after three cycles from time t1, internal synchronous signal generating circuit 102 completes the synchronization, and starts issuing of internal clock signal int.CLK synchronized with external clock signal Ext.CLK.

At time t2, first column address signal Ay1 is taken into address buffer 18. In response to this, the corresponding bit line pair is connected to the I/O line pair at time t3, so that read data is sent onto the internal data bus. Subsequently, second column address signal Ay2 is taken into address buffer 18 at time t4, i.e., at the rising edge of external clock signal Ext.CLK. In response to this, the corresponding bit line pair is connected to the I/O line pair at time t5, and second read data is sent onto the internal data bus. At time t6, first read data D0 is issued from output circuit 30 to data I/O terminal 32, and second read data D1 is externally read at time t7, i.e., at the rising edge of external clock signal Ext.CLK.

Even in the case where data of the memory cells selected by one word line are continuously issued externally from the synchronous semiconductor memory device, internal synchronous signal generating circuit 102 can start the synchronization in accordance with activation of signal /CS and signal /RAS, as already described with reference to FIG. 7.

Figure 9:
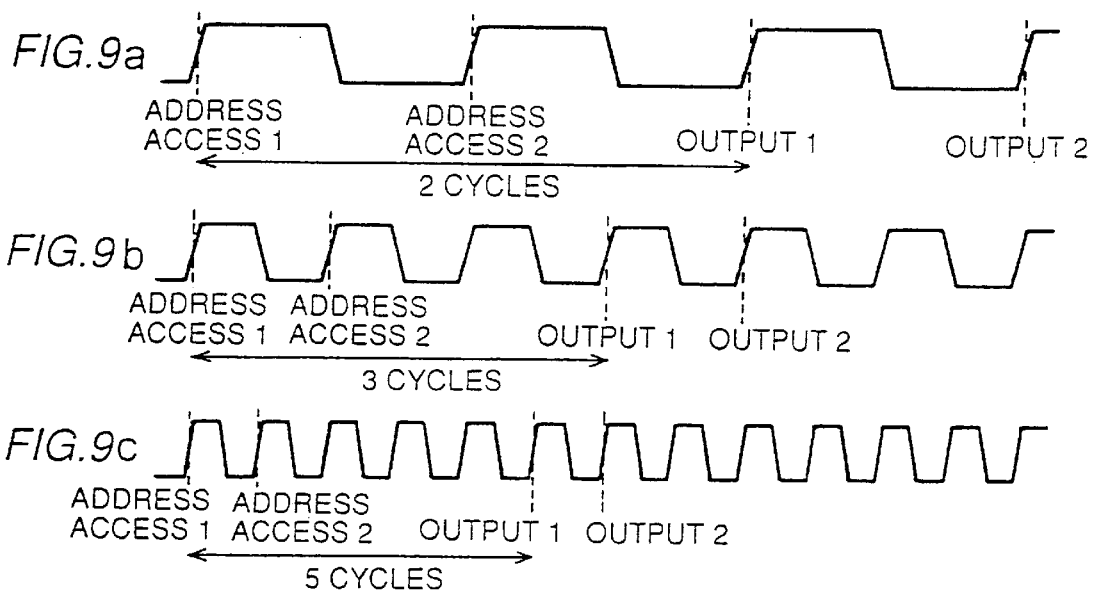
FIGS. 9a, 9b and 9c are timing charts showing operations of the synchronous semiconductor memory device of the embodiment 2 with cycles of ⅓, ½ and ¼ of a cycle of a predetermined external clock signal, respectively.

FIG. 9 is a timing chart showing a relationship between external clock signal Ext.CLK and timings of various operations for continuously outputting data as already described with reference to FIG. 8.

FIG. 9*a* shows a waveform in the operation of continuously issuing two data with external clock signal Ext.CLK of a predetermined frequency. FIG. 9*b* shows a waveform of the operation with double the frequency in FIG. 9*a*, and FIG. 9*c* shows a waveform of the operation with quadruple the frequency in FIG. 9*a*.

In accordance with increase in frequency of external clock signal Ext.CLK, a period between the address access and the data output can be reduced. However, this reduction is allowed only to a limited extent which depends on the operation time of internal circuits. In FIG. 9*a*, therefore, two cycles of external clock signal Ext.CLK are required from the address access to the data output. In FIG. 9*b*, three cycles are required, and, in FIG. 9*c*, five cycles are required. As can be seen from the above, the time between the address access to the data output is reduced only to an extent smaller than that of reduction in frequency of external clock signal Ext.CLK.

Conversely, the number of cycles of external clock signal Ext.CLK which are present between the address access to the data output increases in accordance with increase in frequency of external clock signal Ext.CLK. Therefore, internal synchronous signal generating circuit 102 is required only to complete the synchronization with external clock signal Ext.CLK within this period.

Figure 10:
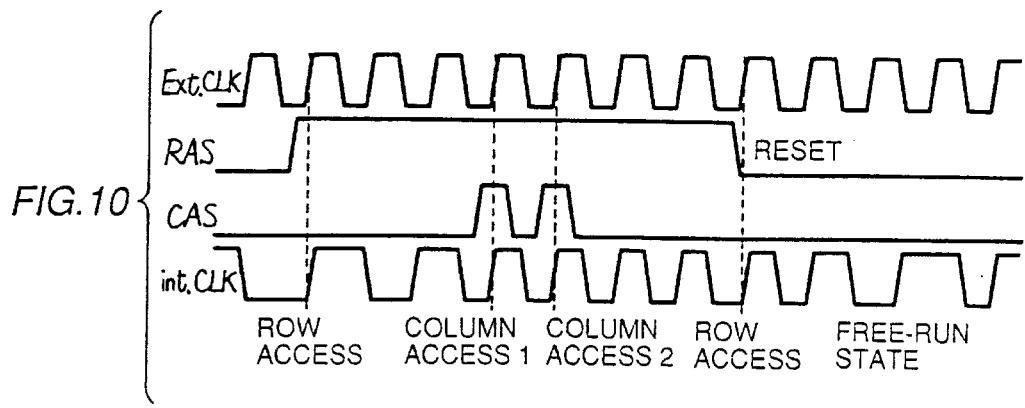
FIG. 10 is a timing chart showing the operation shown in FIG. 9 and particularly the operation for a longer term.

FIG. 10 is a timing chart showing variation of respective signals in the continuous read operation shown in FIG. 9, and particularly shows the variation for a longer term.

In response to activation of external row address strobe signal /RAS, internal row address strobe signal RAS is activated to attain "H" level, and the row address is taken into the buffer in response to the first rising edge of external clock signal Ext.CLK after this activation. For example, external column address strobe signal CAS is activated two times while internal row address strobe signal RAS is active, whereby the column address signal is taken into the buffer two times at the rising edges of external clock signal Ext.CLK while internal column address strobe signal CAS attains "H" level two times. Thereafter, in response to deactivation of the internal row address strobe signal, the operation of internal synchronous signal generating circuit 102 is reset, and thereafter, the internal synchronous signal generating circuit operates in a free-run state, i.e., the operation state that the operation is performed with an operation frequency determined by the value of current originally supplied from free-run power supply 144.

In the PLL circuit of the embodiment 2, internal clock signal int.CLK operates completely independently of the external clock signal, when the free-run state is attained as described above.

Meanwhile, in the internal synchronous signal generating circuit 100 of the DLL circuit of the embodiment 1, the operation can be performed with internal and external clock signals int.CLK and Ext.CLK having rising edges matched with each other, even after such a free-run state is attained that the operation is performed with the operation frequency originally set by the free-run power supply.

Figure 11:
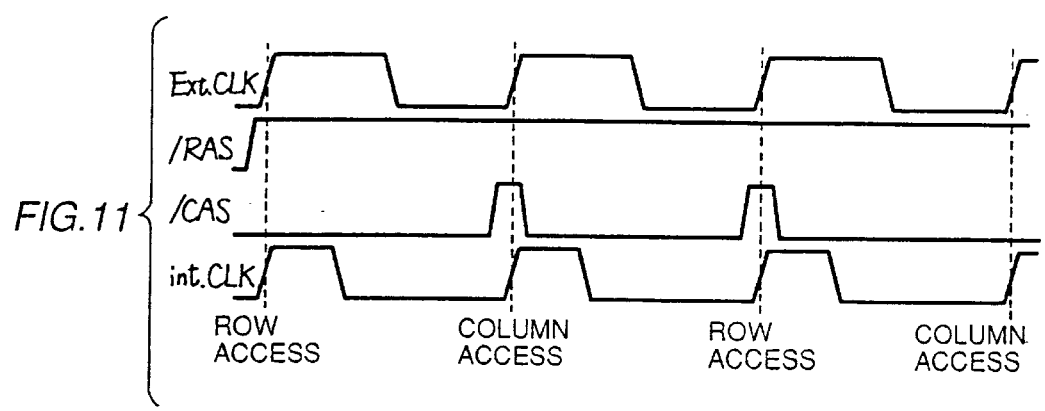
FIG. 11 is a timing chart showing an operation of the synchronous semiconductor memory device during operation of the internal synchronous signal generating circuit in a free-run state.

The above situation is shown in a timing chart of FIG. 11. In internal synchronous signal generating circuit 100 of the embodiment 1, the operation can be performed with at least the rising edges internal clock signal int.CLK and external clock signal Ext.CLK matched with each other, even after the free-run state is attained.

Thus, when external clock signal Ext.CLK has a frequency smaller than a predetermined value and a cycle larger than a constant time, internal synchronous signal generating circuit 100 can operate in the free-run state.

Embodiment 3

Figure 12:
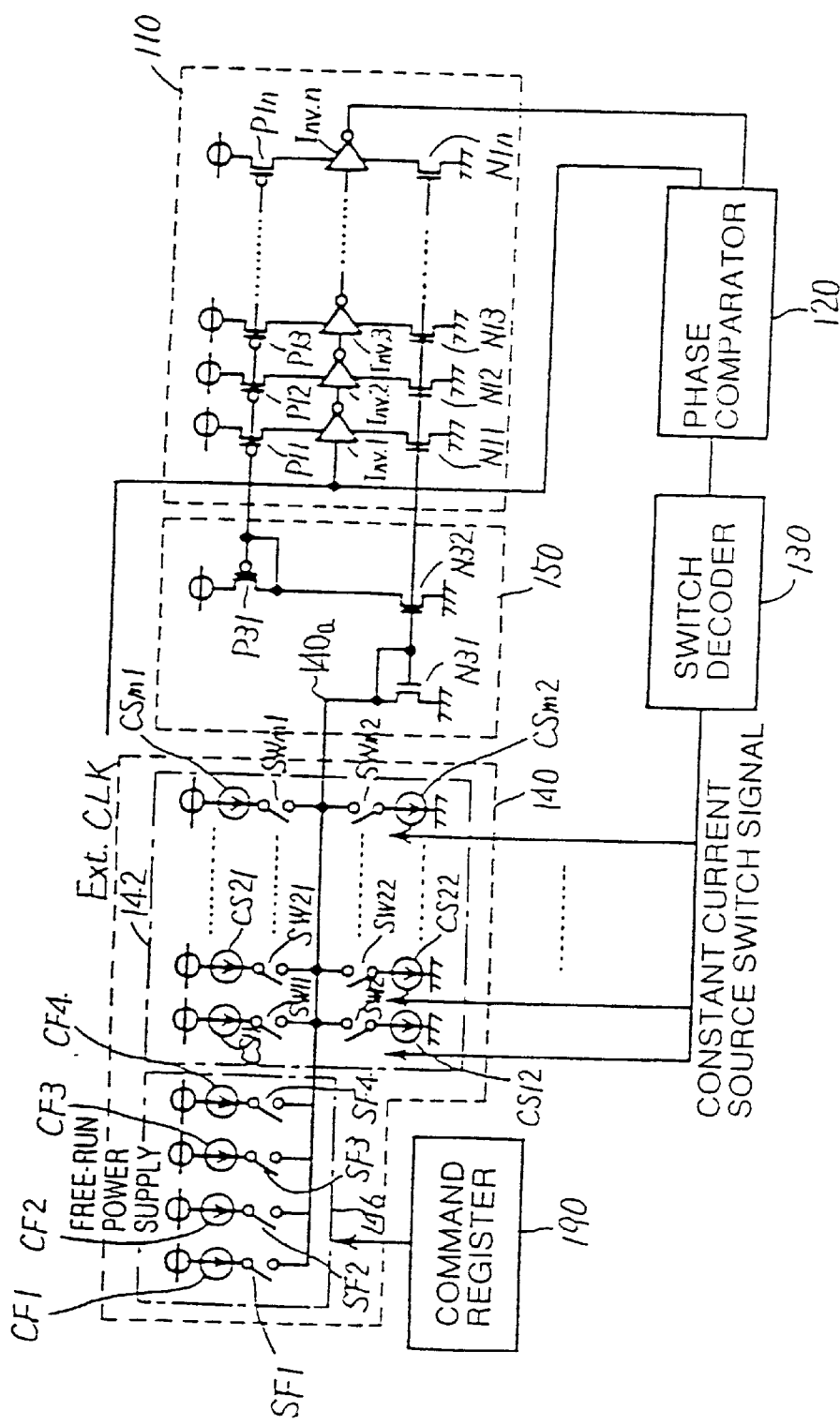
FIG. 12 is a schematic block diagram showing a structure of an internal synchronous signal generating circuit 200 of an embodiment 3 of the invention.

FIG. 12 is a schematic block diagram showing a structure of an internal synchronous signal generating circuit 200 of an embodiment 3 of the invention.

The structure of internal synchronous signal generating circuit 200 of the embodiment 3 differs from that of internal synchronous signal generating circuit 100 of the embodiment 1 in the following two points.

First, a free-run current source 146 of the embodiment 3 can supply a current of which value is variable depending on the externally supplied control signal, although free-run power supply 144 in the embodiment 1 can supply only the free-run current of an invariable value.

Second, a command register 190 controls the value of current supplied from free-run current source 146 based on externally supplied latency data.

Structures other than the above are similar to those of internal synchronous signal generating circuit 100 of the embodiment 1. Similar portions bear the same reference numbers, and will not be described below.

As will be described later, internal synchronous signal generating circuit 200 of the embodiment 3 can further reduce the number of clocks required for synchronization of internal clock signal int.CLK issued therefrom with external clock signal Ext.CLK compared with synchronous signal generating circuit 100 of the embodiment 1.

In accordance with increase of a phase difference between external clock signal Ext.CLK and internal clock signal int.CLK issued from delay circuit 110, the number of clocks required before completion of the synchronization increases.

Accordingly, a degree of delay by delay circuit 110 during the free-run state in the initial state may be set, in advance, to approach the time of one cycle of external clock signal Ext.CLK, whereby it is possible to suppress increase of the clock number required before completion of the synchronization.

For example, in the synchronous semiconductor memory devices which perform the high-frequency operations in synchronization with external clock signal Ext.CLK as described in the embodiments 1 and 2, the value of latency from the column access to the data output has been stored on chips. In general, the value or magnitude of this latency increases with increase in frequency of the external clock signal. Therefore, such a structure can be employed that the degree of delay of delay circuit 110 in the free-run state is varied in accordance with the value stored as the value of latency.

In this case, such a structure may be employed that the degree of delay in the free-run state decreases with increase in operation frequency, whereby it is possible to reduce the clock numbers from the initial state, i.e., free-run state to the synchronization with external clock signal Ext.CLK. When the latency value is large, a high-frequency operation is performed, and external clock signal Ext.CLK has a short cycle, so that intended operations can be performed by increasing the quantity of current supplied to inverters Inv.1 to Inv.n forming delay circuit 110 so as to reduce the degree of internal delay. Conversely, when the latency value is small, a low-frequency operation is performed, and external clock signal Ext.CLK has a long cycle, so that intended operations can be performed by reducing the quantity of current supplied to inverters Inv.1 to Inv.n so as to increase the degree of internal delay.

Figure 13:
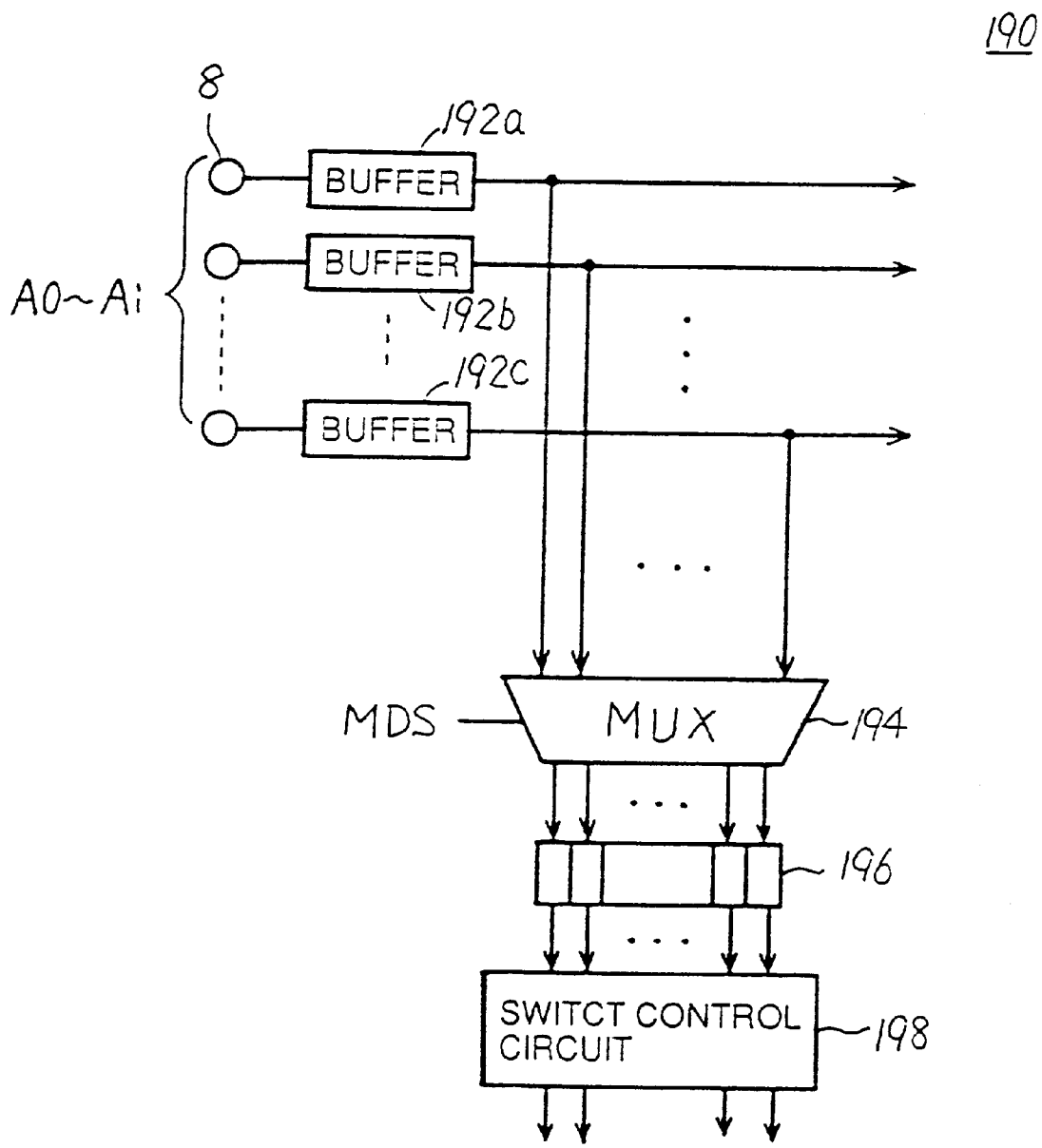
FIG. 13 is a schematic block diagram showing a structure of a command register 190.

FIG. 13 is a schematic block diagram showing a structure of command register 190.

When externally supplied latency data is to be stored in a command register 196 in the synchronous semiconductor memory device, the address signal sent through external address signal input terminal 8 is applied to a multiplexer 194 via buffer circuits 192a, 192b, . . . 192c, and multiplexer 194 writes the data into command register 196. Here, it is assumed that the operation of multiplexer 194 is activated in response to activation of latency data write control signal MDS which is designated by combination of predetermined external control signals.

The current source 146 for free run includes internal constant current sources CF1 to CF4, each of which is connected at one of its terminals to power supply potential Vcc, and is connected at the other terminal to output node 140a via corresponding one of switch circuits SF1 to SF4.

Based on the latency data in command register 196, a switch control circuit 198 controls switch circuits SF1 to SF4 in free-run current source 146.

Owing to the above structure, internal synchronous signal generating circuit 200 of the embodiment 3 sets, in advance, the value of delay circuit 110 during standby, i.e., in the free-run state to a value depending on the cycle of external clock signal Ext.CLK. Therefore, it is possible to reduce the number of clocks between input of external clock signal Ext.CLK and output of synchronized internal clock signal int.CLK.

Embodiment 4

Figure 14:
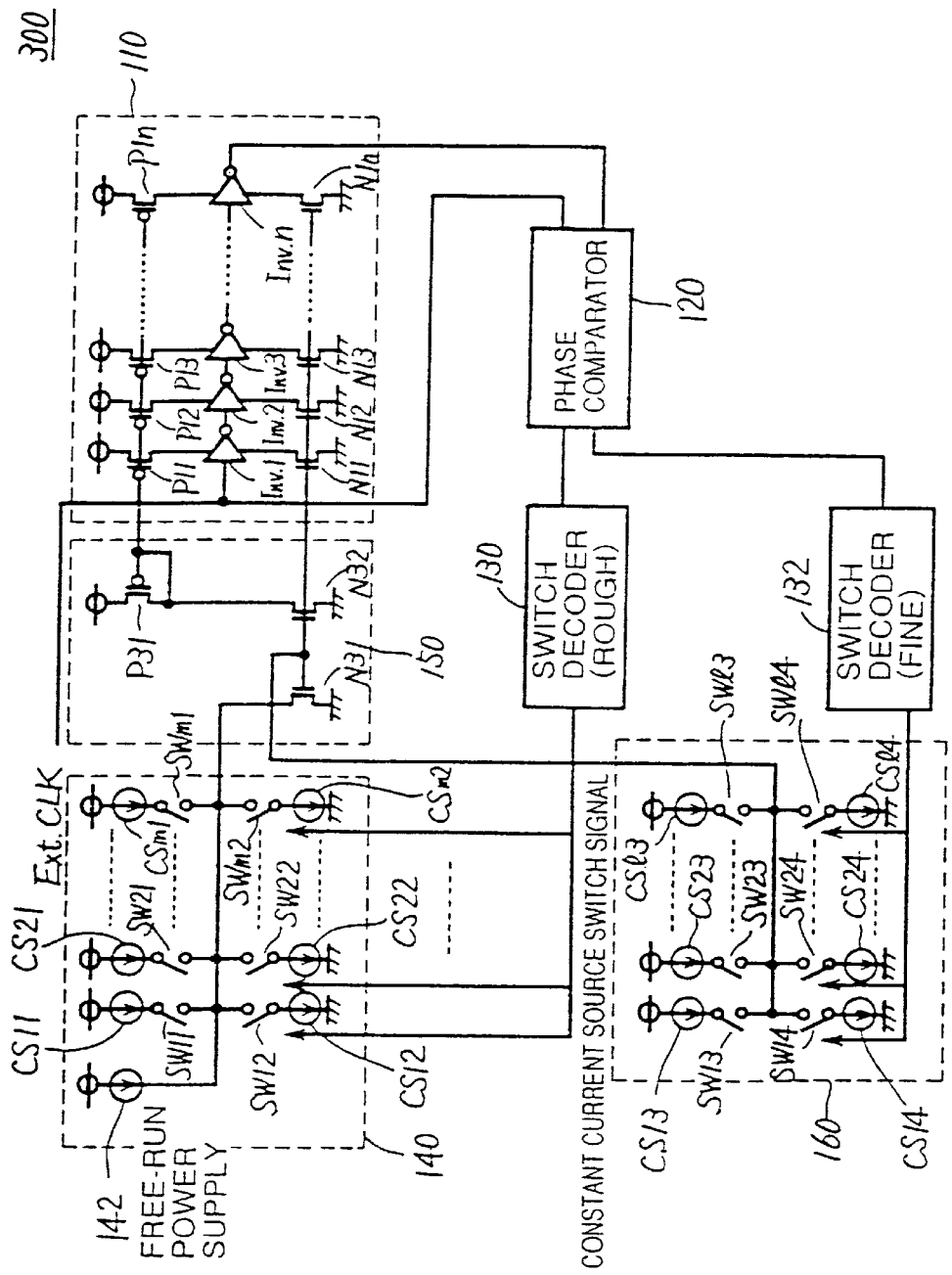
FIG. 14 is a schematic block diagram showing a structure of an internal synchronous signal generating circuit 300 of an embodiment 4 of the invention.

FIG. 14 is a schematic block diagram showing a structure of internal synchronous signal generating circuit 300 of an embodiment 4 of the invention.

The structure of internal synchronous signal generating circuit 300 differs from that of internal synchronous signal generating circuit 100 of the embodiment 1 in that It further includes a variable constant-current source circuit 160 which receives an output of phase comparator 120, and supplies a constant current to delay control circuit 150, and that the value of constant current supplied from variable constant-current source circuit 160 is set by a switch decoder 132 receiving the output of phase comparator 120.

Variable constant-current source circuit 160 includes internal constant current sources CS13, CS23 and CS13, each of which is connected at one of its terminals to power supply potential Vcc and is connected at the other terminal to output node 140a via corresponding one of switch circuits SW13, SW23, . . . SW13 controlled to open/close by switch decoder 132, and also includes internal constant current sources CS14, CS24, . . . CS14, each of which is connected at one of its terminals to output node 140a via corresponding one of switch circuits SW14, SW24, . . . SW14 controlled to open/close by switch decoder 132 and is connected at the other terminal to ground potential GND.

It is assumed that internal constant current sources CS13–CS13 each supply a current of a smaller value than that supplied by internal constant current sources CS11–CSm1 in variable constant-current source circuit 140, and that internal constant current sources CS14–CS14 each receive a current of a smaller value than that received by internal constant current sources CS12–CSm2 in variable constant-current source circuit 140.

It is also assumed that switch decoder 130 controls variable constant-current source circuit 140 in accordance with higher bits in data which is issued in the form of a digital signal from phase comparator 120, and that switch decoder 132 controls the value of current supplied from variable constant-current source circuit 160 in accordance with predetermined lower bits in the output of phase comparator 120.

Structures other than the above are similar to those of the internal synchronous signal generating circuit 100 of the embodiment 1. Similar portions bear the same reference numbers, and will not be described below.

Owing to the above structures, the values of constant currents supplied from variable constant-current source circuits 140 and 160 to output node 140a can be controlled more finely, and synchronization with external clock signal Ext.CLK can be performed more accurately.

Further, the synchronization can be performed rapidly with variable constant-current source circuit 140 having a further large current supply capacity, when a significant phase difference is present between external clock signal Ext.CLK and internal clock signal int.CLK. Meanwhile, a feedback operation with respect to minute phase variation after locking of the phase can be controlled or adjusted by a variable constant-current source circuit 160 which mainly supplies a minute current.

Embodiment 5

Figure 15:
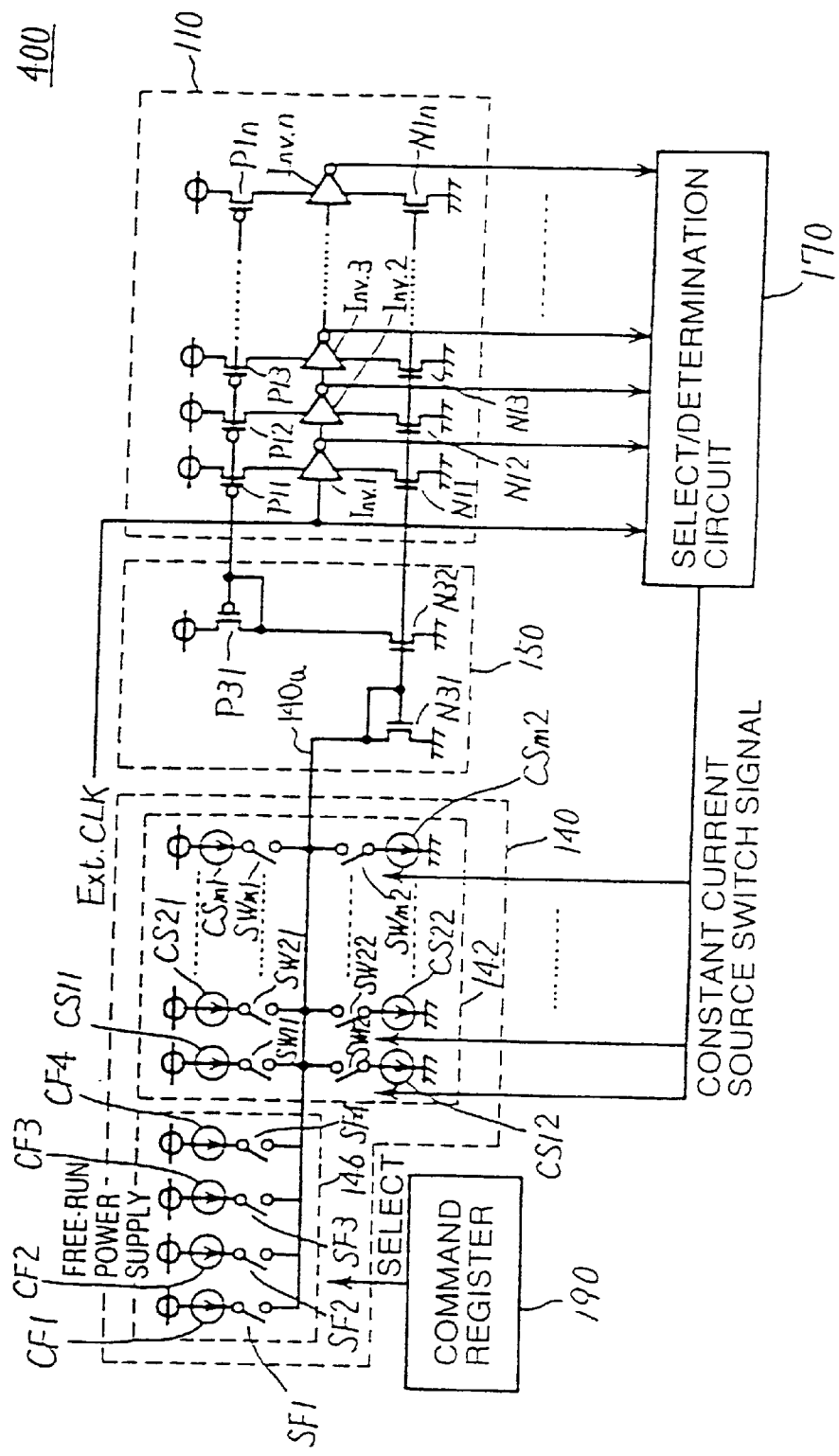
FIG. 15 is a schematic block diagram showing a structure of an internal synchronous signal generating circuit 400 of an embodiment 5 of the invention.

FIG. 15 is a schematic block diagram showing a structure of an internal synchronous signal generating circuit 400 of an embodiment 5 of the invention.

The structure of internal synchronous signal generating circuit 400 of this embodiment differs from that of internal synchronous signal generating circuit 200 of the embodiment 2 in that it has a select/determination circuit 170, which receives in parallel the outputs from inverter circuits Inv.i (i=1, 2, . . . n) included in internal delay circuit 110, and compares them with external clock signal Ext.CLK to determine the highest stage among those of inverter circuits Inv.i, of which output variations are containable within one cycle of external clock signal Ext.CLK. Base on this selection, select/determination circuit 170 issues constant current source switch signal CS.

In internal synchronous signal generating circuit 200 of the embodiment 3 already described, switch decoder 130 issues constant current source switch signal SC based on the data sent from phase comparator 120, which receives external clock signal Ext.CLK and internal clock signal int.CLK sent from delay stage 110 for comparing the phases of them. In contrast to this, internal synchronous signal generating circuit 400 of the embodiment 5 operates in such a manner that select/determination circuit 170, which receives in parallel the outputs of cascade-coupled inverter circuits Inv.1 to Inv.n in delay circuit 110, issues constant current source switch signal CS based on the result of comparison between these output values and external clock signal Ext.CLK.

Structures of variable constant-current source circuit 140, delay control circuit 150 and command register 190 are similar to those in internal synchronous signal generating circuit 200 of the embodiment 3. Similar portions bear the same reference numbers or characters, and will not be described below.

Figure 16:
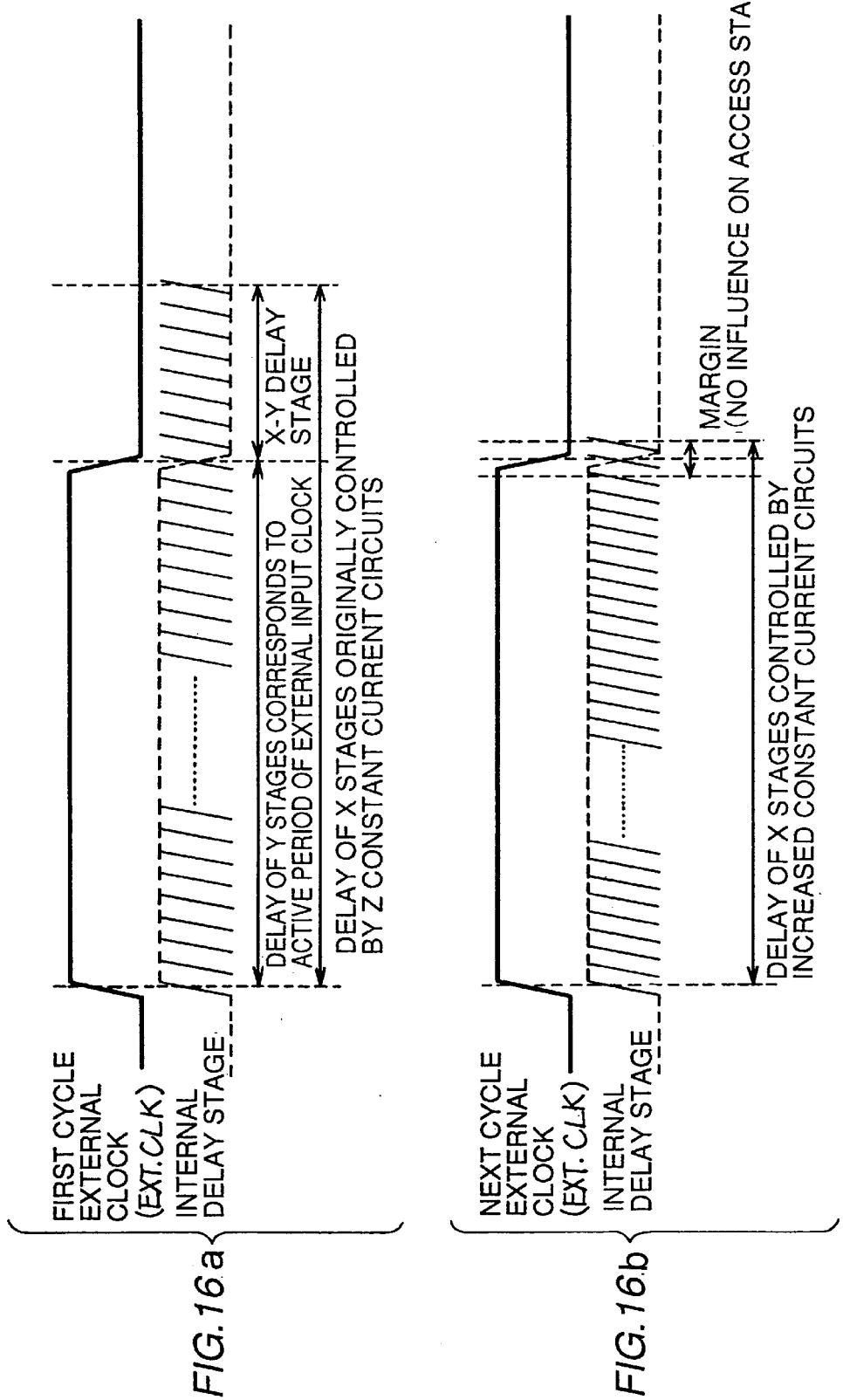
FIGS. 16a and 16b are timing charts showing operations of the internal synchronous signal generating circuit 400, and particularly showing an operation of a select/determination circuit 170 in a free-run state and an operation of the select/determination circuit 170 after controlling a degree of delay, respectively.

FIGS. 16a and 16b are timing charts showing operations of internal synchronous signal generating circuit 400 shown in FIG. 15.

FIG. 16a is a timing chart showing an operation of select/determination circuit 170 in the initial state, i.e., when delay circuit 110 operates based on the value of current supplied from free-run current source 146. FIG. 16b is a timing chart showing an operation of internal synchronous signal generating circuit 400 after the value of current supplied to output node 140a is controlled by constant current source switch signal CS based on the result of comparison in FIG. 16a.

Referring to FIGS. 15 and 16a, inverter circuits Inv.1 to Inv.n forming delay circuit 110 in FIG. 15 are supplied with the current of a value determined by free-run current source 146.

When external clock signal Ext.CLK is supplied in this state, i.e., during standby, this clock signal triggers delay circuit 110 to start the operation. Therefore, the operation of delay circuit 110 corresponding to the first cycle of external clock signal Ext.CLK is defined by the value of current supplied from the free-run current source.

Select/determination circuit 170 receives the outputs of inverter circuits Inv.1–Inv.n forming delay circuit 110, and compares them with external clock signal Ext.CLK. While external clock signal Ext.CLK is active (at "H" level), select/determination circuit 170 counts up change in output of each inverter Inv.i (i=1, 2, ... n). It is now assumed that a period represented with hatching in the figure corresponds to a delay time per inverter circuit stage.

This count-up continues until external clock signal Ext.CLK is deactivated to attain "L" level. In this manner, the number of stages of inverter circuits Inv.i, which invert the output level, is detected during a period that external clock signal Ext.CLK is active, and, in the next cycle, select/determination circuit 170 changes the value of current supplied from variable constant-current source circuit 140 so that the outputs from the inverters at a predetermined number of stages in delay circuit 110 may correspond to the active period of external clock signal Ext.CLK. In the example shown in FIG. 16a, the output signals of inverters Inv.y at y stages in a predetermined number (assumed as x) of stages are contained in the active period of external clock signal Ext.CLK. In order to locate all the outputs of inverter circuits Inv.1–Inv.x at the predetermined number of stages within the active period of external clock signal Ext.CLK, it is necessary to increase the value of current supplied to delay circuit 110.

For example, it is assumed that the currents of inverter circuits Inv.1–Inv.n in delay circuit 110 in the free-run state are supplied from internal constant current sources of z in number. In FIG. 16a, the output signals of y inverter circuits among the predetermined number (x) of inverter circuits correspond to the active period of external clock signal Ext.CLK. Therefore, assuming that the delay time of each inverter circuit is nearly proportional to the supplied current value, it is required to satisfy only the following relationship in order to locate the output signals of x inverter circuits Inv.x within the active period of external clock signal Ext.CLK.

$$y \cdot [z+(x-y) \cdot z/\alpha]/z=x \quad (1)$$

where $z/\alpha$ represents a ratio of the current value of each internal constant current source included in variable constant-current source 142 with respect to the current value of the internal constant current source included in constant current source 146 for free-run.

A certain margin may be given to the number of inverter circuits to be fitted with respect to external clock signal Ext.CLK as described above. More specifically, as shown in FIG. 16b, the inverter circuits at x stages may be constructed to have a margin of one or two stages after completion of fitting of Inv.1–Inv.x to external clock signal Ext.CLK in order to prevent malfunction of entire delay circuit 110 for internal clock signal int.CLK, even when the state of fitting of delays by inverter circuits Inv.1–Inv.x with respect to external clock signal Ext.CLK has an error of one or two stages.

Owing to the above structure, select/determination circuit 170 can start the operation of issuing constant current source switch signal SC, which controls variable constant-current source circuit 140, for performing synchronization with external clock signal Ext.CLK after expiration of the active period of external clock signal Ext.CLK, i.e., expiration of half the cycle of the same. Therefore, it is possible to issue internal clock signal int.CLK synchronized with external clock signal Ext.CLK with a reduced number of clocks.

Figure 17:
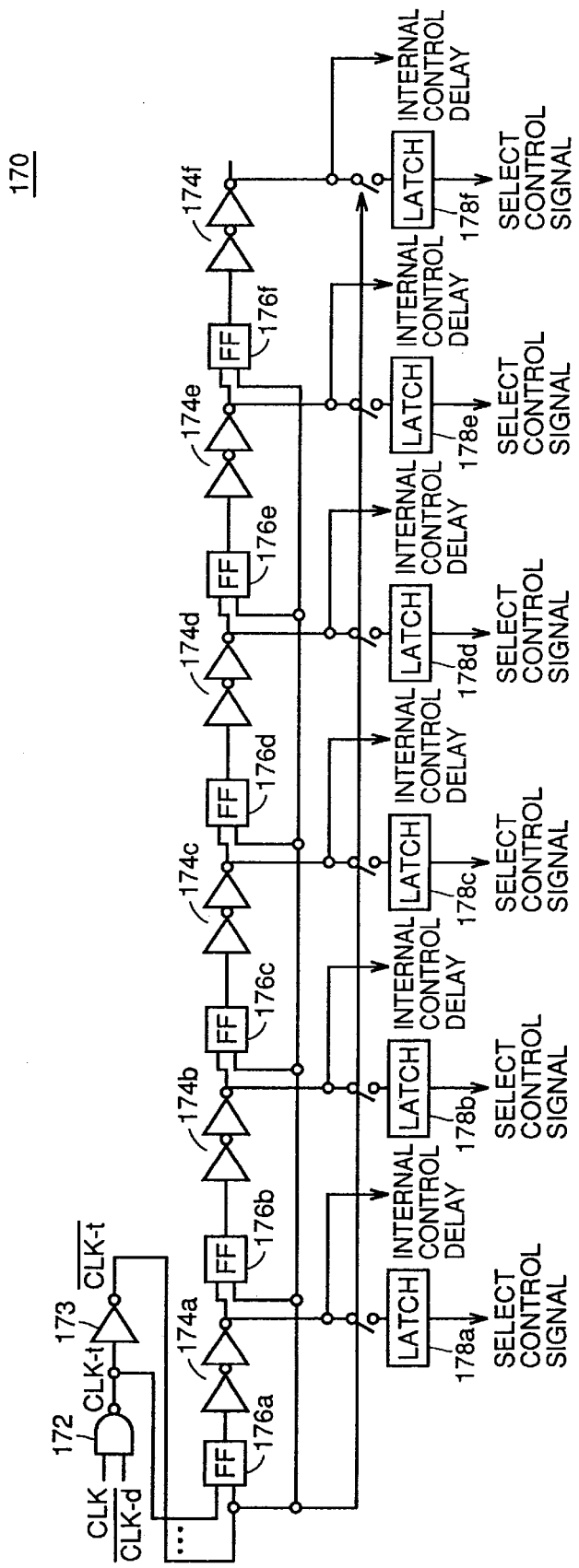
FIG. 17 is a schematic block diagram showing a structure of the select/determination circuit 170.

FIG. 17 is a schematic block diagram showing an example of a major circuit portion in select/determination circuit 170, which determines the number of stages of inverter circuits Inv.1–Inv.n having a degree of delay, which can be present within the active period of external clock signal Ext.CLK.

Thus, select/determination circuit 170 includes an NAND circuit 172, which receives internal clock signal int.CLK and an inverted signal /CLK-d of a signal CLK-d prepared by delaying internal clock signal int.CLK by a predetermined time during the active period ("H" level period) of external clock signal Ext.CLK, and issues a signal CLK-t, an inverter circuit 173 which receives signal CLK-t and issuing inverted signal /CLK-t thereof, a flip-flop circuit 176a, which issues an output to be reset in response to "H" level of signal /CLK-t and receives signal CLK-t as a set signal, a delay stage 174a, which receives an output of flip-flop circuit 176a and delays the same by a predetermined time to produce an output, and a latch circuit 178a receiving the output of delay stage 174a via a switch, which is turned on in response to "H" level of signal /CLK-t, and holding the value of the same.

Select/determination circuit 170 further includes a flip-flop circuit 176b receiving the output of delay stage 174a, and a delay stage 174b receiving the output of flip-flop circuit 176b, and also includes flip-flop circuits 176c–176f and delay stages 174c–174f, which are arranged alternately and connected in series. Flip-flop circuits 176b–176f issue outputs, of which levels are reset in response to "H" level of signal /CLK-t, similarly to flip-flop circuit 176a. The outputs of delay stages 174b–174f are connected to latch circuits 178b–178f via switch circuits, which are turned on in response to the "H" level of signal /CLK-t, respectively, similarly to the output of delay stage 174a.

In FIG. 17, the flip-flop circuits of seven in number and the delay stages of seven in number are arranged alternately. In practice, flip-flop circuits and delay stages, of which numbers corresponding to the number of stages of inverter circuits Inv.1–Inv.n forming delay circuit 110 are connected in series.

In order to achieve such a structure that the structure receives internal clock signal int.CLK only during a period of "H" level of external clock signal Ext.CLK, inputs of NAND circuit 172 may be connected to an output of an AND circuit, which receives external clock signal Ext.CLK and internal clock signal int.CLK, and an output of a delay circuit, which receives and delays the output of this AND circuit by a predetermined time for outputting the same after inverting the delayed output.

Figure 18:
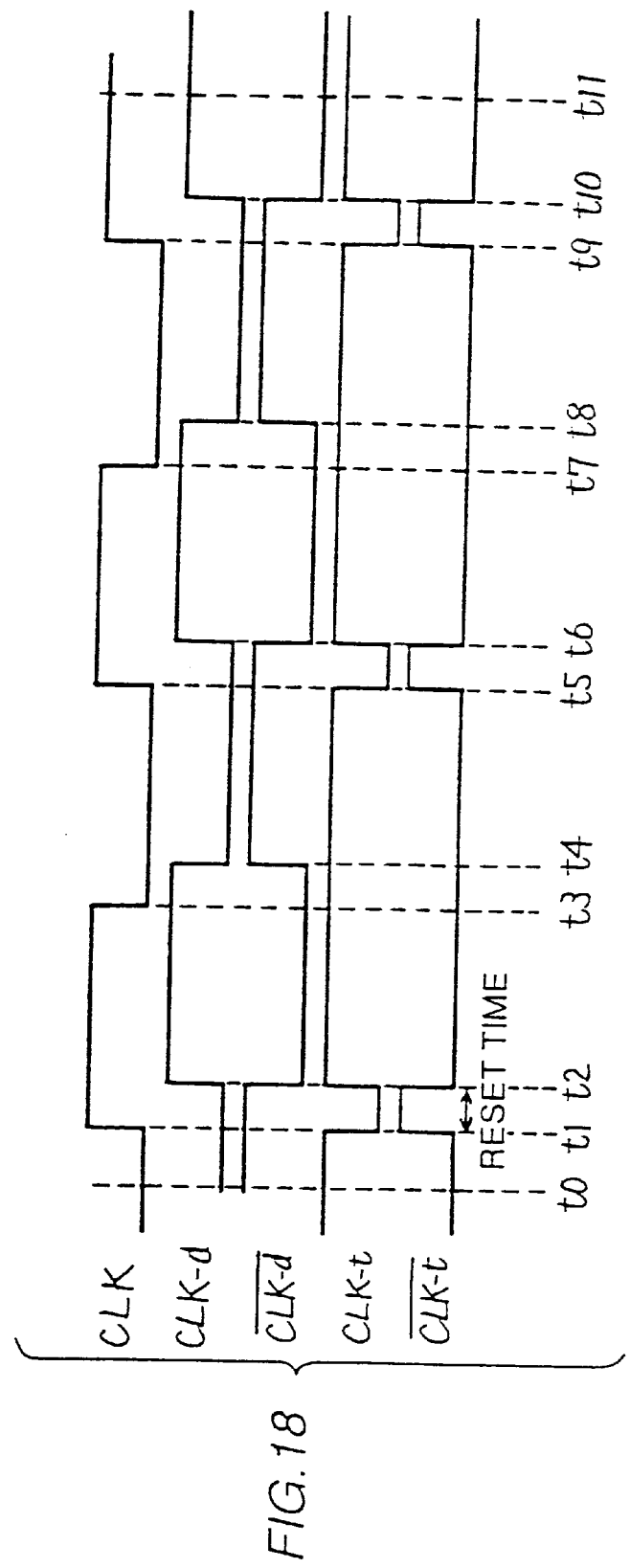
FIG. 18 is a timing chart showing an operation of the select/determination circuit 170.

FIG. 18 is a timing chart showing an operation of the circuits shown in FIG. 17. In the following description, it is assumed that external clock signal Ext.CLK is active, and internal clock signal int.CLK is supplied to the circuits shown in FIG. 17.

During a period between times t1 and t2, i.e., after internal clock signal int.CLK attains "H" level and before the level of signal /CLK-d changes from "H" to "L", signal /CLK-t is at "H" level, and all the outputs of flip-flop circuits 176a–176f are at the reset level, i.e., "L" level.

Thereafter, the output level of flip-flop circuit 176a changes into "H" level in response to the state that signal CLK-t is at "H" level and signal /CLK-t is at "L" level.

At time t5, i.e., in response to rising at the second cycle of internal clock signal int.CLK, signal /CLK-t attains "H" level, and the output levels of flip-flop circuits 176a–176f are reset.

After signal /CLK-t attains "L" level at time t6, the output of flip-flop circuit 176a attains "H" level in response to the fact that signal CLK-t is at "H" level and signal /CLK-t is at "L" level, and the output level of flip-flop circuit 176b changes into "H" level in response to the fact that the output of delay stage 174a is at "H" level and signal /CLK-t is at "L" level. Therefore, latch circuit 178a holds the signal at "H" level in response to the fact that the switch circuit is turned on during a period of "H" level of signal /CLK-t between times t5 and t6.

Thereafter, operations are performed similarly, and more specifically, latch circuits 178a and 178b hold "H" level in response to "H" level of signal /CLK-t during a period between times t9 and t10. After time t10, the output of flip-flop circuit 176c is at "H" level. More specifically, in response to change of internal clock signal int.CLK at the third cycle, the outputs of flip-flop circuits 176a to 176c attain "H" level, and the outputs of flip-flop circuit 176d . . . other than the above attains "L" level.

However, at time t10, only the potential levels held by latch circuits 178a and 178b are at "H" level, and the potential levels held by latch circuits 178a–178f change in accordance with the number of cycles of internal clock signal int.CLK contained in a period between times t1 and t11.

In response to "L" level of external clock signal Ext.CLK, input of internal clock signal int.CLK to the circuits shown in FIG. 17 stops, and thereby data in latch circuits 178a–178f will not change thereafter.

Select/determination circuit 170 issues constant current source switch signal CS, which is based on the formula (1), in accordance with data held in latch circuits 178a–178f.

The structure shown in FIG. 17 serially receives internal clock signal int.CLK while external clock signal Ext.CLK is active, and stores the number of cycles at which internal clock signal int.CLK changes during the active period of external clock signal Ext.CLK. However, the select/determination circuit is not restricted to this structure and may employ, for example, the following structure. The structure is provided with a circuit, which receives the outputs of inverter circuits Inv.1–Inv.n in parallel via gate circuits, which are open during the active period of external clock signal Ext.CLK, and detects change in the received output level of each inverter circuit Inv.i for holding the same, whereby the structure detects the number of stages of inverter circuits having a delay time containable within the active period of external clock signal Ext.CLK based on the signals sent in parallel from inverter circuits Inv.1–Inv.n forming the delay circuit 110.

Embodiment 6

Figure 19:
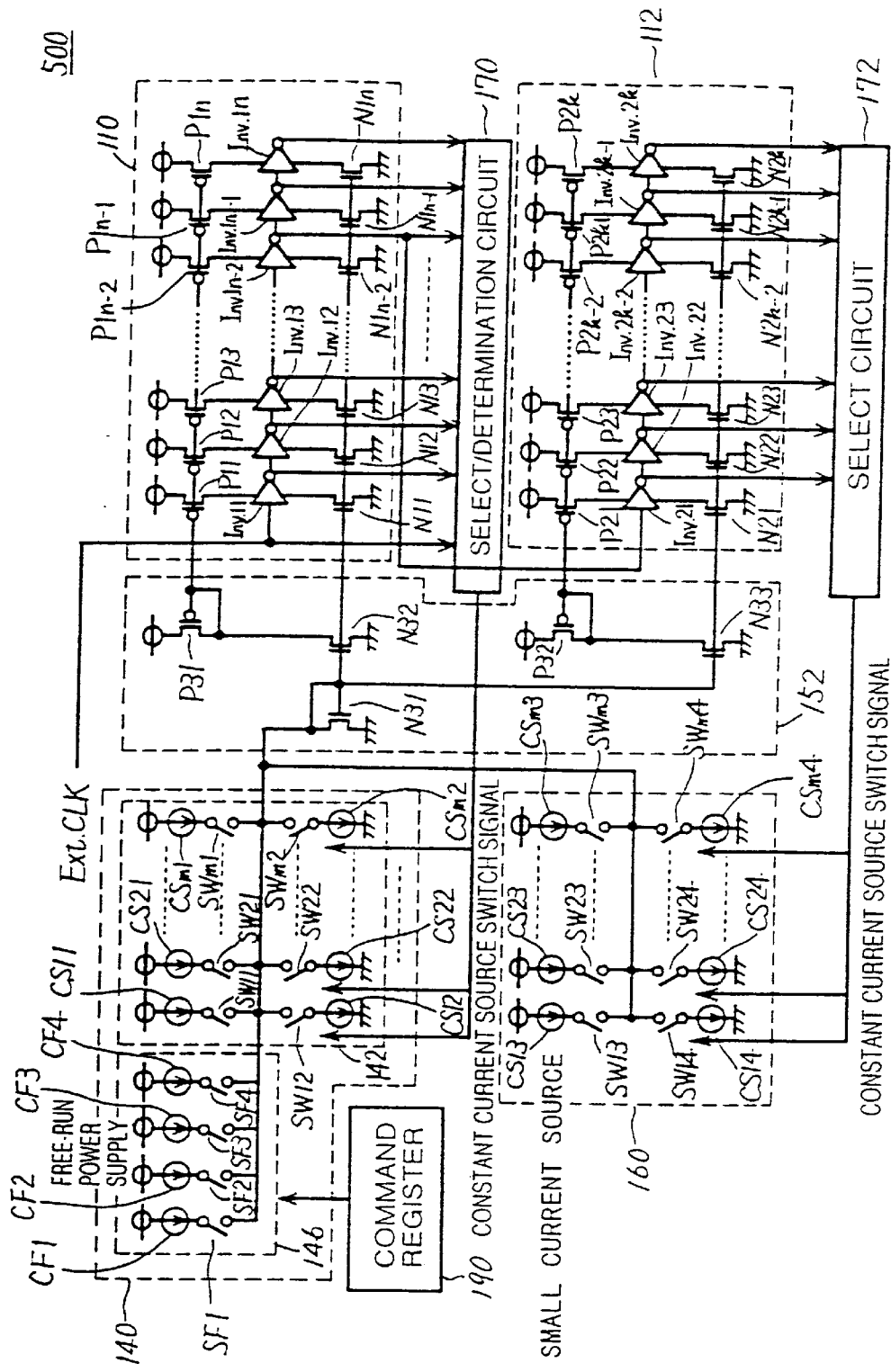
FIG. 19 is a schematic block diagram showing a structure of an internal synchronous signal generating circuit 500 of an embodiment 6 of the invention.

FIG. 19 is a schematic block diagram showing a structure of internal synchronous signal generating circuit 500 of an embodiment 6 of the invention.

It differs from internal synchronous signal generating circuit 400 of the embodiment 5 in that internal synchronous signal generating circuit 500 of the embodiment 6 includes a second delay circuit 112 including cascade-coupled inverter circuits Inv.21–Inv.2k, which receive the outputs of a predetermined number of inverter circuits (e.g., inverter circuits Inv.1n-1) contained in delay circuit 110, and delay the received outputs for outputting the same, a selector circuit 172, which receives external clock signal Ext.CLK and the output of second delay circuit 112, and detects the number of stages of inverter circuits Inv.21–Inv.2k having a delay time containable within the active period of external clock signal Ext.CLK, a second variable constant-current source circuit 160, which additionally supplies a constant current to output node 140a of first variable constant-current source circuit 140 in accordance with a constant current source switch signal CS2 sent from selector circuit 172, and a delay control circuit 152, which controls degrees of delays of first and second delay circuits 110 and 112 in accordance with the value of constant current supplied to output node 140a.

It is assumed that an internal constant current source included in second variable constant-current source circuit 160 supplies the current of a smaller value than that by an internal constant current source circuit included in first variable constant-current source circuit 140.

Accordingly, by controlling second variable constant-current source circuit 160, it is possible to control more finely the value of constant current applied to an output node 160a.

The value of constant current applied to output node 140a controls the values of currents flowing through n-channel MOS transistors N21–N2k, which have gates each connected to a gate of n-channel MOS transistor N33 forming a current mirror circuit together with n-channel MOS transistor N31, and are connected between inverter circuits Inv.21–Inv.2k and ground potential GND, respectively.

A p-channel MOS transistor P32 has a gate electrode, which is connected to a gate of p-channel MOS transistor P21 connected between inverter circuit Inv.21 and power supply potential Vcc, a source connected to power supply potential Vcc and a drain, which is connected to a drain of n-channel MOS transistor N33 and is also connected to the gate of the same transistor. This p-channel MOS transistor P32 and p-channel MOS transistor P21 form a current mirror circuit. Therefore, the current supplied to output node 140a also controls the value of current supplied to inverter circuit Inv.21. Likewise, p-channel MOS transistors P22–P2k, which are connected between inverter circuits Inv.22–Inv.2k and power supply potential Vcc, respectively, have gates connected to the gate of p-channel MOS transistor P32. Therefore, the current supplied to output node 140a further controls the value of current supplied to inverter circuits Inv.22–Inv.2k.

FIGS. 20a and 20b are timing charts showing an operation of internal synchronous signal generating circuit 500 shown in FIG. 19. FIG. 20a is a timing chart similar to FIG. 16a, and particularly shows an operation of select/determination circuit 170, which compares delay times of respective inverter circuits Inv.11–Inv.1n included in delay circuit 110 with external clock signal Ext.CLK in the free-run state, and FIG. 20b is a timing chart showing more fine control of synchronization of internal clock signal int.CLK with external clock signal Ext.CLK, which is performed by adjusting the degrees of delays of inverter circuits Inv.21–Inv.2k forming delay circuit 112 by selector circuit 172 after changing the values of currents, which are to be supplied to inverter circuits Inv.11–Inv.1n forming delay circuit 110, based on the formula (1) in accordance with the result of comparison shown in FIG. 20a.

Referring first to FIG. 20a, it is assumed that inverter circuits Inv.11–Inv.1n forming delay circuit 110 is supplied with the constant current for free run in the initial state. When external clock signal Ext.CLK is externally supplied during standby, i.e., in this state, rising of external clock signal Ext.CLK triggers delay circuit 110 to start its operation. Delay circuit 110 issues the outputs of inverter circuits Inv.11–Inv.1n contained therein to select/determination circuit 170, where these outputs and supplied external clock signal Ext.CLK are compared. During a period that external clock signal Ext.CLK is active, the number of inverter circuits containable within this period are counted. Based on the counted number, such an operation is performed in the next cycle that the value of constant current supplied to output node 140a is controlled, based on the formula (1), to locate the outputs of a predetermined number of inverter circuits within the active period of external clock signal Ext.CLK.

In internal synchronous signal generating circuit 500, the variable constant-current source supplying the constant current to output node 140a have a hierarchical structure for further improving the synchronization accuracy. In the example shown in FIG. 19, the output of last second inverter circuit Inv.1n-1 among the inverter circuits forming delay circuit 110 forms an input signal to second delay circuit 112. Therefore, second delay circuit 112 is activated in such a case that the output of inverter circuit Inv.1n-2 was not contained within this active period in the first cycle of external clock signal Ext.CLK shown in FIG. 20a, but is contained within the active period in the next cycle of external clock signal Ext.CLK shown in FIG. 20b. Similarly to the delay circuit 110, the respective output levels of inverter circuits Inv.21–Inv.2m forming second delay circuit 112 are monitored by selector circuit 172 during the active period of external clock signal Ext.CLK. As a result, the output current of second variable constant-current source 160 is controlled so that the output signal from second delay circuit 112 may be present within the active period of external clock signal Ext.CLK.

Owing to the above structure, internal synchronous signal generating circuit 500 can issue internal clock signal int.CLK which is synchronized more precisely with external clock signal Ext.CLK.

Embodiment 7

Figure 21:
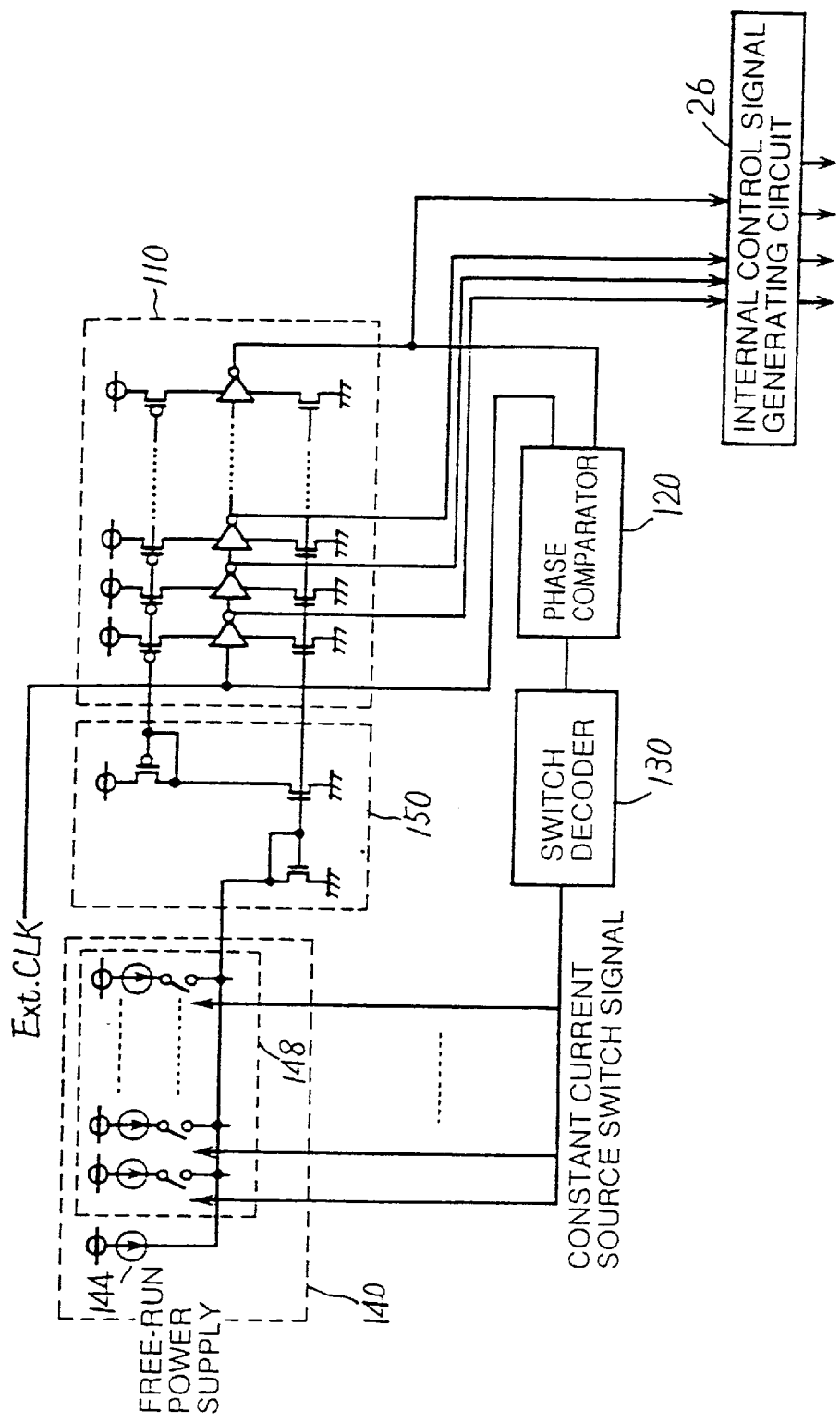
FIG. 21 a schematic block diagram showing a structure of an internal synchronous signal generating circuit 600 of an embodiment 7 of the invention.

FIG. 21 is a schematic block diagram showing a structure of internal synchronous signal generating circuit 600 of an embodiment 7 of the invention.

This circuit differs from internal synchronous signal generating circuit 100 of the embodiment 1 in the following two points.

First, internal control signal generating circuit 26 receives delay signals, which are sent from inverter circuits Inv.1–Inv.n forming delay circuit 110, respectively, to issue corresponding internal control signals.

Second, control is performed to change the value of current supplied to output node 140a from variable constant-current source circuit 140 only into higher values.

More specifically, internal control signal generating circuit 26 generates the internal control signals based on the delay signals which are issued from inverter circuits Inv.1–Inv.1n forming delay circuit 110, respectively. Therefore, the internal control signals can be issued with a circuit structure simpler than that of internal control signal generating circuit 26 shown in FIG. 5.

When the active period of external clock signal Ext.CLK is longer than the delay time of delay circuit 110 in the free-run state, the value of constant current supplied from variable constant-current source circuit 140 does not decrease below the value of current supplied from free-run current source 144. Therefore, internal synchronous signal generating circuit 600 operates in the free-run state.

In this case, as already described with reference to FIG. 11, it is possible to achieve the operation synchronized with external clock signal Ext.CLK. Therefore, variable constant-current source circuit 140 can have a further simplified structure.

In the above structure, internal control signal generating circuit 26 issues the internal control signals based on the delay signals which are issued from inverter circuits Inv.1–Inv.n forming delay circuit 110, respectively. This structure may be applied to the internal synchronous signal generating circuits of the other embodiments already described.

Embodiment 8

Figure 22:
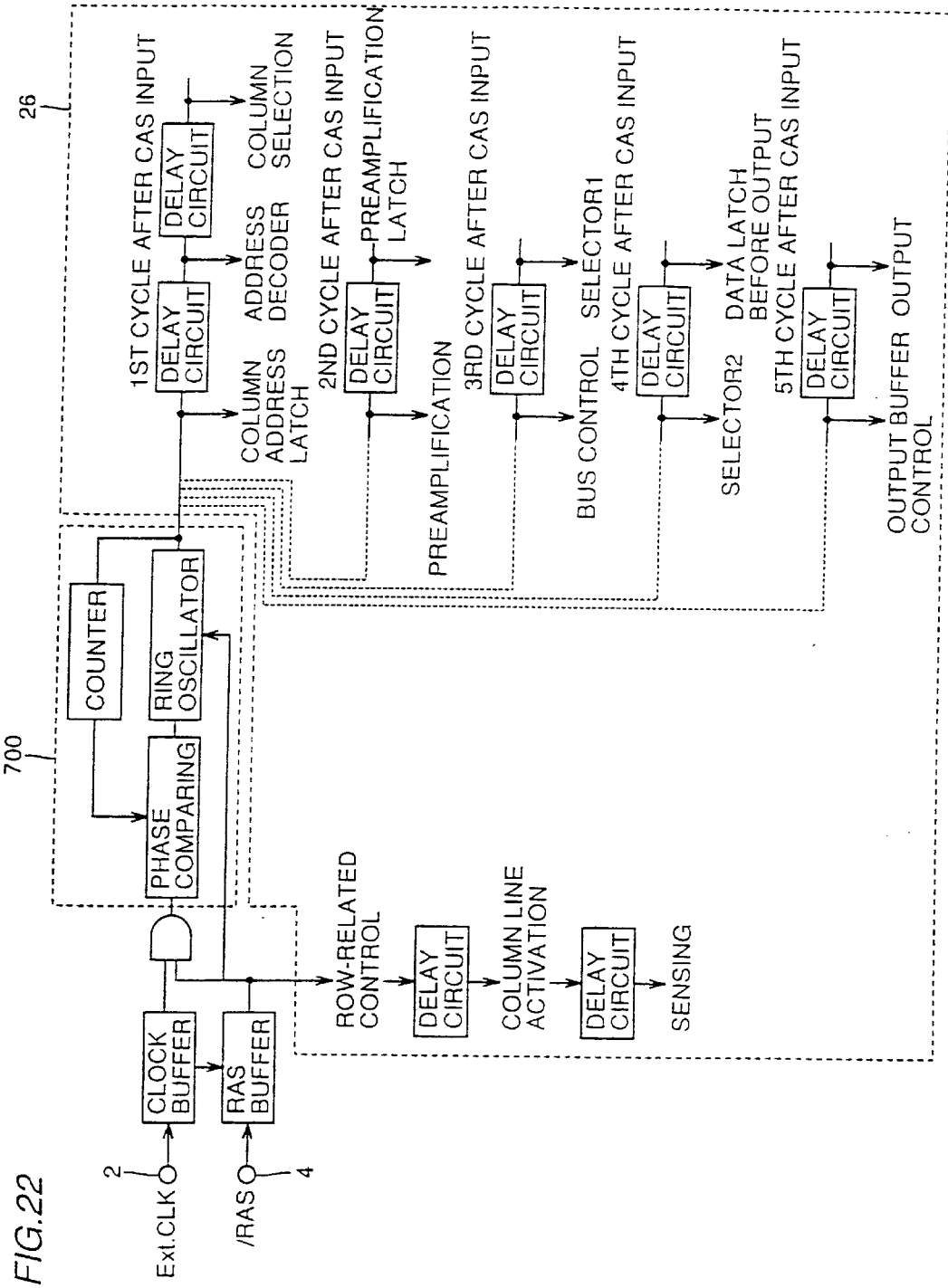
FIG. 22 is a schematic clock diagram showing structures of an internal synchronous signal generating circuit 700 and internal control signal generating circuit 26 of an embodiment 8 of the invention.

FIG. 22 is a schematic block diagram showing structures of an internal synchronous signal generating circuits 700 and internal control signal generating circuit 26 of an embodiment 8 of the invention.

The structure of internal synchronous signal generating circuit 700 of the embodiment 8 differs from the structure of internal synchronous signal generating circuit 102 of the embodiment 2 in that it receives the output signal from the ring oscillator circuit, and sends its output to the phase comparator circuit after counting the same a predetermined number of times.

Assuming that a counter circuit 702 changes its output level every time it performs counting two times, internal clock signal int.CLK sent from internal synchronous signal generating circuit 700 is equal to a signal prepared by doubling the frequency of external clock signal Ext.CLK.

Thereafter, the internal control signal generating circuit issues internal control signals after predetermined delay times set by appropriate delay circuits. This structure is similar to that of internal control signal generating circuit 26 shown in FIG. 5.

In this embodiment, however, the internal control signals issued at each cycle of internal clock signal int.CLK after activation of signal CAS are reduced in number in accordance with the fact that the frequency of internal clock signal int.CLK is several times larger than that of external clock signal Ext.CLK.

Figure 23:
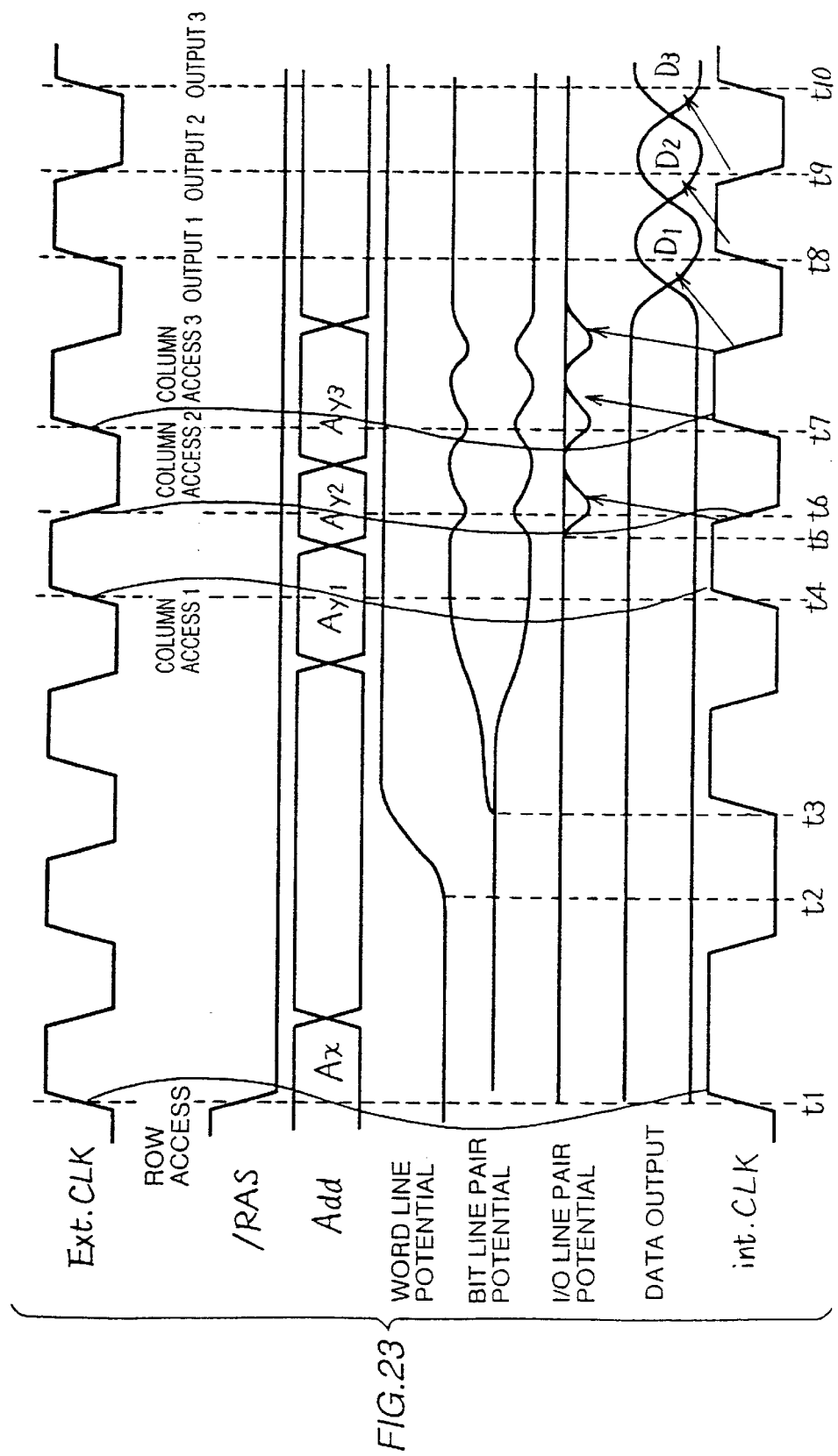
FIG. 23 is a timing chart showing an operation of the synchronous semiconductor memory device controlled by the internal synchronous signal generating circuit 700.

FIG. 23 is a timing chart showing an operation of the synchronous semiconductor memory device controlled by internal synchronous signal generating circuit 700 shown in FIG. 22.

The structure of the synchronous semiconductor memory device of this embodiment is similar to that of synchronous semiconductor memory device 1000 of the embodiment 1 except for the structure of internal synchronous signal generating circuit.

Assuming that internal synchronous signal generating circuit 700 multiplies the frequency of external clock signal Ext.CLK, e.g., by two, the synchronous semiconductor memory device performs column-related circuit operations at both the rising and falling edges of external clock signal Ext.CLK.

In response to the operation of taking the row address into row address buffer 18 at time t1, the potential level on the selected word line changes into "H" level at time t2. In response to this, the sense amplifier starts amplification of the potential difference appearing on the corresponding bit line pair.

Meanwhile, the internal synchronous signal generating circuit starts the synchronizing operation at time t1, and starts issuing of the signal synchronized with the external clock signal at time t4. In this case, the circuit takes in first column address Ay1 at time t4, i.e., at the rising edge of external clock signal Ext.CLK, takes in second column address Ay2 at time t6, i.e., at the subsequent falling edge of external clock signal Ext.CLK, and takes in third column address Ay3 at time t7, i.e., at the subsequent rising edge of external clock signal Ext.CLK.

In accordance with column address signals Ay1–Ay3 thus taken, read data D1 corresponding to column address Ay1 is issued at time t8, read data D2 corresponding to column address Ay2 is issued at time t9, and read data D3 corresponding to column address Ay3 is issued at time t10.

Figure 24A:
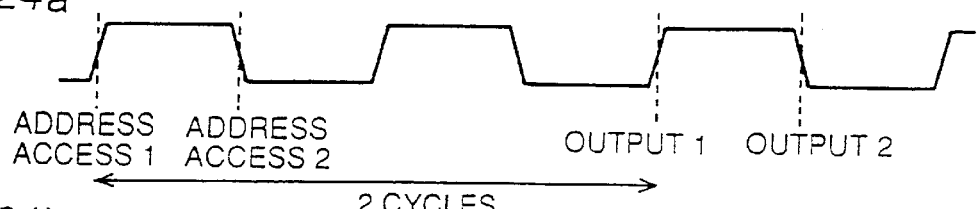
FIGS. 24a, 24b, and 24c are timing charts showing operations of the synchronous semiconductor memory device shown in FIG. 23 with cycles of ⅓, ½ and ¼ of a cycle of a predetermined external clock signal, respectively.
Figure 24B:
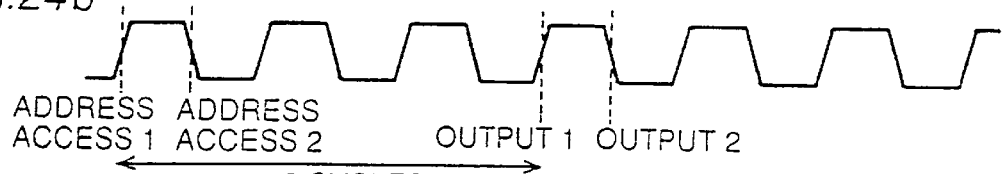
Figure 24C:
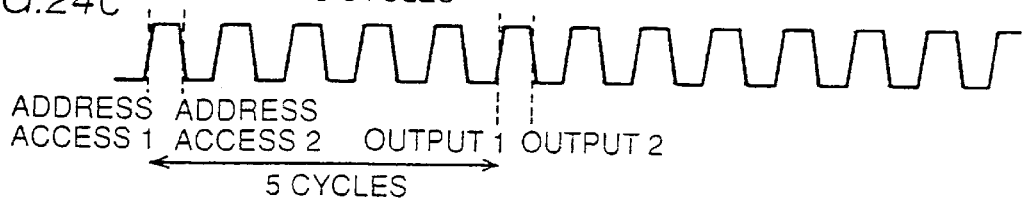

FIGS. 24*a*, 24*b* and 24*c* are timing charts showing an operation of the synchronous semiconductor memory device with various frequencies of external clock signal Ext.CLK, and corresponding to FIGS. 9*a*, 9*b* and 9*c*.

In FIG. 24*a*, data is issued after two cycles from address access with external clock signal Ext.CLK of a predetermined frequency. With external clock signal Ext.CLK of double the frequency in FIG. 24*a*, data is issued after three cycles from address access as shown in FIG. 24*b*. In contrast to this, data is issued after five cycles from address access, when external clock signal Ext.CLK has quadruple the frequency in FIG. 24*a*. In this case, the time from address access to data output is reduced only to an extent lower than that of reduction in frequency of external clock signal Ext.CLK, as is done in the case shown in FIGS. 9*a*, 9*b* and 9*c*. However, it can be understood that a faster operation is allowed because the data output is performed at both the rising and falling edges of external clock signal Ext.CLK.

Figure 25:
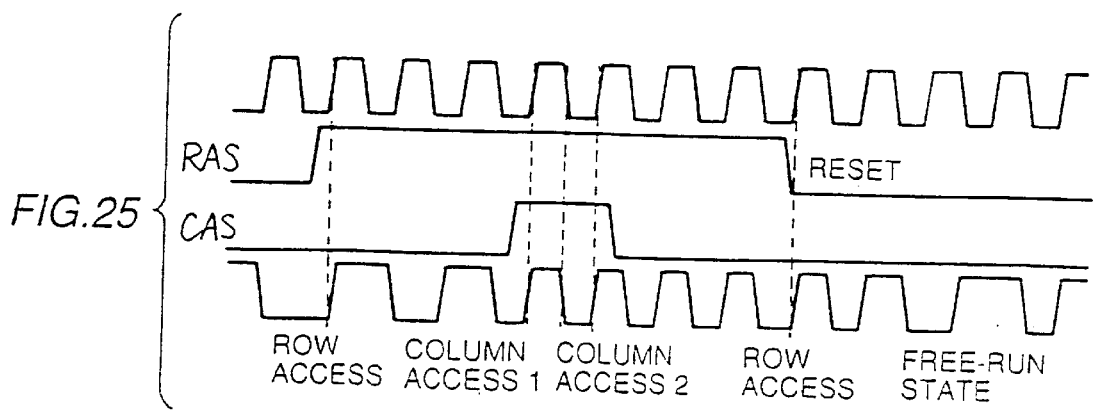
FIG. 25 is a timing chart showing an operation of the synchronous semiconductor memory device shown in FIG. 24 and particularly the operation for a longer term.

FIG. 25 is a timing chart corresponding to FIG. 10 and showing the operation of synchronous semiconductor memory device of the embodiment 8 for a longer term.

Similarly to the case already described, the ring oscillator circuit operates in a free-run state after internal row address strobe signal RAS is deactivated.

Figure 26:
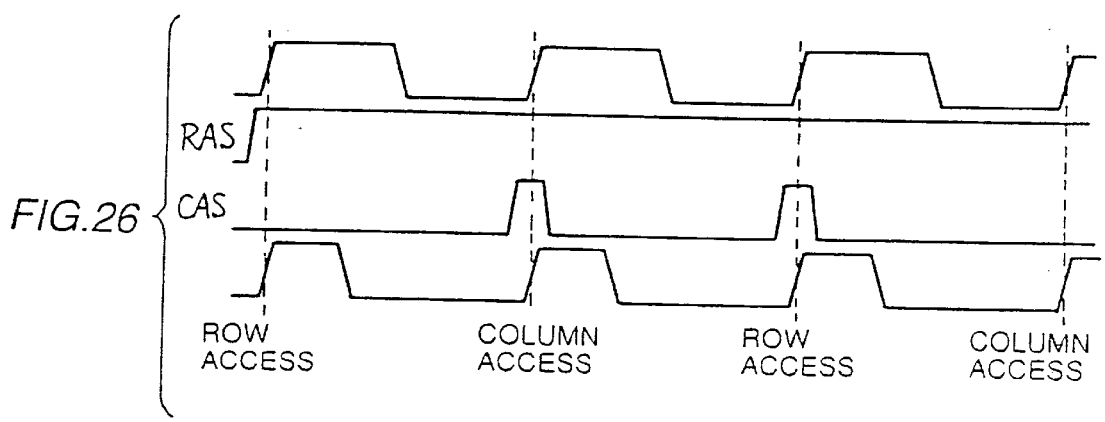
FIG. 26 is a timing chart showing an operation of the synchronous semiconductor memory device in a free-run state.

FIG. 26 is a timing chart showing an operation in the case where synchronous semiconductor memory device 700 of the embodiment 8 is formed of a DLL circuit, and in other words, counter circuit 702 counts the output of delay circuit, instead of the output of ring oscillator, and applies the same to the phase comparator. More specifically, FIG. 26 corresponds to FIG. 11, and shows the operation performed when external clock signal Ext.CLK has a sufficiently long cycle, and internal clock signal int.CLK is operating in the free-run state.

Similarly to the embodiment already described, the synchronous semiconductor memory device of the embodiment 8 can perform synchronization in the free-run state when external clock signal Ext.CLK has a sufficiently long cycle.

Embodiment 9

Figure 27:
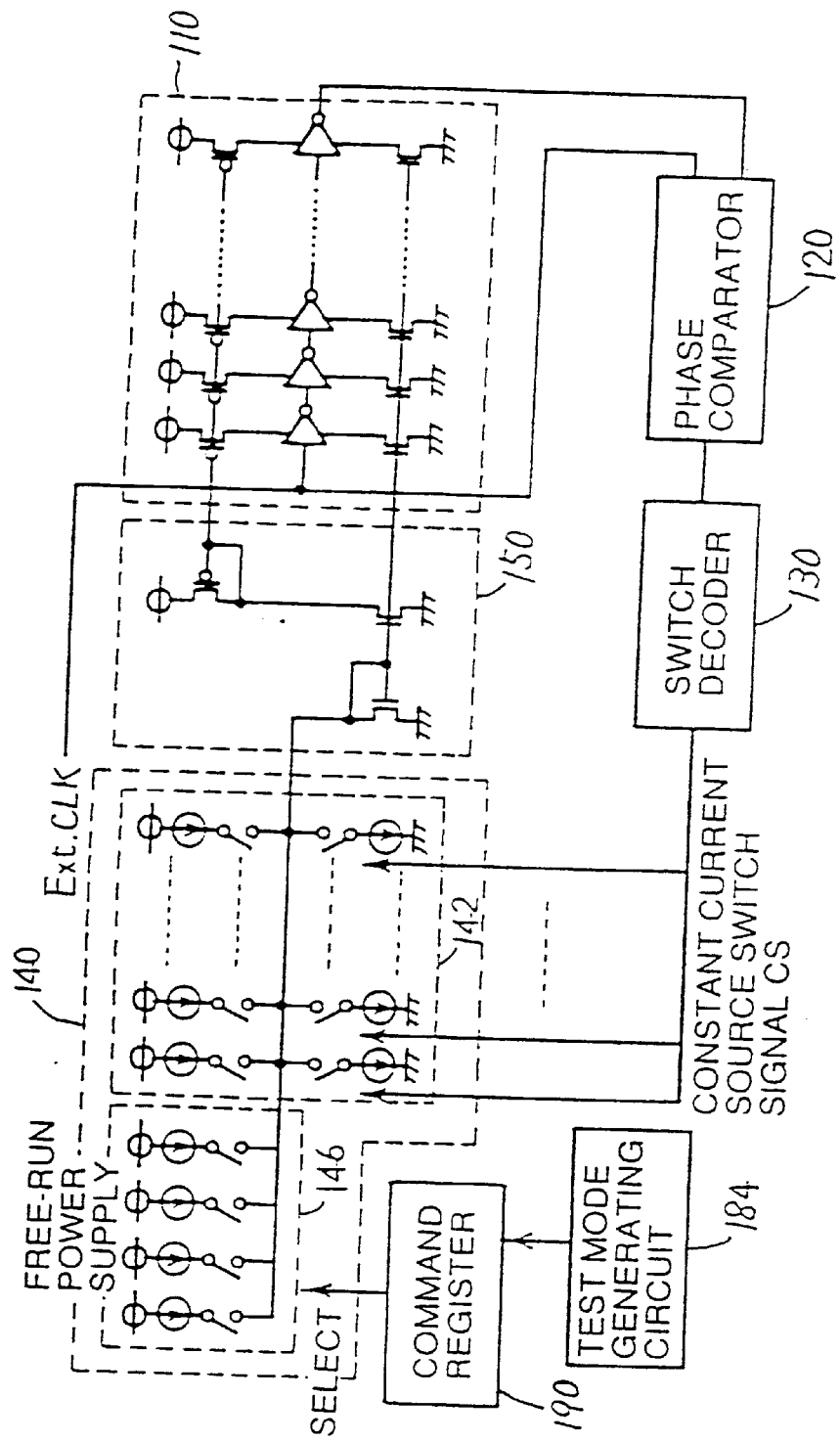
FIG. 27 is a schematic block diagram showing a structure of an internal synchronous signal generating circuit 720a of an embodiment 9 of the invention.

FIG. 27 is a schematic block diagram showing a structure of an internal synchronous signal generating circuit 720*a* of the embodiment 9 of the invention.

The structure of internal synchronous signal generating circuit 720*a* differs from that of internal synchronous signal generating circuit 200 of the embodiment 3 in that, when an externally applied control signal designates a test mode, a test mode generating circuit 184 sets the latency data in command register 190 to a predetermined value, whereby the degree of delay of delay circuit 110 in the free-run state is controlled.

By employing such a setting that the current supplied from the free-run current source minimizes the degree of delay of delay circuit 110 when the test mode is designated, the synchronous semiconductor memory device controlled by synchronous signal generating circuit 720*a* operates at the maximum speed, so that the synchronous semiconductor memory device can be tested with highest specifications.

Figure 28:
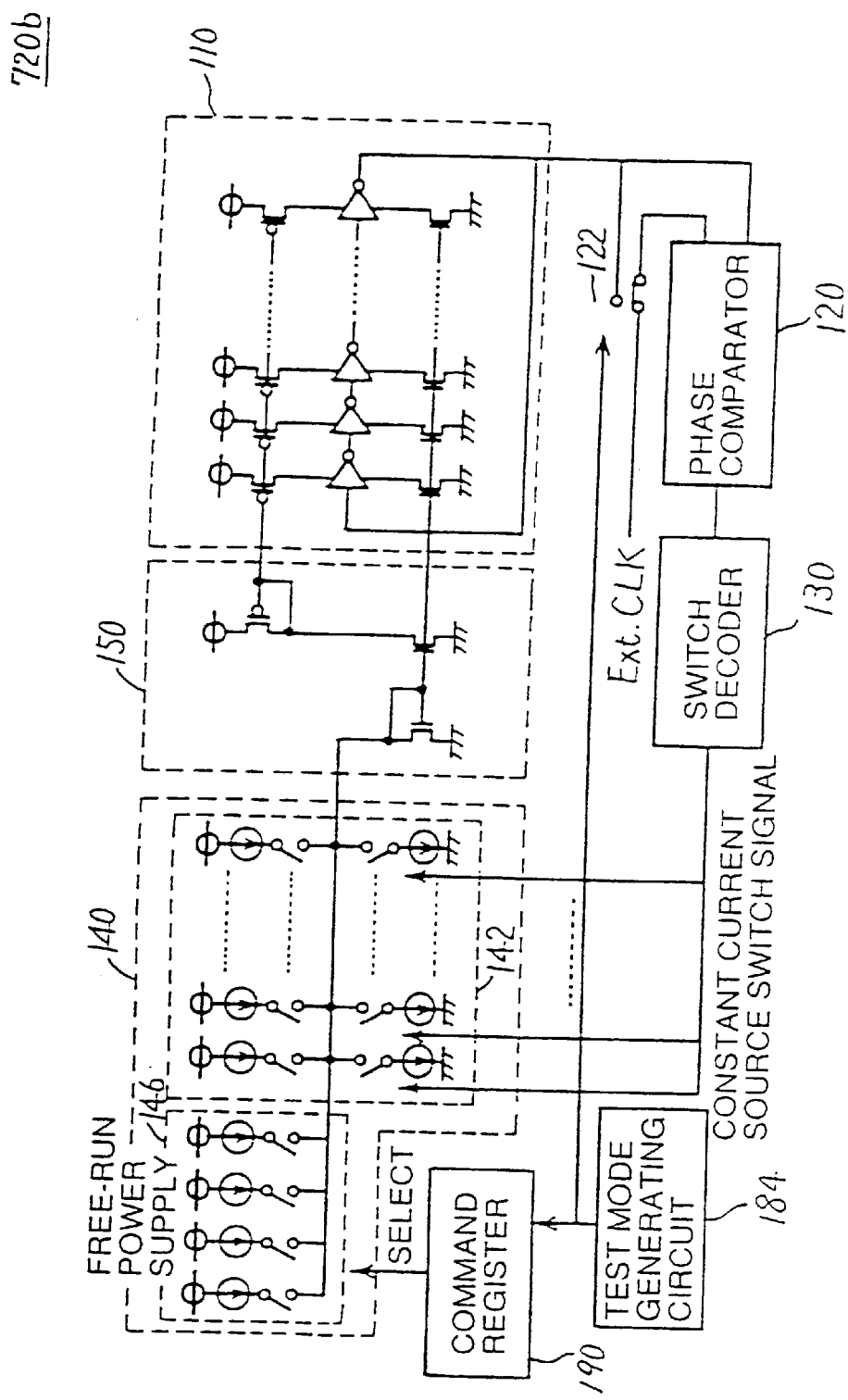
FIG. 28 is a schematic block diagram showing a structure of an internal synchronous signal generating circuit 720b which is a first modification of the internal synchronous signal generating circuit 720a of the embodiment 9.

FIG. 28 is a schematic block diagram showing a structure of an internal synchronous signal generating circuit 720*b*, which is a modification of the embodiment 9 of the invention.

It differs from internal synchronous signal generating circuit 720*a* in that an accelerated test is allowed during a test mode period.

Internal synchronous signal generating circuit 720*b* is basically formed of a PLL circuit, and can operate in such a manner that, when the test mode is externally designated, free-run current source 146 supplies a current of a value allowing the fastest operation of ring oscillator circuit 114 under the control of test mode generating circuit 184, and a switch circuit 122, which is not provided at the foregoing embodiments, is controlled by test mode generating circuit 184 to prevent supply of external clock signal Ext.CLK to phase comparator 120.

By utilizing this test mode, therefore, the synchronous semiconductor memory device can operate fast, and a sufficiently accelerated test can be performed.

Figure 29:
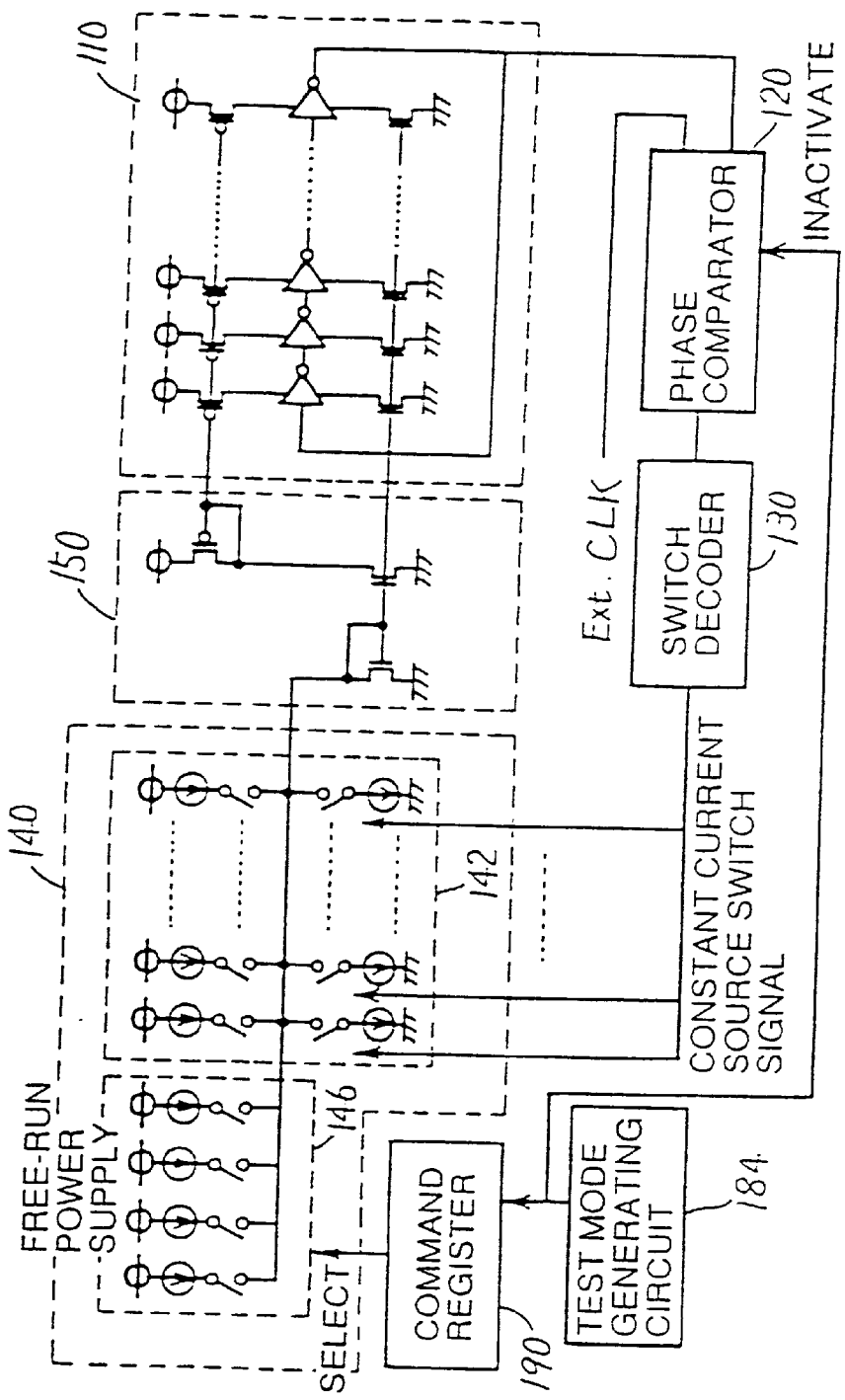
FIG. 29 a schematic block diagram showing a structure of an internal synchronous signal generating circuit 720c which is another modification of the internal synchronous signal generating circuit 720a of the embodiment 9.

FIG. 29 is a schematic block diagram showing a structure of an internal synchronous signal generating circuit 720*c* which is another modification of embodiment 9.

It differs from internal synchronous signal generating circuit 720b in that, when a predetermined test mode is designated in internal synchronous signal generating circuit 720c, phase comparator 120 is deactivated in contrast to internal synchronous signal generating circuit 720b, in which switch circuit 122 is switched to prevent supply of external clock signal Ext.CLK to phase comparator 120 when the test mode is designated.

Similarly to the foregoing structures, internal synchronous signal generating circuit 720c can operate in such a manner that, in the predetermined test mode, ring oscillator circuit 114 operates fast in accordance with the value of current applied from free-run current source 146 regardless of the cycle of external clock signal Ext.CLK, and the accelerated test of the synchronous semiconductor memory device can be performed stably.

Embodiment 10

Figure 30:
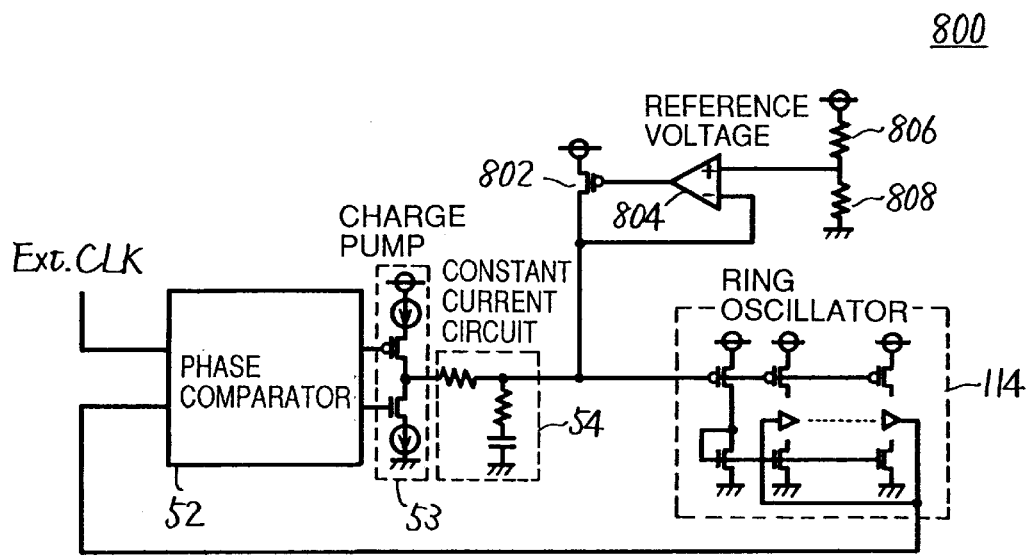
FIG. 30 is a schematic block diagram showing a structure of an internal synchronous signal generating circuit 800 of an embodiment 10 of the invention.

FIG. 30 is a schematic block diagram showing a structure of an internal synchronous signal generating circuit 800 of an embodiment 10 of the invention.

The structure thereof differs from that of the conventional internal synchronous signal generating circuit 50 in that the output node of loop filter 54 can be charged to a predetermined potential level after power-on.

Internal synchronous signal generating circuit 800 includes, in addition to the structure of conventional internal synchronous signal generating circuit 50, a differential amplifier 804, which starts operation upon power-on, and is active during "L" level of a power-on reset signal (i.e., "POR" signal) which attains "H" level upon elapsing of a predetermined period after power-on. Internal synchronous signal generating circuit 800 also includes a p-channel MOS transistor 802, which receives on its gate an output of differential amplifier 804, and is connected between power supply potential Vcc and the output node of loop filter 54, and resistors 806 and 808 for dividing power supply potential Vcc so as to produce a predetermined reference voltage to be applied to one of input nodes of differential amplifier 804. The other input node of differential amplifier 804 is connected to the output node of loop filter 54.

Figure 31:
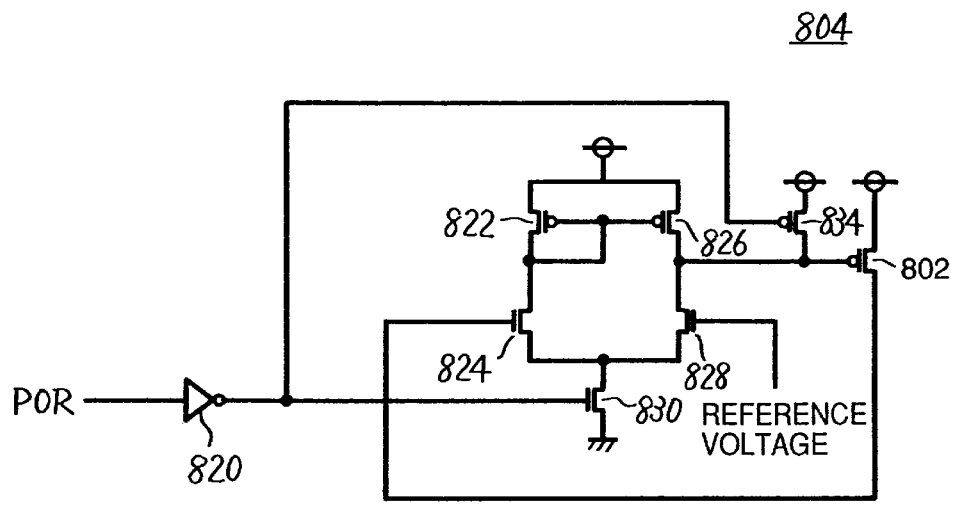
FIG. 31 is a circuit diagram showing a structure of a differential amplifier circuit 804 shown in FIG. 30.

FIG. 31 is a circuit diagram showing a structure of differential amplifier 804 more in detail.

Differential amplifier 804 includes, as its basic component, an amplifier circuit of a current mirror type formed of p-channel MOS transistors 822 and 826 and n-channel MOS transistors 824 and 828. Sources of n-channel MOS transistors 824 and 828 are connected to the ground potential via n-channel MOS transistor 830, of which gate potential is controlled by a signal prepared by inverting signal POR by an inverter circuit 820.

Therefore, while signal POR is at "L" level, n-channel MOS transistor 830 is on, and the current mirror differential amplifier is active.

One of the inputs of current mirror differential amplifier, which is formed of the gate of n-channel MOS transistor 828, is supplied with the reference voltage.

The other input of current mirror amplifier, which is formed of the gate of n-channel MOS transistor 824, is connected to the drain of p-channel MOS transistor 802, i.e., the output node of loop filter 54.

A p-channel MOS transistor 834 is connected between the output node of differential amplifier and power supply potential Vcc, and has a gate connected to the output of inverter circuit 820.

When signal POR attains "H" level, p-channel MOS transistor 834 is turned on, and the gate potential of p-channel MOS transistor 802 attains "H" level, so that p-channel MOS transistor 802 is turned off. Thus, "H" level of signal POR stops charging of the output node of loop filter 54.

Figure 32:
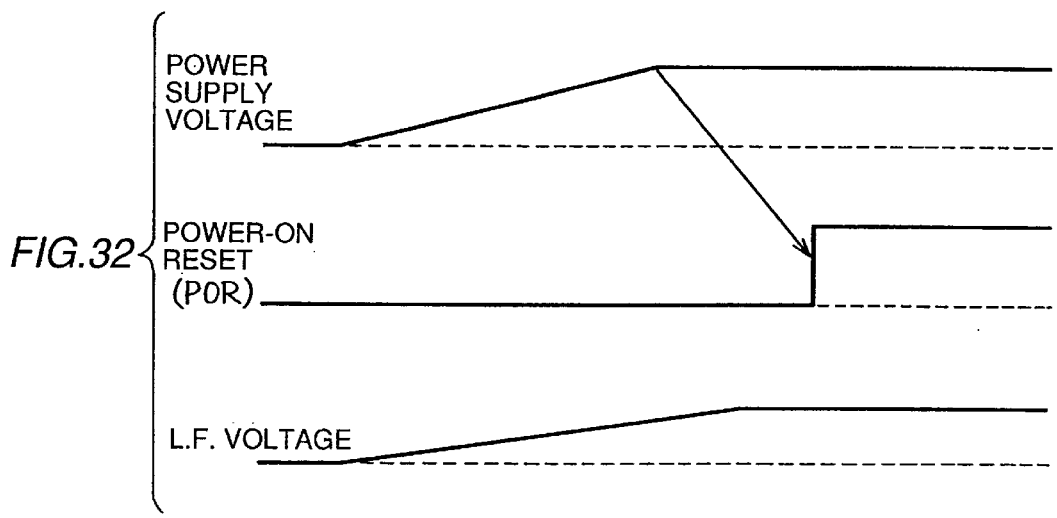
FIG. 32 is a timing chart showing an operation of the internal synchronous signal generating circuit 800.

FIG. 32 is a timing chart showing change in the loop filter potential with time.

For a predetermined period after power-on, signal POR is at "L" level. Therefore, the output node of loop filter 54 is charged to power supply potential Vcc via p-channel MOS transistor 802. Upon elapsing of the predetermined period, signal POR attains "H" level, whereby charging of the output node of loop filter 54 stops.

Figure 33:
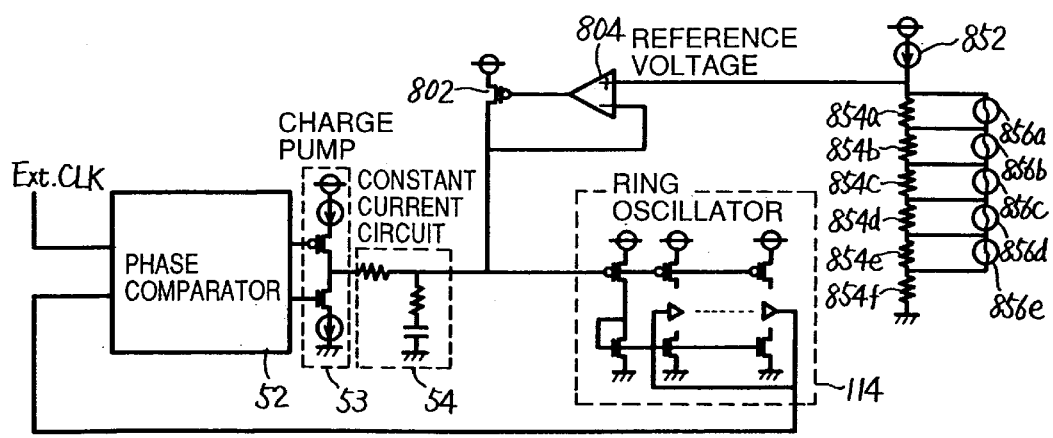
FIG. 33 is a schematic block diagram showing a structure of an internal synchronous signal generating circuit 850 which is a modification of the internal synchronous signal generating circuit 800 of the embodiment 10.

FIG. 33 is a schematic block diagram showing a structure of internal synchronous signal generating circuit 850 which is a modification of internal synchronous signal generating circuit 800 shown in FIG. 30.

It differs from internal synchronous signal generating circuit 800 in that the reference potential applied to differential amplifier 804 is variable.

The reference voltage applied to differential amplifier 804 is as follows. A reference potential generating circuit is formed of a constant current circuit 852 receiving on one of its terminals with power supply potential Vcc and resistors 854a–854f, which are connected in series between the other end of constant current circuit 852 and ground potential GND, and the reference voltage applied to differential amplifier 804 is formed of the potential on the other terminal of constant current source 852. Fuse elements 856a–856e are connected to resistors 854a–854e, respectively, and the potential level on the other terminal of constant current source 852 can be changed into an intended value by blowing out the fuse element(s).

Owing to the above structure, the output node of loop filter 54 is charged within a predetermined period after power-on, so that the predetermined potential is attained on the output node of loop filter 54 at the time of start of input of external clock signal Ext.CLK, and no time is required for charging. Therefore, it is possible to reduce a time before completion of synchronization with external clock signal Ext.CLK.

Embodiment 11

Figure 34:
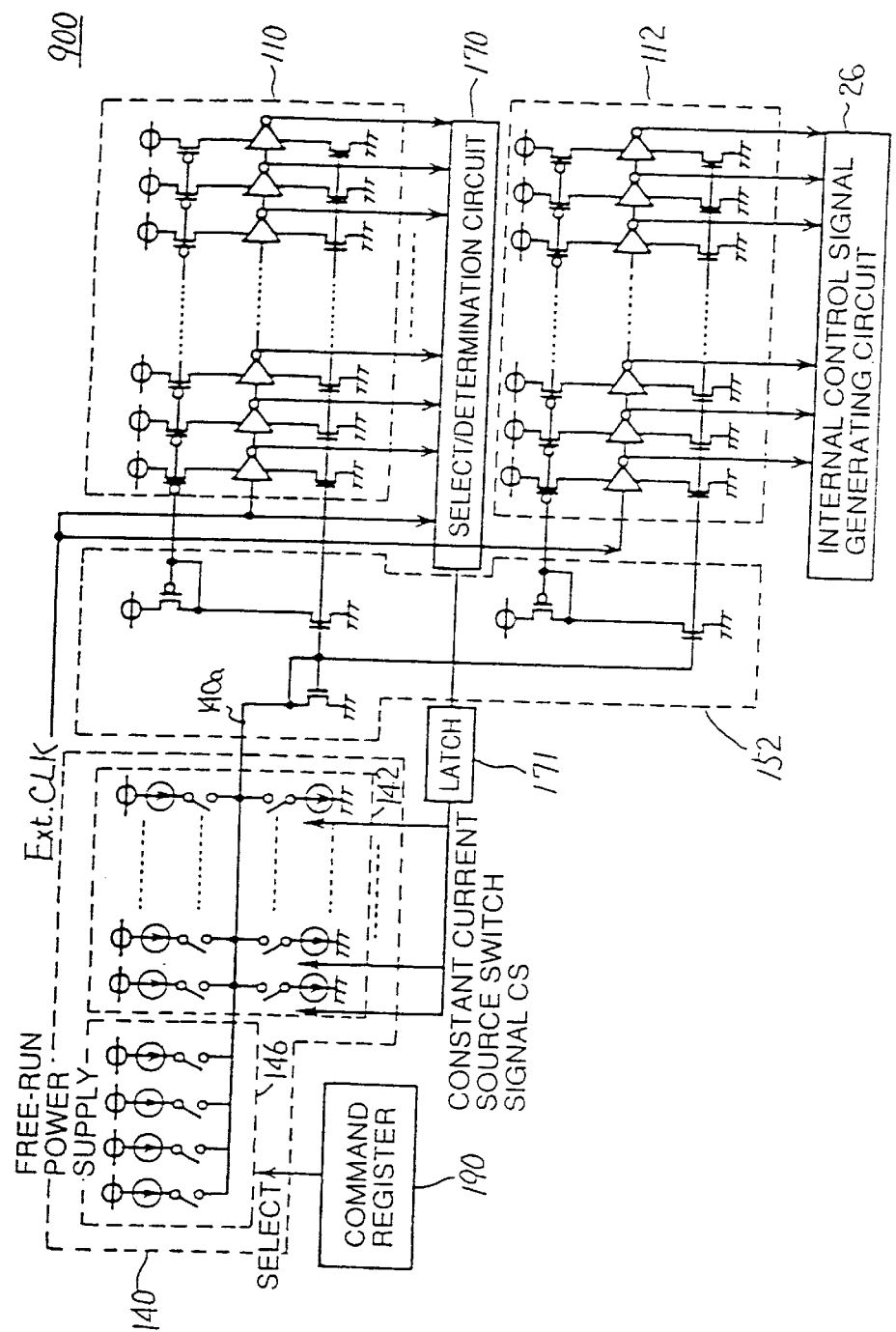
FIG. 34 is a schematic block diagram showing a structure of an internal synchronous signal generating circuit 900 of an embodiment 11 of the invention.

FIG. 34 is a schematic block diagram showing a structure of internal synchronous signal generating circuit 900 of an embodiment 11 of the invention.

The structure of internal synchronous signal generating circuit 900 differs from that of internal synchronous signal generating circuit 400 of the embodiment 5 in that there is provided a second delay circuit 112, which receives and delays external clock signal Ext.CLK by a predetermined time for outputting the same, and that the degrees of delay of first and second delay circuits 110 and 112 are controlled by delay control circuit 152 in accordance with the value of constant current, which is supplied from variable constant-current source circuit 140 in accordance with constant current source switch signal CS issued from select/determination circuit 170a in accordance with result of comparison of between the frequency of external clock signal Ext.CLK and the degree of delay of first delay circuit 110.

Further, internal control signal generating circuit 26 issues internal control signals in accordance with the received delay signals sent from the respective inverter circuits forming delay circuit 112.

Therefore, the internal synchronous signal generating circuit 900 of this embodiment and internal synchronous signal generating circuit 600 of the embodiment 7 shown in FIG. 21 have a commonality in that the internal control signals are issued based on the outputs of inverter circuits forming the delay circuits, respectively.

Figure 35:
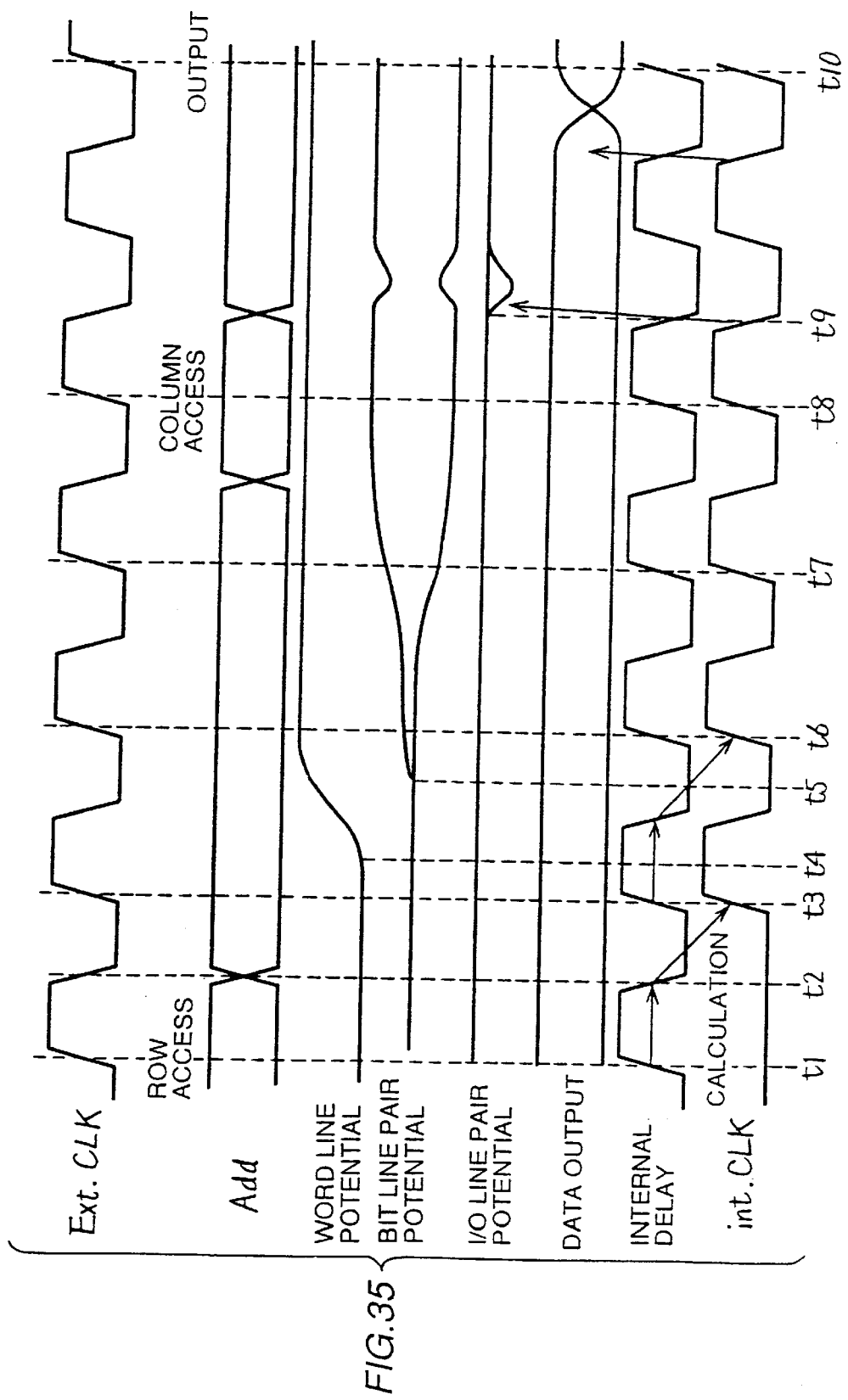
FIG. 35 is a first timing chart showing an operation of the synchronous semiconductor memory device controlled by an internal synchronous signal generating circuit 900.

FIG. 35 is a timing chart showing an operation of the synchronous semiconductor memory device controlled by internal synchronous signal generating circuit 900 of the embodiment 11.

At time t1, row address Ax is taken in, and select/determination circuit 170a makes a comparison between the degree of delay of delay circuit 110 and external clock signal Ext.CLK during one cycle of external clock signal Ext.CLK between times t1 and t3. In accordance with the result of this comparison, select/determination circuit 170a performs calculation for constant current source switch CS at the next cycle of external clock signal Ext.CLK between times t3 and t6.

Based on constant current source switch signal CS calculated at this second cycle, the output current of variable constant-current circuit 140 is adjusted, and the output of internal clock signal int.CLK synchronized with external clock signal Ext.CLK is monitored at and after time t6, i.e., the third cycle of external clock signal Ext.CLK.

At time t8, i.e., the rising edge of external clock signal Ext.CLK at the fourth cycle after taking-in of the row address at time t1, column address Ay is taken into the circuit. In response to this, read data is issued to data I/O terminal 32 at time t10 after two cycles from time t8.

FIG. 35 is a timing chart showing another operation mode of internal synchronous signal generating circuit of the embodiment 11 shown in FIG. 34.

This operation differs from that shown in FIG. 35 in that comparison between external clock signal Ext.CLK and the degree of delay of delay circuit 110 is performed during a period between times t1 and t2 corresponding to a half cycle of the first cycle, and the value of constant current source switch signal CS required for synchronization is calculated by select/determination circuit 170a during a period between times t2 and t3 corresponding to a later half of the first cycle.

Figure 36:
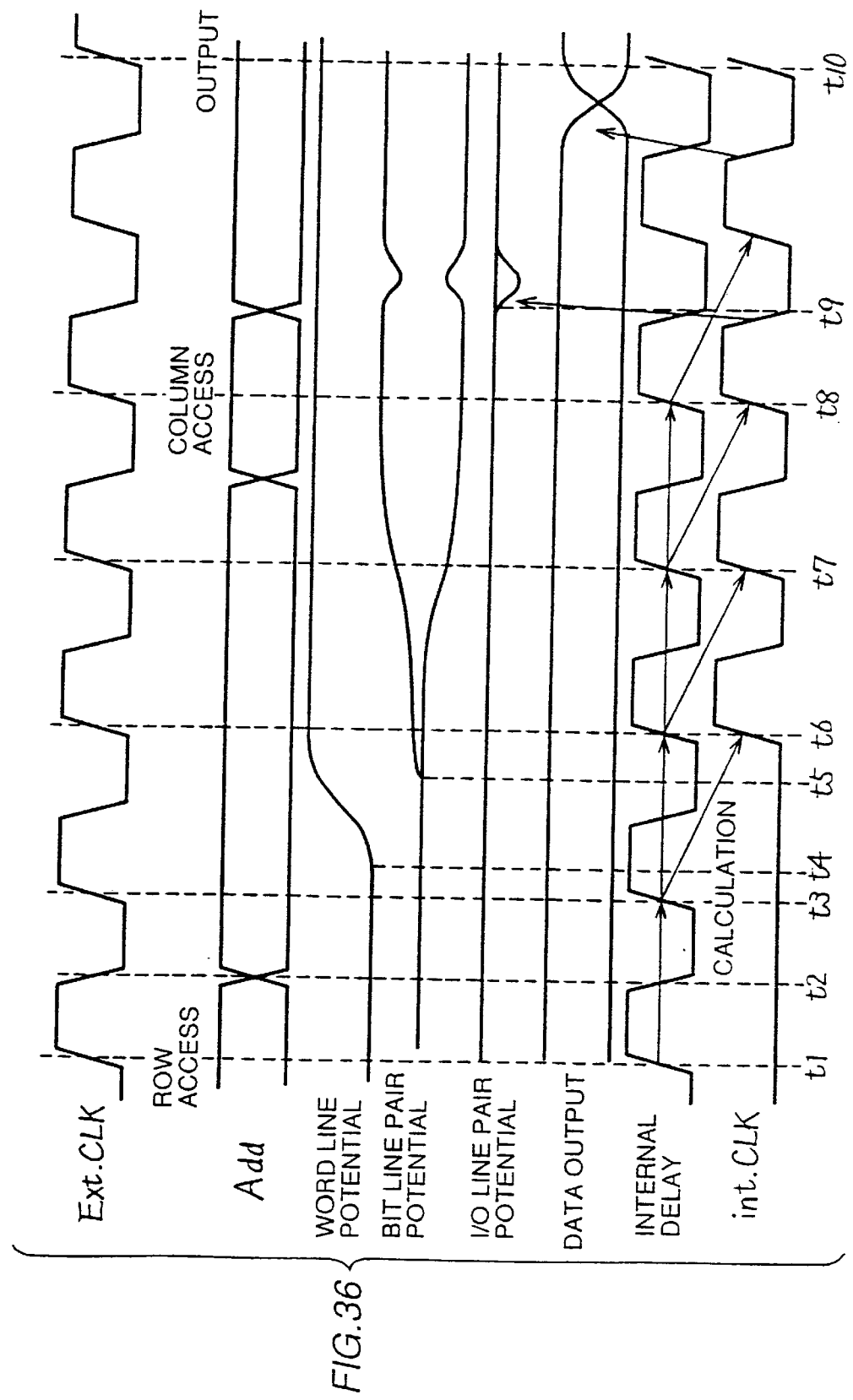
FIG. 36 is a second timing chart showing an operation of the synchronous semiconductor memory device controlled by an internal synchronous signal generating circuit 900.

Therefore, in the timing chart of FIG. 36, internal clock signal int.CLK synchronized with external clock signal Ext.CLK is issued at and after time t3, i.e., second cycle of external clock signal Ext.CLK. Other operations are similar to those in the timing chart of FIG. 35.

Owing to the operation in the timing chart of FIG. 36, internal clock signal int.CLK synchronized with external clock signal Ext.CLK can be issued at an earlier cycle, so that it is possible to provide an operation margin for a faster operation.

Embodiment 12

Figure 37:
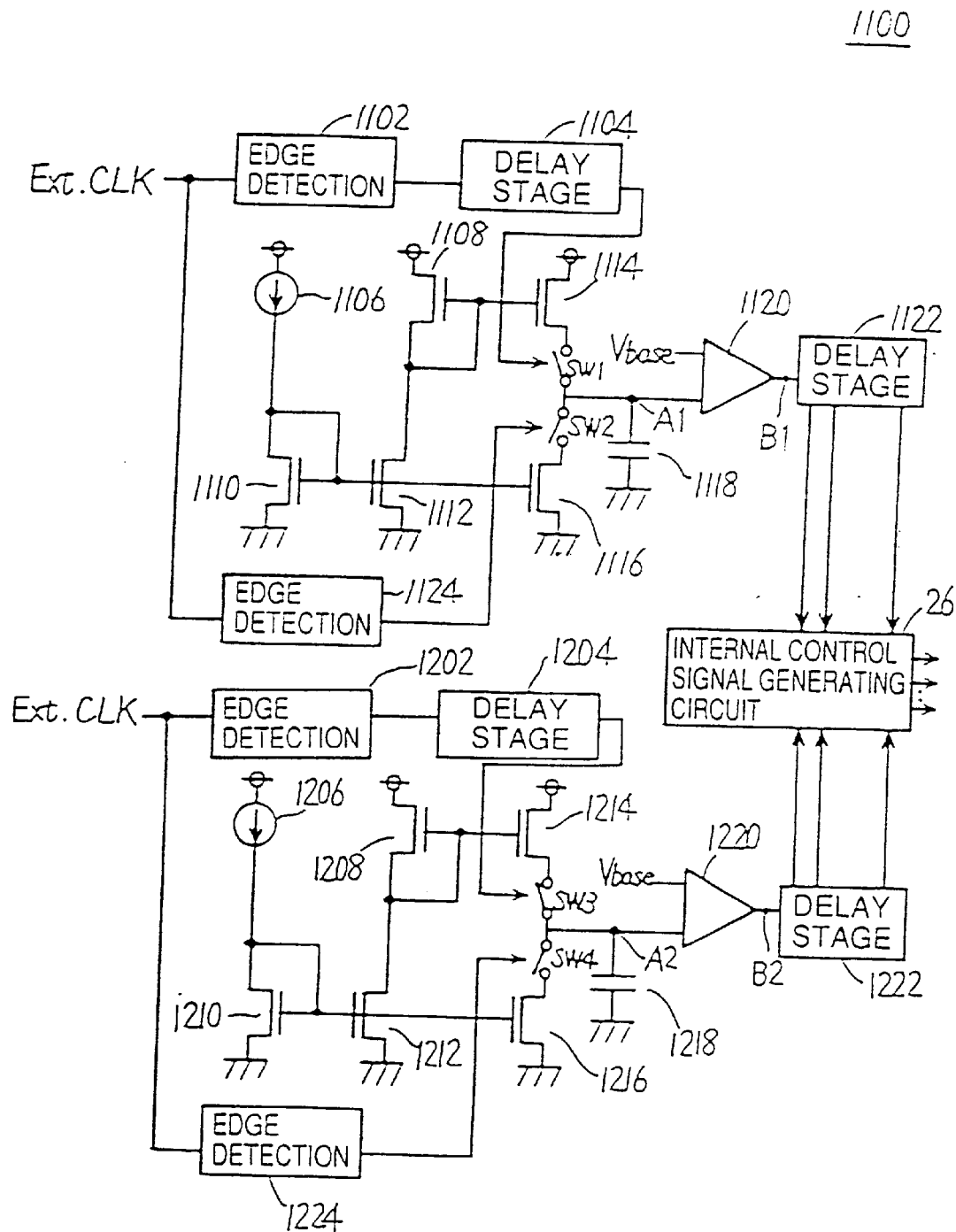
FIG. 37 is a schematic block diagram showing a structure of an internal synchronous signal generating circuit 1100 of an embodiment 12 of the invention.

FIG. 37 is a schematic block diagram showing a structure of an internal synchronous signal generating circuit 1100 of an embodiment 12 of the invention.

Internal synchronous signal generating circuit 1100 of the embodiment 12 includes a first block 1101a, which detects the rising edge of external clock signal Ext.CLK, and issues a delay signal for issuing the internal control signal at the next cycle, and a second block 1101b which issues a delay signal complementarily with the first block 1101a.

The structure will be described below more in detail.

First circuit block 1101a in internal synchronous signal generating circuit 1100 includes an edge detecting circuit 1102 which receives external clock signal Ext.CLK and detects its rising edge, a delay stage 1104 which receives an output of edge detecting circuit 1102 and delays it by a predetermined time for outputting the same, and an edge detecting circuit 1124 which detects the rising edge of external clock signal Ext.CLK at the cycle subsequent to the edge detection by edge detecting circuit 1102.

Synchronous signal generating circuit 1100 further includes n-channel MOS transistors 1110 and 1112 forming a current mirror circuit, a constant current source 1106 supplying a predetermined current to n-channel MOS transistor 1110 of the current mirror circuit, p-channel MOS transistor 1108 having a drain connected to a drain of n-channel MOS transistor 1112, i.e., one of paired transistors 1110 and 1112 forming the current mirror circuit, which has a source connected to ground potential GND, a source connected to power supply potential Vcc and a gate connected to its own drain, a p-channel MOS transistor 1114 which forms a current mirror circuit together with p-channel MOS transistor 1108, and has a source connected to power supply potential Vcc and a gate connected to the gate of p-channel MOS transistor 1108, and an n-channel MOS transistor 1116 which has a gate connected to gates of n-channel MOS transistors 1110 and 1112.

The drain of p-channel MOS transistor 1114 is connected to a node A1 via a switch circuit SW1 to be opened/closed in accordance with an output signal from delay stage 1104. The drain of n-channel MOS transistor 1116 is connected to node A1 via a switch circuit SW2 controlled by the output signal of edge detecting circuit 1124.

Node A1 is capacity-coupled to ground potential GND via capacitor 1118. Comparator 1120 compares the potential level on node A1 with the potential level of a predetermined reference potential Vbase, and sends a result of this comparison to a delay stage 1122. Delay stage 1122 receives the potential level on output node B1 of comparator 1120, and sends successively delayed signals to internal control signal generating circuit 26. Based on the delayed signals sent from delay stage 1122, internal control signal generating circuit 26 issues the internal control signals.

Internal synchronous signal generating circuit 1100 further has a delayed signal generating portion 1101b paired with a delay signal generating portion 1101a, which is formed of edge detecting circuits 1102 and 1124, delay stages 1104 and 1122 and others described above.

Delay signal generating portion 1101b operates complementarily with delay signal generating portion 1101a, and issues delay signals to internal control signal generating circuit 26 as follows. Delay signal generating portion 1101a issues a predetermined delay signal from delay stage 1122 at a second cycle after it detects input of the first cycle of external clock signal Ext.CLK. In contrast to this, delay signal generating portion 1101b issues a predetermined delay signal from delay stage 1222 to internal control signal generating circuit 26 at the third cycle after it detects input of the second cycle of external clock signal Ext.CLK. Thereafter, delay signal generating portions 1101a and 1101b each generate a predetermined delay signal at every two cycles of external clock signal Ext.CLK, and alternately generate the delay signal at every cycle of external clock signal Ext.CLK.

Structures of delay signal generating circuit 1101b other than the above are similar to those of circuit 1201a, and therefore will not be described below.

Figure 38:
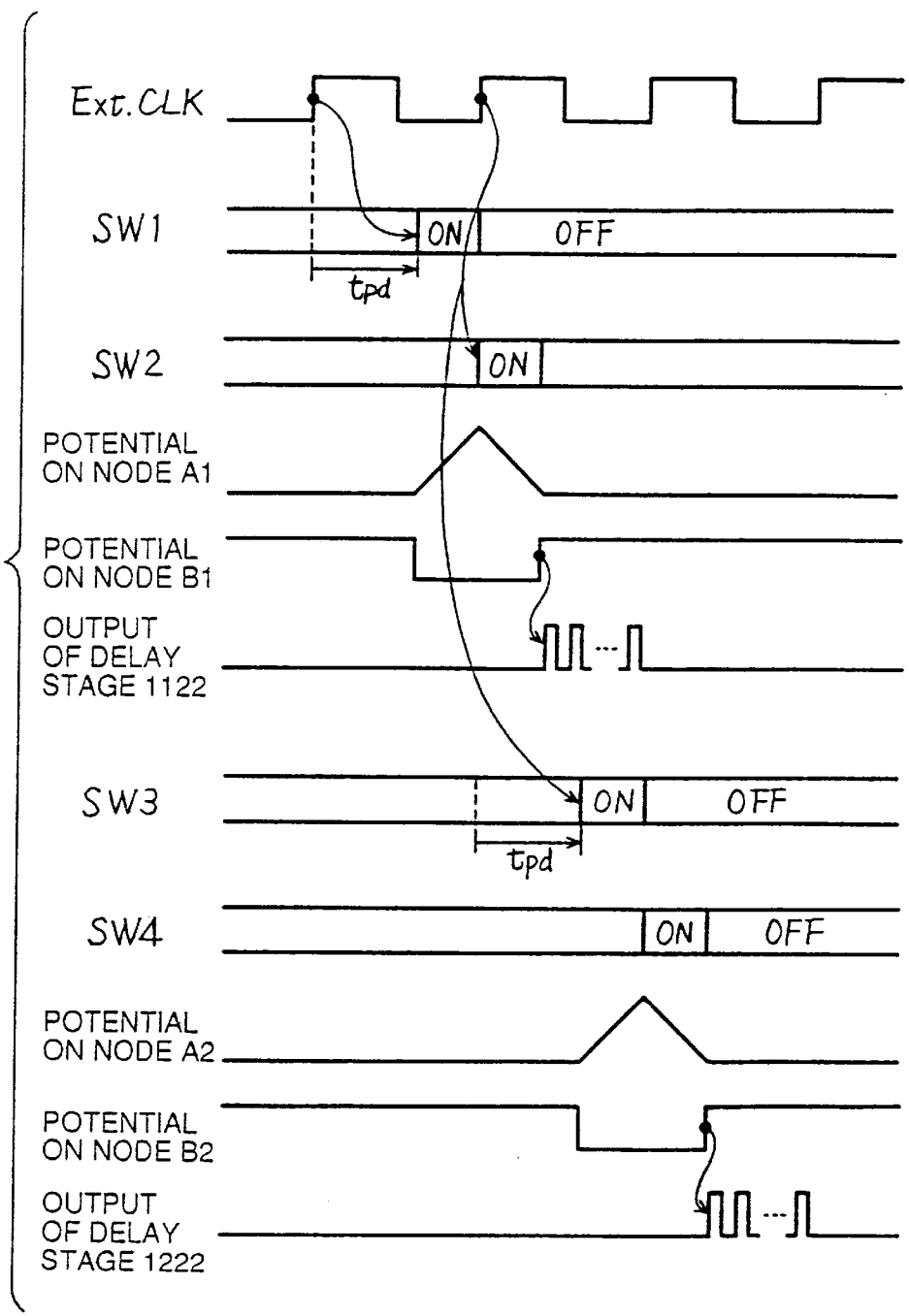
FIG. 38 is a timing chart showing an operation of the internal synchronous signal generating circuit 1100.

FIG. 38 is a timing chart showing an operation of internal synchronous signal generating circuit 1100 of the embodiment 12 shown in FIG. 37.

When edge detecting circuit 1102 detects the rising edge at the first cycle of external clock signal Ext.CLK, delay stage 1104 activates its output signal upon elapsing of a predetermined delay time $t_{pd}$. In accordance with this, switch circuit SW1 is turned on, and node A1 is charged by power supply potential Vcc via p-channel MOS transistor 1114. Therefore, the potential level on node A1 monotonously increases after switch circuit SW1 is turned on.

When edge detecting circuit 1124 detects the rising edge at the second cycle of external clock signal Ext.CLK, switch circuit SW1 is turned off, and switch circuit SW2 is turned on. Therefore, node A1 is connected to ground potential GND via n-channel MOS transistor 1116 to discharge charges accumulate in capacitor 1118. Consequently, the potential on node Ai monotonously decreases while switch circuit SW2 is on.

Since the potential level on node A1 changes as described above, the output level of comparator 1120 change from "H" level to "L" level when the potential level on node A1 starts rising, and returns from "L" level to "H" level when discharging of charged node A1 is completed.

In response to the rising edge of potential level on node B1, internal control signal generating circuit 26 is supplied with delay signals delayed by predetermined times from a plurality of cascade-coupled delay buffer circuits forming delay stage 1122.

In response to the rising edge of first cycle of external clock signal Ext.CLK, an edge detecting circuit 1224 at delay signal generating portion 1101*b* turns on a switch circuit SW4, but the potential level on node A2 does not change at this operation stage.

In response to detection of the rising edge at the second cycle of external clock signal Ext.CLK by edge detecting circuit 1202, delay stage 1204 issues a signal upon elapsing of a predetermined time. In response to this, switch circuit SW3 is turned on, and node A2 is charged. In response to this, the potential level on node A2 monotonously increases.

In response to detection of the rising edge at the third cycle of external clock signal Ext.CLK by edge detecting circuit 1224, switch circuit SW4 is turned on, and switch circuit SW3 is turned off, so that node A2 is discharged.

Therefore, the potential level on node B2 changes from "H" level to "L" level in response to rising of the potential level on node A2, and will return to "H" level upon elapsing of double the time required for changing node A2, i.e., a time corresponding to a sum of the time required for charging node A2 and the time required for discharging the same. In response to the rising edge of potential level on node B2, internal control signal generating circuit 26 is supplied with the delay signals delayed by predetermined times from the plurality of cascade-coupled delay buffer circuits forming delay stage 1222.

Assuming that all delay stages 1104, 1122, 1204 and 1222 have the same delay time, the delay signals applied to internal control signal generating circuit 26 have the following distinctive feature.

For example, in delay signal generating portion 1101*a*, switch circuit SW1 is on and node A1 is charged during a period from elapsing of time $t_{pd}$, which corresponds to the delay time of delay stage 1104, after the rising edge at the first cycle of external clock signal Ext.CLK to the rising edge at the second cycle of the same. Thereafter, in response to the rising edge at the second cycle of external clock signal Ext.CLK, node A1 is discharged to return to the initial potential level, which requires a time equal to that required for charging the same. Thereafter, delay stage 1122 issues the delay signals. Thus, the output of delay signals from delay stage 1122 is performed from a period from elapsing of the predetermined time from the rising edge at the second cycle of external clock signal Ext.CLK to the completion of the second cycle.

In the same manner, output of the delay signals from delay signal generating portion 1101*b* is performed for a period from elapsing of a predetermined time after the rising edge at the third cycle to the completion of the third cycle.

Figure 39:
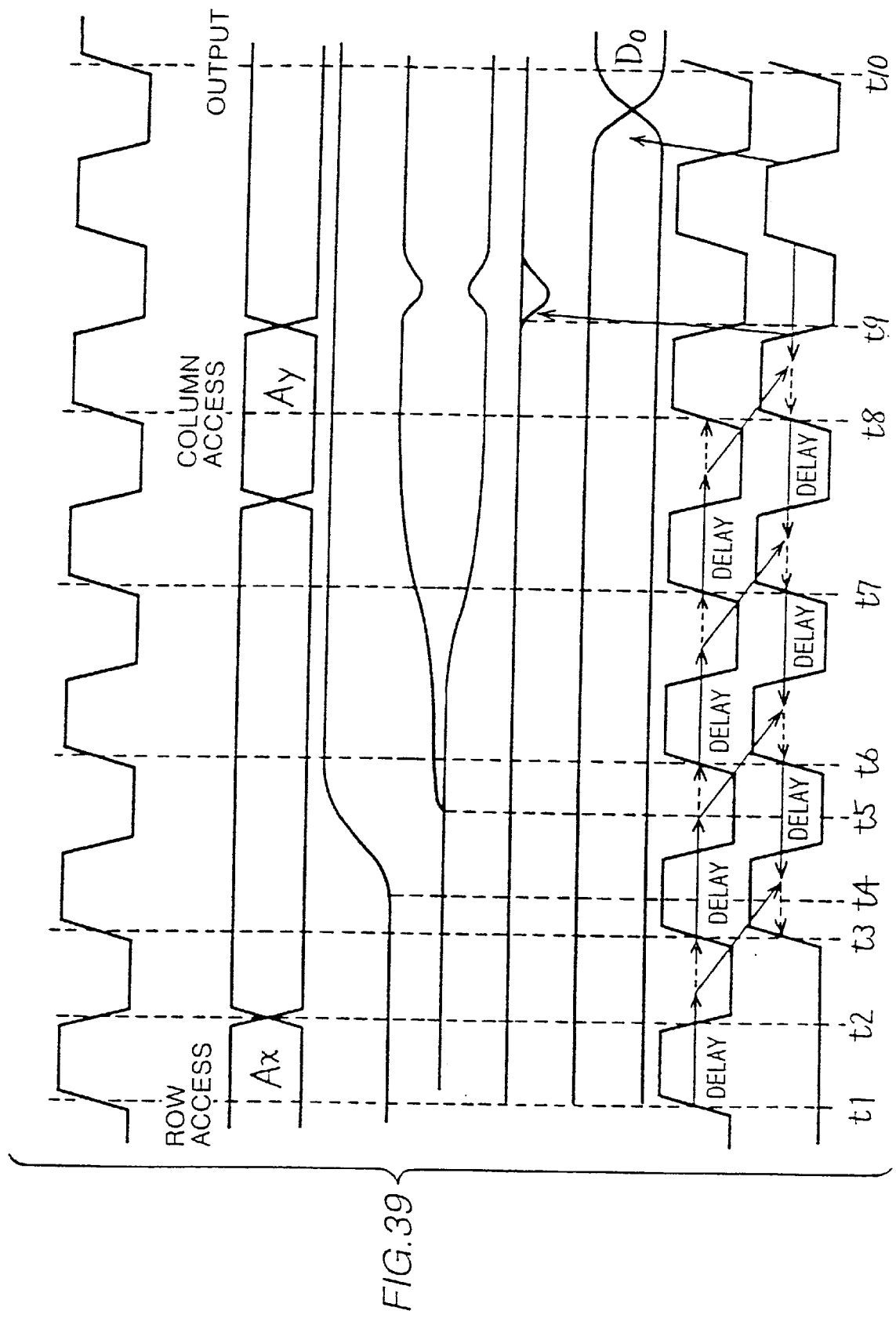
FIG. 39 is a first timing chart showing an operation of the synchronous semiconductor memory device controlled by the internal synchronous signal generating circuit 1100.

FIG. 39 is a timing chart showing an operation of the synchronous semiconductor memory device, which operates based on internal control signals, which are generated from internal control signal generating circuit 26 based on the delay signals generated from internal synchronous signal generating circuit 1100 shown in FIG. 37.

At time t1, i.e., at the rising edge in the first cycle of external clock signal Ext.CLK, the address buffer takes in row address Ax.

For a period corresponding to the delay time of delay stage 1122, and particularly, for a period from elapsing of a predetermined time after the rising edge at the second cycle of external clock signal Ext.CLK to the completion of the second cycle, delay signal output portion 1101*a* issues the delay signals.

Thereafter, the operation is performed in a similar manner, and delays stages 1122 and 1222 alternately issue the delay signals to internal control signal generating circuit 26 for a period after elapsing of a predetermined time from the rising edge at the second cycle of external clock signal Ext.CLK to the completion of the second cycle.

Thereafter, based on the internal control signals issued from internal control signal generating circuit 26, column address signal Ay is taken into the circuit, and, in response to this, information stored in the selected memory cells is externally read at time t10, i.e., at the rising edge of external clock signal Ext.CLK.

When the internal control signals are issued from the structure described above, a particularly remarkable effect can be achieved in the case particularly when external clock signal Ext.CLK has a cycle of a long time.

In some systems in which synchronous semiconductor memory devices are used, the synchronous semiconductor memory devices may be operated over a wide operation frequency range from a value near its maximum speed to a value providing an appropriate operation margin, depending on the clock signal of the system.

Therefore, if the device to be operated with a reduced operation frequency had specifications which have been set for the operation at a maximum speed, disadvantages such as increase in power consumption would arise in some cases.

This will be described more in detail with reference to FIG. 40, which is a timing chart showing an operation of a synchronous semiconductor memory device with double the frequency shown in FIG. 39.

In this case, the basic operation is the same as that shown in FIG. 39. Thus, the internal control signals are issued during a period corresponding to the delay time of delay stage 1122 or 1222 and starting from the time of completion of each cycle of the external clock signal.

The following description will be given on the case where internal control signal generating circuit 26 issues the internal control signals in accordance with the rising edge of external clock signal Ext.CLK. In this case, column-related operations start in response to the rising edge of external clock signal Ext.CLK, and data is sent to data I/O terminal 32 at a relatively early stage of external clock signal Ext.CLK.

Even in this case, reading of data is performed at the next rising edge of external clock signal Ext.CLK, so that output circuit 30 must hold the value of output data for a long term. It is necessary to hold the level of output signal for a time nearly corresponding to external clock signal Ext.CLK in extreme cases. Meanwhile, data I/O terminal 32 is connected to an external circuitry. In the above case, therefore, a current may flow toward the external circuitry, depending on the potential level of data sent to data I/O terminal 32, so that an extra power consumption is required for maintaining the potential level of the output data at output circuit 30.

From the viewpoint of the synchronous semiconductor memory device, therefore, a longer cycle of external clock signal Ext.CLK conversely increases the power consumption in some cases.

Figure 40:
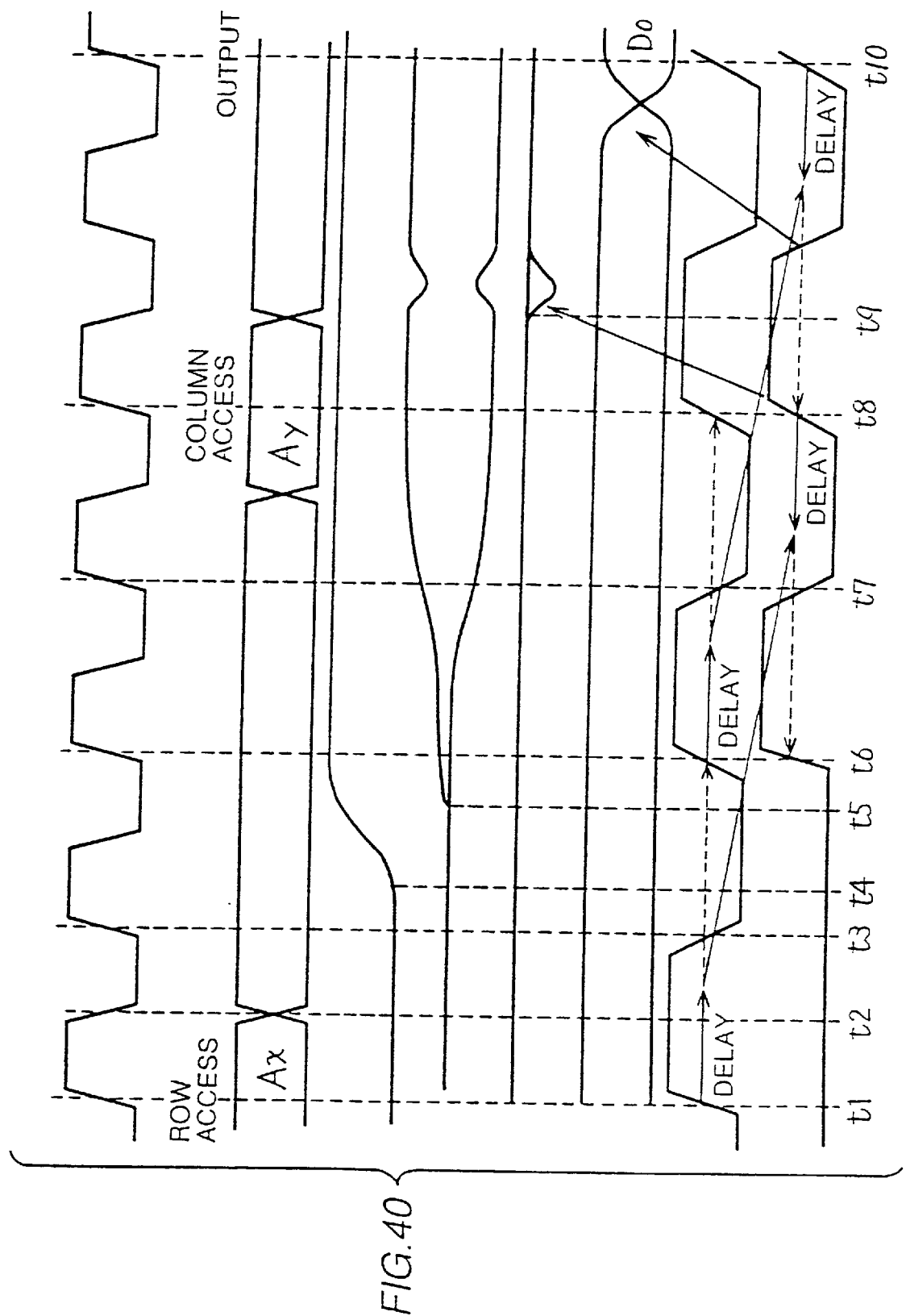
FIG. 40 is a second timing chart showing an operation of the synchronous semiconductor memory device controlled by the internal synchronous signal generating circuit 1100.
Figure 41:
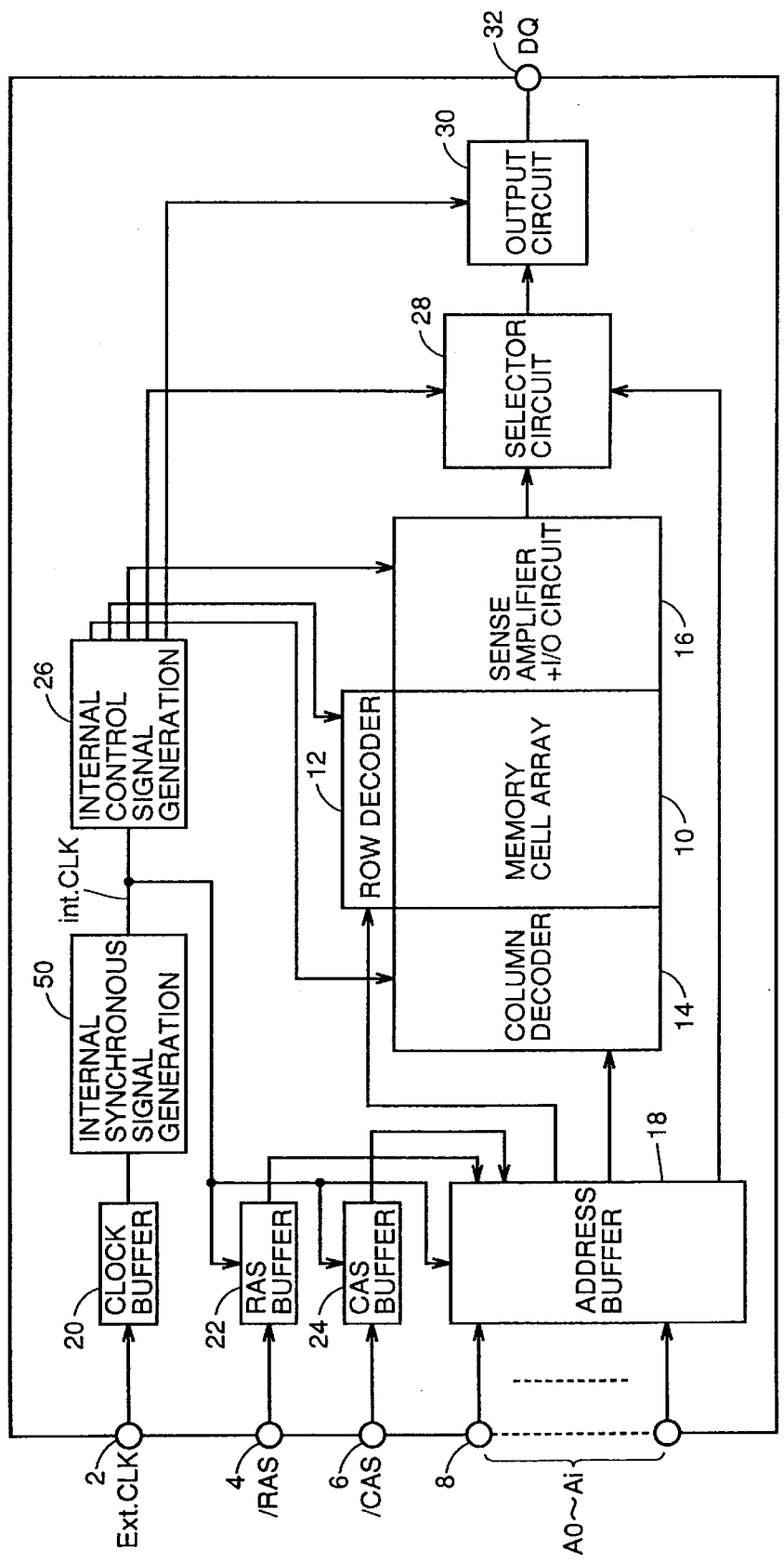
FIG. 41 is a schematic block diagram showing a structure of a synchronous semiconductor memory device 2000 in the prior art.
Figure 42:
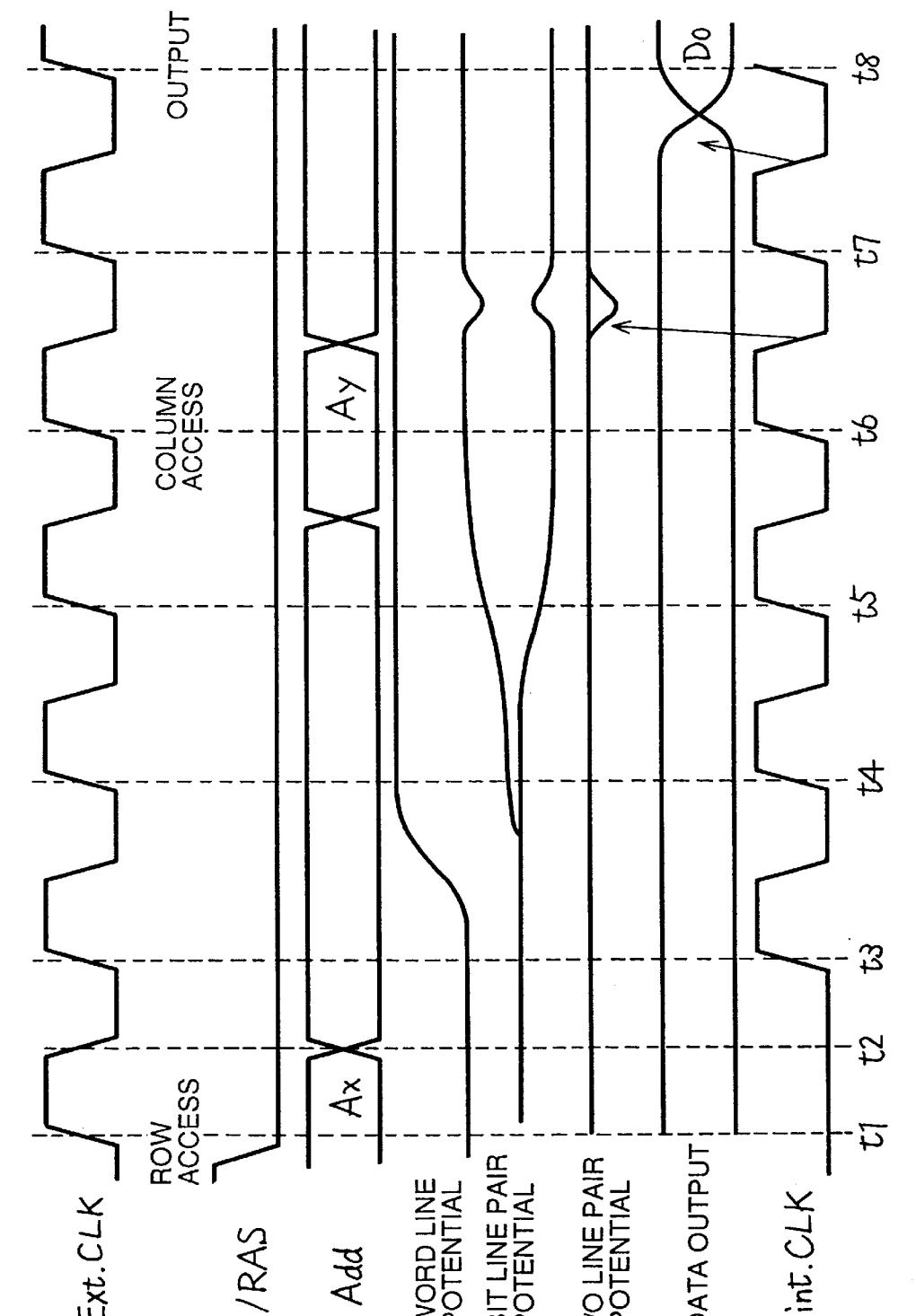
FIG. 42 is a timing chart showing an operation of the synchronous semiconductor memory device 2000 in the prior art.

In contrast to the above, as shown in FIG. 40, the following advantage can be achieved by the structure in which the internal control signals controlling operations related to the column are issued within a predetermined period starting from completion of each clock signal cycle. Since external reading of data is performed at the rising edge of external clock signal Ext.CLK immediately after output of data T0 to data I/O terminal 32, output circuit 30 is not required to hold the level of output data for a long term. For example, data I/O terminal 32 may be set to a high impedance state after output circuit 30 holds the level of output data for a restricted term, whereby it is possible to suppress external flow of a current via data I/O terminal 32.

The above operation can achieve a remarkable advantage, for example, in such a case that an output buffer control signal and an output control signal among the internal control signals issued from internal control signal generating circuit 26 are issued for a predetermined period starting from completion of each cycle of external clock signal Ext.CLK.

According to the structure of internal synchronous signal generating circuit 1100 of the embodiment 12, as described above, it is possible to reduce a power consumption of the synchronous semiconductor memory device even when external clock signal Ext.CLK has a long cycle.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous signal generating circuit comprising:
   a phase comparator comparing a phase of an internal clock signal with a phase of an external clock signal;
   an internal clock generator generating the internal clock signal having a frequency associated with a control voltage according to a comparison result of said phase comparator; and
   an initial frequency apply circuit for rendering the control voltage an initial level in an initial operation of said synchronous signal generating circuit.

2. The synchronous signal generating circuit according to claim 1, wherein the initial operation is executed for a predetermined period after power-on.

3. The synchronous signal generating circuit according to claim 1, wherein said initial frequency apply circuit includes a charge circuit charging a control input of said internal clock generator independently of the comparison result in the initial operation, the control input receiving the control voltage.

4. The synchronous signal generating circuit according to claim 3, wherein said charge circuit includes a transistor coupled between a power supply and the control input, and
a differential amplifier having a first input receiving a reference voltage, a second input coupled to the control input, and an output coupled to a gate of said transistor.

5. The synchronous signal generating circuit according to claim 1, wherein the initial level is set in response to a command designating operation modes of said synchronous signal generating circuit.

6. The synchronous signal generating circuit according to claim 5, wherein
   said initial frequency apply circuit includes a command register storing the command, and
   said synchronous signal generating circuit further comprises:
   a free-run current source for supplying a current having a current value responsive to the command independently of the comparison result;
   a variable current source for supplying a current having a current value responsive to the comparison result; and
   a control circuit providing the control voltage associated with amount of current supplied from said free-run current source and said variable current source.

7. The synchronous signal generating circuit according to claim 5, wherein
   said phase comparator is deactivated in response to the command, and
   a level of the control voltage is regardless of the external clock signal when said phase comparator is deactivated.

8. A synchronous signal generating circuit, comprising:
   a phase comparator comparing a phase of an internal clock signal with a phase of an external clock signal; and
   an internal clock generator generating the internal clock signal having a frequency associated with a comparison result of said phase comparator in a first mode and a frequency designated in a second mode; wherein
   the internal clock signal is capable of having a larger frequency than the external clock signal in the second mode.

9. A synchronous signal generating circuit, comprising:
   a phase comparator comparing a phase of an internal clock signal with a phase of an external clock signal; and
   an internal clock generator generating the internal clock signal having a frequency associated with a comparison result of said phase comparator in a first mode and a frequency designated in a second mode;
   wherein said phase comparator is deactivated in the second mode.

10. The synchronous signal generating circuit according to claim 9, wherein the second mode is a test mode.

11. A synchronous signal generating circuit, comprising:
    a phase comparator comparing a phase of an internal clock signal with a phase of an external clock signal;
    an internal clock generator generating the internal clock signal having a frequency associated with a comparison result of said phase comparator in a first mode and a frequency designated in a second mode and;
    a register, wherein
    the frequency of the internal clock signal is designated by a value stored in said register in the second mode.

12. The synchronous signal generating circuit according to claim 11, further comprising a free-run current source for supplying a current having a current value responsive to the value stored in said register, wherein the frequency of the internal clock signal is responsive to the current value in the second mode.

13. The synchronous signal generating circuit according to claim 12, further comprising a variable current source for supplying a current having a current value responsive to the comparison result; and a control circuit providing a control voltage associated with amount of current supplied from said free-run current source and said variable current source, wherein the frequency of the internal clock signal is responsive to the control voltage in the first and second modes.

14. A synchronous signal generating circuit, comprising:

a phase comparator comparing a phase of an internal clock signal with a phase of an external clock signal; and an internal clock generator generating the internal clock signal having a frequency associated with a comparison result of said phase comparator in a first mode and a frequency designated in a second mode, wherein said synchronous signal generating circuit is set to a free-run state, in which the frequency of the internal clock signal is independent of the external clock signal, in the second mode.

15. The synchronous signal generating circuit according to claim 14, further comprising a register, wherein the frequency of the internal clock signal is variable in response to a value stored in said register in the free-run state.

16. The synchronous signal generating circuit according to claim 14, wherein the internal clock signal is capable of having a larger frequency than the external clock signal.

17. The synchronous signal generating circuit according to claim 14, further comprising a switch preventing supply of the external clock signal to said phase comparator in the free-run state.

18. The synchronous signal generating circuit according to claim 14, wherein said phase comparator is deactivated in the free-run state.

19. The synchronous signal generating circuit according to claim 14, wherein the second mode is a test mode.

* * * * *